US009851860B2

(12) United States Patent
Kuriki

(10) Patent No.: US 9,851,860 B2
(45) Date of Patent: *Dec. 26, 2017

(54) CONDUCTIVE SHEET AND CONDUCTIVE SHEET FOR TOUCH PANEL

(71) Applicant: FUJIFILM Corporation, Tokyo (JP)

(72) Inventor: Tadashi Kuriki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/591,734

(22) Filed: May 10, 2017

(65) Prior Publication Data

US 2017/0242511 A1   Aug. 24, 2017

Related U.S. Application Data

(60) Continuation of application No. 14/539,666, filed on Nov. 12, 2014, now Pat. No. 9,684,423, which is a
(Continued)

(30) Foreign Application Priority Data

Jan. 28, 2010  (JP) ................. 2010-017293
Apr. 30, 2010  (JP) ................. 2010-105865
(Continued)

(51) Int. Cl.
*G06F 3/044* (2006.01)
*G06F 3/047* (2006.01)
*H03K 17/96* (2006.01)

(52) U.S. Cl.
CPC ............. *G06F 3/047* (2013.01); *G06F 3/044* (2013.01); *H03K 17/9622* (2013.01); *G06F 2203/04112* (2013.01)

(58) Field of Classification Search
CPC . G06F 2203/04112; G06F 2203/04103; G06F 3/044
(Continued)

(56) References Cited

U.S. PATENT DOCUMENTS 5,113,041 A   5/1992  Blonder et al.
7,202,859 B1  4/2007  Speck et al.
(Continued)

FOREIGN PATENT DOCUMENTS

CN   1728071 A    2/2006
JP   05-224818 A  9/1993
(Continued)

OTHER PUBLICATIONS

Notice of Reasons for Refusal, issued by the Taiwanese Intellectual Property Office (TIPO) dated Mar. 24, 2014, in connection with TW100114913.
(Continued)

*Primary Examiner* — Michael Pervan
(74) *Attorney, Agent, or Firm* — Edwards Neils LLC; Jean C. Edwards, Esq.

(57) ABSTRACT

A conductive sheet, method for using conductive sheet and touch panel, having a base substance and conductive parts formed on one of the principal surfaces of the base substance. The conductive parts respectively extend in primary directions, and have two or more conductive patterns made from metal wires arranged in a second direction that is perpendicular to the first direction. The conductive pattern is constituted by serially connecting two or more large gratings in the first direction, and each of the large gratings is constituted by combining two or more small gratings. Around the edges of the large grating, non-connective patterns are formed from metal wires which are not connected with the large gratings.

8 Claims, 28 Drawing Sheets

Related U.S. Application Data division of application No. 13/576,135, filed as application No. PCT/JP2011/051692 on Jan. 28, 2011, now Pat. No. 8,917,252.

(30) Foreign Application Priority Data

Jul. 5, 2010 (JP) .................................. 2010-153232
Dec. 17, 2010 (JP) .................................. 2010-281465

(58) Field of Classification Search
USPC ..................... 178/18.01–19.07; 345/173–178
See application file for complete search history.

(56) References Cited

U.S. PATENT DOCUMENTS

| | | |
|---|---|---|
| 2003/0052867 A1 | 3/2003 | Shigetaka et al. |
| 2004/0239650 A1 | 12/2004 | Mackey |
| 2009/0002337 A1 | 1/2009 | Chang |
| 2009/0085885 A1 | 4/2009 | Wu et al. |
| 2009/0213090 A1 | 8/2009 | Mamba et al. |
| 2009/0219257 A1 | 9/2009 | Frey et al. |
| 2009/0315859 A1 | 12/2009 | Chien et al. |
| 2011/0102370 A1 | 5/2011 | Kono et al. |

FOREIGN PATENT DOCUMENTS

| | | |
|---|---|---|
| JP | 2003-099185 A | 4/2003 |
| JP | 2008-129708 A | 6/2008 |
| JP | 2009-205321 A | 9/2009 |
| JP | 2010-039537 A | 2/2010 |
| JP | 2010-262529 A | 11/2010 |
| TW | 200943149 A | 10/2009 |
| TW | 201001262 A | 1/2010 |
| WO | 95/27334 A1 | 10/1995 |
| WO | 97/18508 A1 | 5/1997 |
| WO | 2009/108758 A2 | 9/2009 |
| WO | 2010/013679 A1 | 2/2010 |

OTHER PUBLICATIONS

Rejection of the Application issued by the Japanese Patent Office (JPO) dated Jan. 21, 2014 in connection with Japanese Patent Application No. 2010-105865.

Decision of Rejection issued by the Korean Intellectual Property Office dated May 6, 2013, in connection with Korean Patent Application No. 10-2012-7020005.

Office Action issued by the Korean Intellectual Property Office dated Jan. 3, 2013, in connection with Korean Patent Application No. 10-2012-7020005.

Non-Final Office Action issued in U.S. Appl. No. 14/539,666 dated Mar. 25, 2016.

Extended European Search Report, issued by the European Patent Office (EPO) dated Apr. 11, 2016 in connection with European Patent Application No. 11737130.2.

Final Office Action issued in U.S. Appl. No. 14/539,666 dated Oct. 3, 2016.

Notice of Allowance issued in U.S. Appl. No. 14/539,666 dated Mar. 23, 2017.

Non-Final Office Action issued in U.S. Appl. No. 13/576,135 dated Jan. 6, 2014.

Non-Final Office Action issued in U.S. Appl. No. 13/576,135 dated Apr. 29, 2014.

Notice of Allownace issued in U.S. Appl. No. 13/576,135 dated Nov. 13, 2014.

Office Action issued by European Patent Office dated Jul. 18, 2017, in connection with European Patent Application No. 11737130.2.

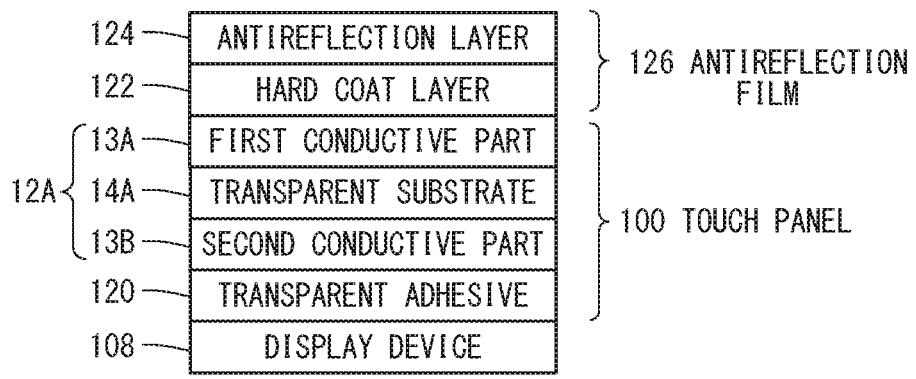
FIG. 8A (FIRST STRUCTURE EXAMPLE)
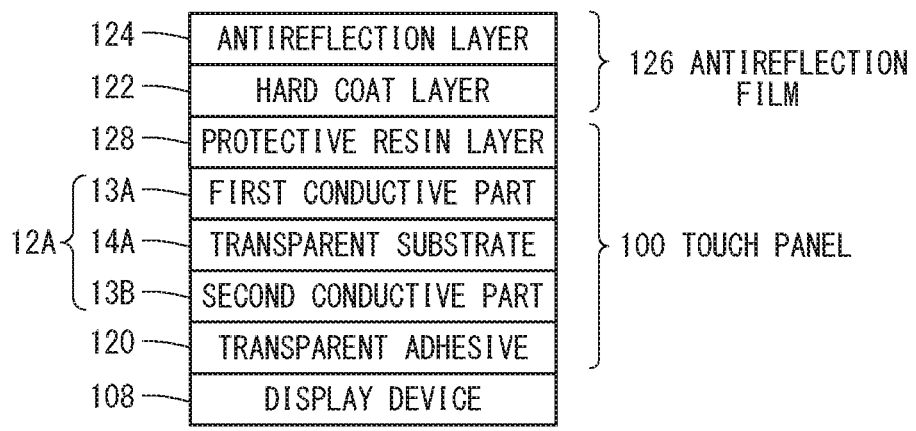
FIG. 8B (SECOND STRUCTURE EXAMPLE)
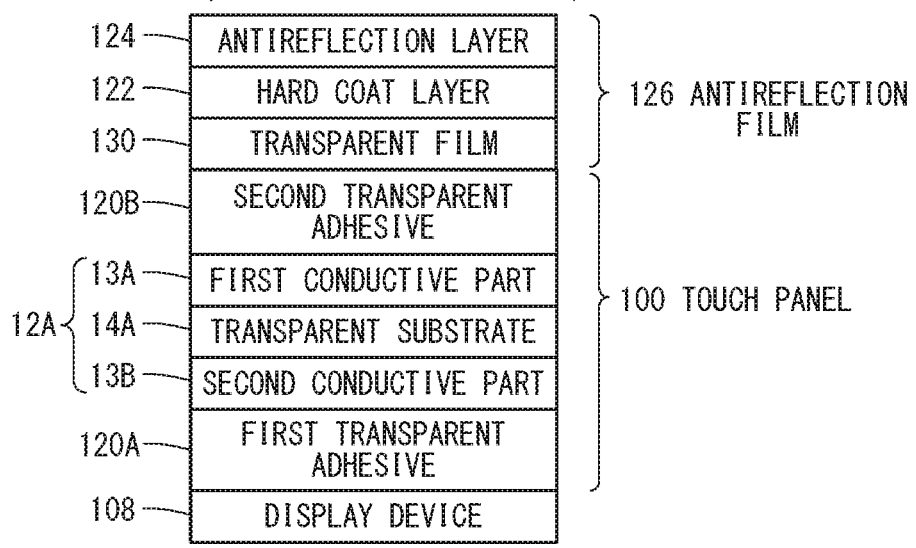
FIG. 8C (THIRD STRUCTURE EXAMPLE)

FIG. 23
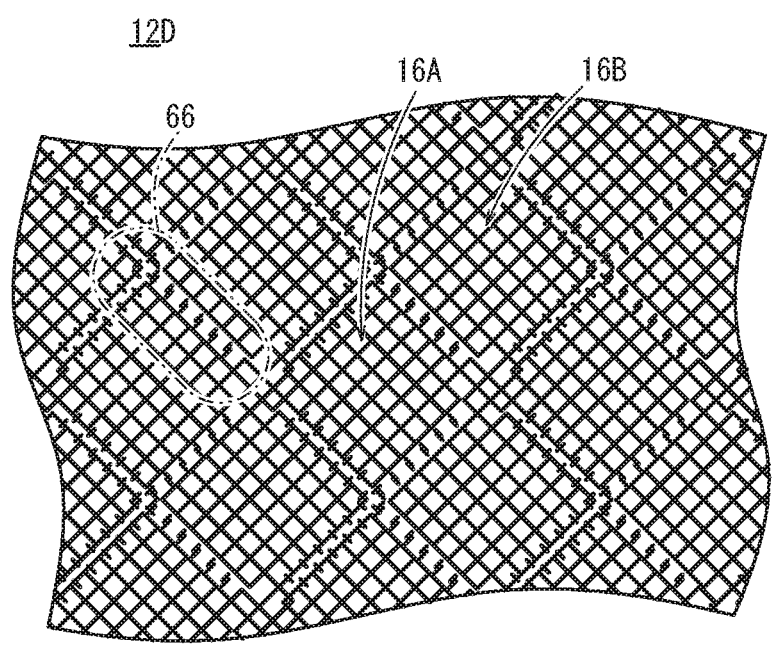
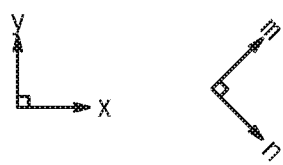

US 9,851,860 B2

CONDUCTIVE SHEET AND CONDUCTIVE SHEET FOR TOUCH PANEL

CROSS REFERENCE TO RELATED APPLICATIONS

This patent application is a continuation patent application of U.S. patent application Ser. No. 14/539,666, filed Nov. 12, 2014, which is a divisional patent application of U.S. patent application Ser. No. 13/576,135 filed Jul. 30, 2012, now U.S. Pat. No. 8,917,252, issued on Dec. 23, 2014, which is a 35 U.S.C. 371 National Stage Entry of PCT/JP2011/051692, filed Jan. 28, 2011, which claims priority from Japanese Patent Application Nos. 2010-017293, filed on Jan. 28, 2010, 2010-105865, filed on Apr. 30, 2010, 2010-153232, filed on Jul. 5, 2010, and 2010-281465, filed on Dec. 17, 2010, the contents of all of which are herein incorporated by reference in their entirety.

TECHNICAL FIELD

The present invention relates to a conductive sheet, a method for using a conductive sheet, and a touch panel, and for example to a conductive sheet suitable for use in a projected capacitive touch panel, a method for using a conductive sheet, and a touch panel.

BACKGROUND ART

Touch panels have attracted much attention in recent years. For example, a touch panel, which uses ITO (indium tin oxide) as an electrode material to form a less-visible electrode matrix, has been disclosed (see, Japanese Laid-Open Patent Publication Nos. 2008-129708 and 05-224818, etc.)

Though the touch panels have currently been used mainly in small devices such as PDAs (personal digital assistants) and mobile phones, they are expected to be used in larger devices such as personal computer displays.

The above electrode is composed of the ITO (indium tin oxide) and therefore has a high resistance. Thus, when the conventional touch panel is used in the larger device in the above future trend, the large-sized touch panel disadvantageously has a low current transfer rate between the electrodes and thereby exhibits a low response speed (a long time between finger contact and touch position detection).

A large number of lattices composed of thin wires of a metal (thin metal wires) can be arranged to form an electrode with a lowered surface resistance. A touch panel using the electrode of the thin metal wires is known from U.S. Pat. No. 5,113,041, International Patent Publication No. 95/027334, US Patent Application Publication No. 2004/0239650, U.S. Pat. No. 7,202,859, International Patent Publication No. 97/018508, and Japanese Laid-Open Patent Publication No. 2003-099185, etc.

SUMMARY OF INVENTION

However, in the case of using the thin metal wires for the electrode, the thin metal wires are composed of an opaque material, whereby the electrode has problems of transparency and visibility.

In view of the problems, an object of the present invention is to provide a conductive sheet, which can have a conductive pattern with a lowered resistance, can exhibit an improved visibility, and can be suitably used in a projected capacitive touch panel or the like, and a method for using the conductive sheet.

Another object of the present invention is to provide a touch panel, which can have a conductive pattern with a lowered resistance, can exhibit an improved visibility, and can be adapted as a large-sized projected capacitive touch panel or the like.

[1] A conductive sheet according to a first aspect of the present invention, comprising two or more conductive first large lattices composed of a thin metal wire formed on one main surface of a substrate and two or more conductive second large lattices composed of a thin metal wire formed on the other main surface of the substrate, wherein the first and second large lattices each contain a combination of two or more small lattices, a first unconnected pattern composed of a thin metal wire separated from the first large lattices is formed around a side of the first large lattices, a second unconnected pattern composed of a thin metal wire separated from the second large lattices is formed around a side of the second large lattices, the first large lattices are arranged adjacent to the second large lattices as viewed from above, the first and second unconnected patterns overlap with each other to form a combined pattern between the first and second large lattices, and the combined pattern has a pattern approximately equal to inner patterns of the first and second large lattices.

[2] A conductive sheet according to a second aspect of the present invention for a touch panel to be placed on a display panel of a display device, comprising first and second conductive sheets, wherein the first conductive sheet contains a first substrate and a first conductive part formed on a main surface of the first substrate, the second conductive sheet contains a second substrate and a second conductive part formed on a main surface of the second substrate, the first conductive sheet is stacked on the second conductive sheet, the first conductive part contains two or more first conductive patterns composed of a thin metal wire, the first conductive patterns each extend in a first direction and are arranged in a second direction perpendicular to the first direction, the second conductive part contains two or more second conductive patterns composed of a thin metal wire, the second conductive patterns each extend in the second direction and are arranged in the first direction, the first conductive patterns each contain two or more first large lattices arranged in the first direction, the second conductive patterns each contain two or more second large lattices arranged in the second direction, a first unconnected pattern composed of a thin metal wire separated from the first large lattices is formed around a side of the first large lattices, a second unconnected pattern composed of a thin metal wire separated from the second large lattices is formed around a side of the second large lattices, the first large lattices are arranged adjacent to the second large lattices as viewed from above, the first and second unconnected patterns overlap with each other to form a combined pattern between the first and second large lattices, and the combined pattern contains a combination of two or more small lattices.

[3] A conductive sheet according to a third aspect of the present invention, comprising a substrate, a first conductive part formed on one main surface of the substrate, and a second conductive part formed on the other main surface of the substrate, wherein the first conductive part contains two or more first conductive patterns, the first conductive patterns each extend in a first direction and are arranged in a second direction perpendicular to the first direction, the second conductive part contains two or more second conductive patterns, the second conductive patterns each extend in the second direction and are arranged in the first direction, and the first and second conductive patterns are crossed and displaced in a direction different from the first and second directions as viewed from above.

[4] A conductive sheet according to a fourth aspect of the present invention, comprising a substrate, a first conductive part formed on one main surface of the substrate, and a second conductive part formed on the other main surface of the substrate, wherein the first conductive part contains two or more first conductive patterns and a first dummy pattern, the first conductive patterns each extend in a first direction and are arranged in a second direction perpendicular to the first direction, the first dummy pattern contains a plurality of first auxiliary wires arranged around the first conductive patterns, the second conductive part contains two or more second transparent conductive patterns and a second dummy pattern, the second transparent conductive patterns each extend in the second direction and are arranged in the first direction, the second dummy pattern contains a plurality of second auxiliary wires arranged around the second transparent conductive patterns, the first and second transparent conductive patterns are crossed as viewed from above, the first and second dummy patterns overlap with each other to form a combined pattern between the first and second transparent conductive patterns, and the first and second auxiliary wires are not perpendicularly crossed in the combined pattern.

[5] A method for using a conductive sheet according to a fifth aspect of the present invention, comprising using first and second conductive sheets, wherein the first conductive sheet contains two or more conductive first large lattices composed of a thin metal wire, the first large lattices each contain a combination of two or more small lattices, the second conductive sheet contains two or more conductive second large lattices composed of a thin metal wire, the second large lattices each contain a combination of two or more of the small lattices, a first unconnected pattern composed of a thin metal wire separated from the first large lattices is formed around a side of the first large lattices, a second unconnected pattern composed of a thin metal wire separated from the second large lattices is formed around a side of the second large lattices, and the first and second conductive sheets are combined, so that the first large lattices are arranged adjacent to the second large lattices, and the first and second unconnected patterns are combined to form an arrangement of the small lattices.

[6] A touch panel according to a sixth aspect of the present invention, comprising a touch panel conductive sheet, wherein the touch panel conductive sheet contains a substrate and a conductive part formed on one main surface of the substrate, the conductive part contains two or more conductive patterns composed of a thin metal wire, the conductive patterns each extend in a first direction and are arranged in a second direction perpendicular to the first direction, the conductive patterns each contain two or more large lattices connected in series in the first direction, the large lattices each contain a combination of two or more small lattices, and a first unconnected pattern composed of a thin metal wire separated from the large lattices is formed around a side of the first large lattices.

[7] A touch panel according to a seventh aspect of the present invention, comprising a touch panel conductive sheet, wherein the touch panel conductive sheet contains a substrate, a first conductive part formed on one main surface of the substrate, and a second conductive part formed on the other main surface of the substrate, the first conductive part contains two or more first transparent conductive patterns, the first transparent conductive patterns each extend in a first direction and are arranged in a second direction perpendicular to the first direction, the second conductive part contains two or more second transparent conductive patterns, the second transparent conductive patterns each extend in the second direction and are arranged in the first direction, and the first and second transparent conductive patterns are crossed and displaced in a direction different from the first and second directions as viewed from above.

[8] A touch panel according to an eighth aspect of the present invention, comprising a touch panel conductive sheet, wherein the touch panel conductive sheet contains a substrate, a first conductive part formed on one main surface of the substrate, and a second conductive part formed on the other main surface of the substrate, the first conductive part contains two or more first transparent conductive patterns and a first dummy pattern, the first transparent conductive patterns each extend in a first direction and are arranged in a second direction perpendicular to the first direction, the first dummy pattern contains a plurality of first auxiliary wires arranged around the first transparent conductive patterns, the second conductive part contains two or more second transparent conductive patterns and a second dummy pattern, the second transparent conductive patterns each extend in the second direction and are arranged in the first direction, the second dummy pattern contains a plurality of second auxiliary wires arranged around the second transparent conductive patterns, the first and second transparent conductive patterns are crossed as viewed from above, the first and second dummy patterns overlap with each other to form a combined pattern between the first and second transparent conductive patterns, and the first and second auxiliary wires are not perpendicularly crossed in the combined pattern.

As described above, in the conductive sheet and the conductive sheet using method of the present invention, the conductive pattern formed on the substrate can exhibit a lowered resistance and an improved visibility, and the conductive sheet can be suitably used in a projected capacitive touch panel or the like.

Furthermore, in the touch panel of the present invention, the conductive pattern formed on the substrate can exhibit a lowered resistance and an improved visibility, and the touch panel can be used as a large-sized projected capacitive touch panel or the like.

BRIEF DESCRIPTION OF DRAWINGS

FIG. 8A is a schematic view showing a first structure example using an antireflection film;

FIG. 8B is a schematic view showing a second structure example using a similar film;

FIG. 8C is a schematic view showing a third structure example using a similar film;

FIG. 23 is a plan view partially showing another example of the fourth laminated conductive sheet obtained by combining the first and second conductive sheets;

DESCRIPTION OF EMBODIMENTS

Several embodiments of the conductive sheet, the conductive sheet using method, and the touch panel of the present invention will be described below with reference to FIGS. 1 to 28. It should be noted that, in this description, a numeric range of "A to B" includes both the numeric values A and B as the lower limit and upper limit values.

A conductive sheet according to a first embodiment of the present invention (hereinafter referred to as the first conductive sheet 10A) will be described below with reference to FIGS. 1 and 2.

Figure 1:
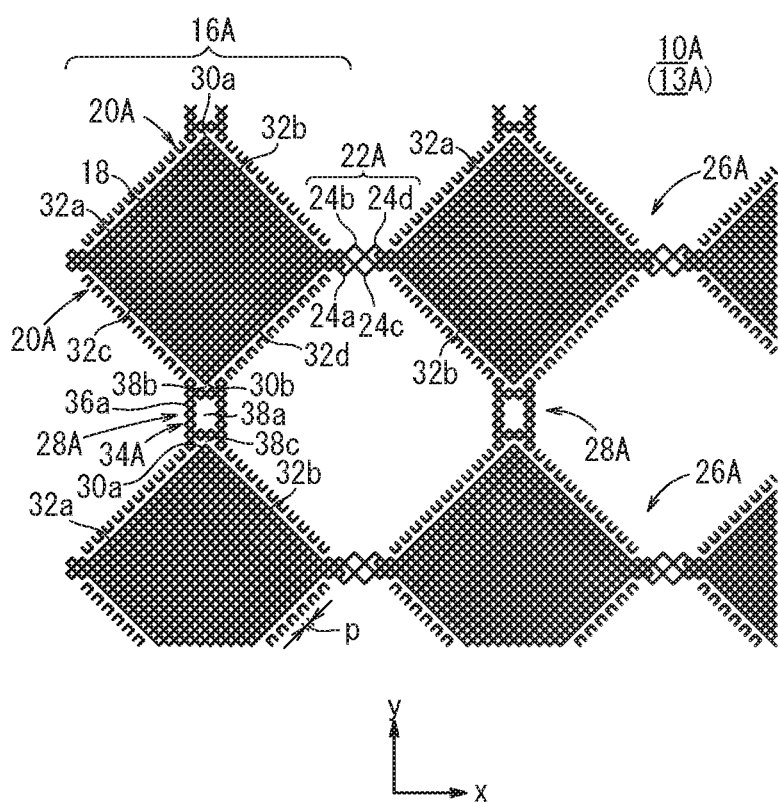
FIG. 1 is a plan view showing a pattern example of a first conductive pattern formed on a first conductive sheet.
Figure 2:
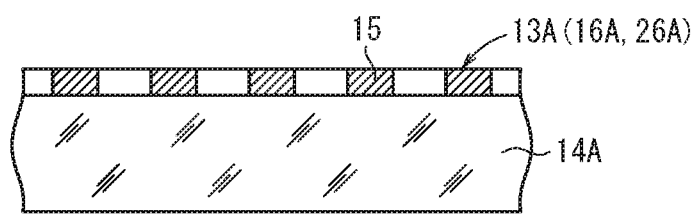
FIG. 2 is a cross-sectional view partially showing the first conductive sheet.

As shown in FIG. 1, the first conductive sheet 10A has a first conductive part 13A formed on one main surface of a first transparent substrate 14A (see FIG. 2). The first conductive part 13A contains two or more conductive first large lattices 16A composed of thin metal wires 15, and each of the first large lattices 16A contains a combination of two or more small lattices 18. A first dummy pattern 20A (a first unconnected pattern) composed of thin metal wires 15, separated from the first large lattices 16A, is formed around each side of the first large lattices 16A. A first connection 22A composed of thin metal wires 15 is formed between each adjacent two of the first large lattices 16A to electrically connect the first large lattices 16A. The first connection 22A contains one or more medium lattices 24 (24a to 24d), and the pitch of the medium lattices 24 is n times larger than that of the small lattices 18 (in which n is a real number larger than 1). The small lattices 18 have a smallest square shape in this embodiment. For example, the thin metal wires 15 contain gold (Au), silver (Ag), or copper (Cu).

The side length of the first large lattice 16A is preferably 3 to 10 mm, more preferably 4 to 6 mm. If the side length is less than the lower limit, in the case of using the first conductive sheet 10A in a touch panel or the like, the first large lattice 16A exhibits a lowered electrostatic capacitance in a detection process, and the touch panel is likely to cause a detection trouble. On the other hand, if the side length is more than the upper limit, the position detection accuracy may be deteriorated. The side length of each small lattice 18 in the first large lattice 16A is preferably 50 to 500 μm, more preferably 150 to 300 μm, for the same reasons. If the side length of the small lattice 18 is within this range, the first conductive sheet 10A can have excellent transparency and thereby can be suitably used at the front of a display device with excellent visibility without creating any feeling of strangeness.

The lower limit of the line width of the thin metal wire 15 is preferably 1 μm or more, 3 μm or more, 4 μm or more, or 5 μm or more, and the upper limit thereof is preferably 15 μm or less, 10 μm or less, 9 μm or less, or 8 μm or less. If the line width is less than the lower limit, the thin metal wire 15 has an insufficient conductivity, whereby a touch panel using the thin metal wire 15 has insufficient detection sensitivity. On the other hand, if the line width is more than the upper limit, a moire may be significantly generated due to the conductive metal portion, and a touch panel using the thin metal wire 15 may have a poor visibility. If the line width is within the above range, the moire of the conductive metal portion is improved, and the visibility is remarkably improved.

Two or more of the first large lattices 16A are arranged in an x direction (a first direction) with the first connection 22A disposed therebetween to form one first conductive pattern 26A composed of the thin metal wires 15. Two or more of the first conductive patterns 26A are arranged in a y direction (a second direction) perpendicular to the x direction, and electrically isolated first insulations 28A are disposed between the adjacent first conductive patterns 26A.

For example, the x direction corresponds to the horizontal or vertical direction of a projected capacitive touch panel 100 or a display panel 110 equipped therewith to be hereinafter described (see FIG. 3).

As shown in FIG. 1, four sides 32 of the first large lattice 16A (i.e. a first side 32a and a second side 32b on one corner 30a unconnected to the adjacent first large lattice 16A and a third side 32c and a fourth side 32d on the other corner 30b unconnected to the adjacent first large lattice 16A) each have a straight line shape. In other words, the intersection of the straight lines of the first side 32a and the second side 32b corresponds to the one corner 30a of the first large lattice 16A, and the intersection of the straight lines of the third side 32c and the fourth side 32d corresponds to the other corner 30b of the first large lattice 16A.

In the first connection 22A, the four medium lattices 24 (the first medium lattice 24a to the fourth medium lattice 24d) are arranged in a zigzag manner, and each of the medium lattices 24 has a size equal to the total of four small lattices 18. The first medium lattice 24a is disposed at the intersection of the second side 32b and the fourth side 32d, and forms an L-shaped space in combination with one small lattice 18. The second medium lattice 24b is disposed on one side of the first medium lattice 24a, and forms such a square space that four small lattices 18 are arranged in a matrix and the central cross is removed. The third medium lattice 24c is adjacent to one vertex of the first medium lattice 24a and one side of the second medium lattice 24b, and has the same shape as the second medium lattice 24b. The fourth medium lattice 24d is disposed at the intersection of the third side 32c and the first side 32a, is adjacent to one vertex of the second medium lattice 24b and one side of the third medium lattice 24c, and forms an L-shaped space in combination with one small lattice 18 as in the first medium lattice 24a. When the small lattices 18 have an arrangement pitch of P, the medium lattices 24 have an arrangement pitch of 2P.

The above-described first dummy pattern 20A is formed around each of the four sides 32 (the first side 32a to the fourth side 32d) of the first large lattice 16A. The first dummy pattern 20A is such that a part of the small lattice 18 is removed to provide a remaining part, and two or more remaining parts are arranged along the corresponding side (straight line). In the example of FIG. 1, the remaining part is provided by removing one side from the small lattice 18 and thus has a shape with two corners and one opening (referred to simply as an approximately U shape), and ten remaining parts are arranged such that the openings are opened in the direction away from the corresponding side of the first large lattice 16A. The arrangement pitch of the remaining parts is twice as large as the arrangement pitch P of the small lattices 18 in the first large lattice 16A. For example, the shortest distance between the straight line shape of the first side 32a and the approximately U shape of the first dummy pattern 20A is approximately equal to the inside side length of the small lattice 18. This is true also for the second side 32b to the fourth side 32d.

In the first insulation 28A, a first insulation pattern 34A unconnected to the first large lattices 16A is formed. The first insulation pattern 34A has a first assembly pattern portion 36a containing two or more small lattices 18 arranged and three spaces 38 (38a to 38c) containing no small lattices 18.

Specifically, the first assembly pattern portion 36a contains a combination of four straight lines (two long straight lines and two short straight lines) composed of a plurality of the small lattices 18. Each of the straight lines is formed by arranging a plurality of the small lattices 18 to connect the vertices of the small lattices 18. With respect to the adjacent two first large lattices 16A (and two second large lattices 16B) with the first insulation 28A interposed therebetween, the three spaces 38 include the first space 38a containing no small lattices 18 surrounded by the first assembly pattern portion 36a, the second space 38b containing no small lattices 18 formed around the other corner 30b of one first large lattice 16A, and the third space 38c containing no small lattices 18 formed around the one corner 30a of the other first large lattice 16A.

For example, among the four straight lines, each of the two long straight lines is formed by arranging seven small lattices 18 to connect the vertices thereof. The small lattice 18 in one end of one long straight line is positioned adjacent to the first dummy pattern 20A along the third side 32c of the one first large lattice 16A at the same pitch around the other corner 30b of the one first large lattice 16A, and the small lattice 18 in the other end of the one long straight line is positioned adjacent to the first dummy pattern 20A along the first side 32a of the other first large lattice 16A at the same pitch around the one corner 30a of the other first large lattice 16A. Similarly, the small lattice 18 in one end of the other long straight line is positioned adjacent to the first dummy pattern 20A along the fourth side 32d of the one first large lattice 16A at the same pitch around the other corner 30b of the one first large lattice 16A, and the small lattice 18 in the other end of the other long straight line is positioned adjacent to the first dummy pattern 20A along the second side 32b of the other first large lattice 16A at the same pitch around the one corner 30a of the other first large lattice 16A.

Among the two short straight lines, one short straight line contains two small lattices 18 connecting the 2nd small lattice 18 from one end in the one long straight line and the 2nd small lattice 18 from one end in the other long straight line. Similarly, the other short straight line contains two small lattices 18 connecting the 2nd small lattice 18 from the other end in the one long straight line and the 2nd small lattice 18 from the other end in the other long straight line.

When the small lattices 18 have an arrangement pitch of P, the first insulation 28A has a width of m×P (in which m is an integer of 1 or more). The width of the first insulation 28A is defined as the shortest distance between the adjacent first conductive patterns 26A (i.e. the distance between the other corner 30b of the one first large lattice 16A and the one corner 30a of the other first large lattice 16A). Thus, the first insulation pattern 34A has a maximum length of m×P or less in the width direction of the first insulation 28A. The maximum length is the distance between a part in the one short straight line facing the other corner 30b of the one first large lattice 16A and a part in the other short straight line facing the one corner 30a of the other first large lattice 16A.

As described above, in the first conductive sheet 10A, the first conductive pattern 26A composed of the thin metal wires 15 is formed by connecting two or more first large lattices 16A in series in the first direction, the first large lattice 16A is formed by combining two or more small lattices 18, the first dummy pattern 20A composed of the thin metal wires 15 separated from the first large lattice 16A is formed around each side of the first large lattice 16A, the thin metal wire 15 has a line width of 1 to 15 μm, and the small lattice 18 has a side length of 50 to 500 μm. As a result, the first conductive sheet 10A can exhibit a significantly lowered electrical resistance as compared with conventional structures using one ITO film for one electrode. Thus, in a case where the first conductive sheet 10A is used in the projected capacitive touch panel 100 or the like, the response speed and the size of the touch panel 100 can be easily increased.

The touch panel 100 containing the above first conductive sheet 10A will be described below with reference to FIGS. 3 to 22.

Figure 4:
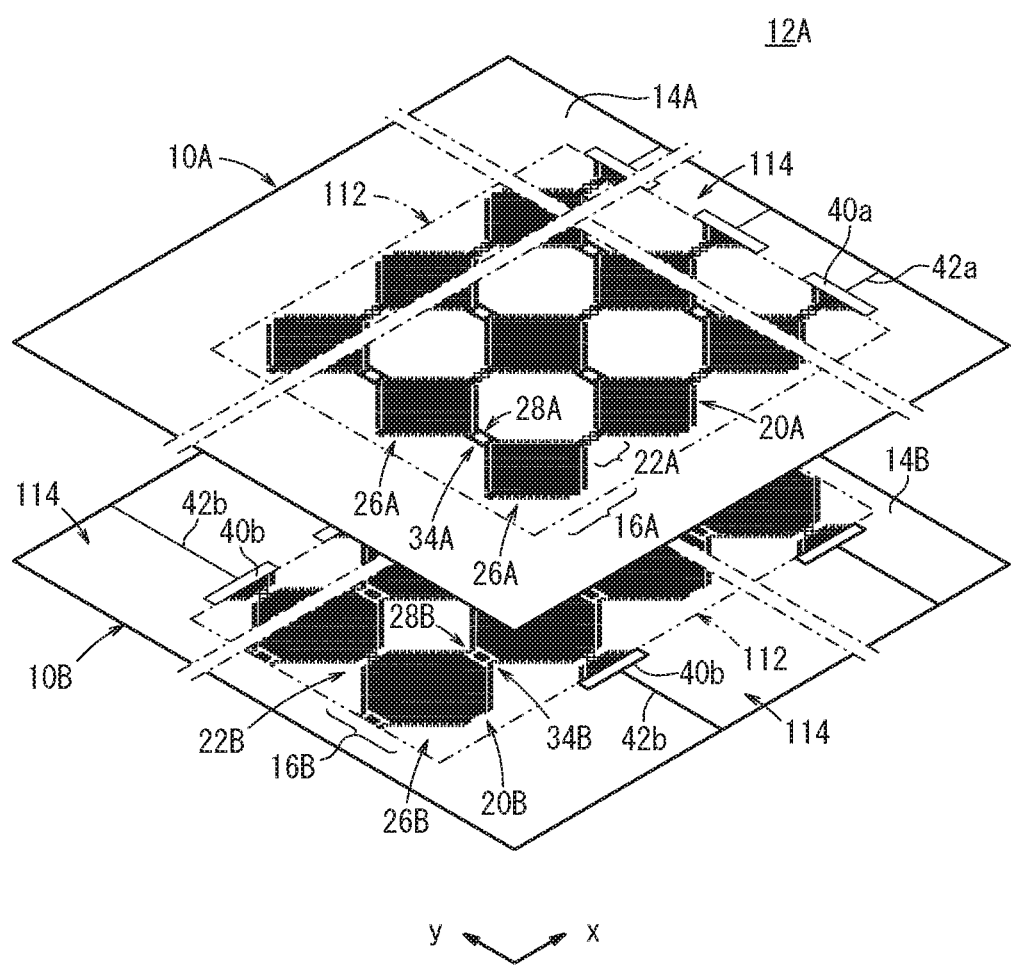
FIG. 4 is an exploded perspective view partially showing a first laminated conductive sheet.
Figure 5A:
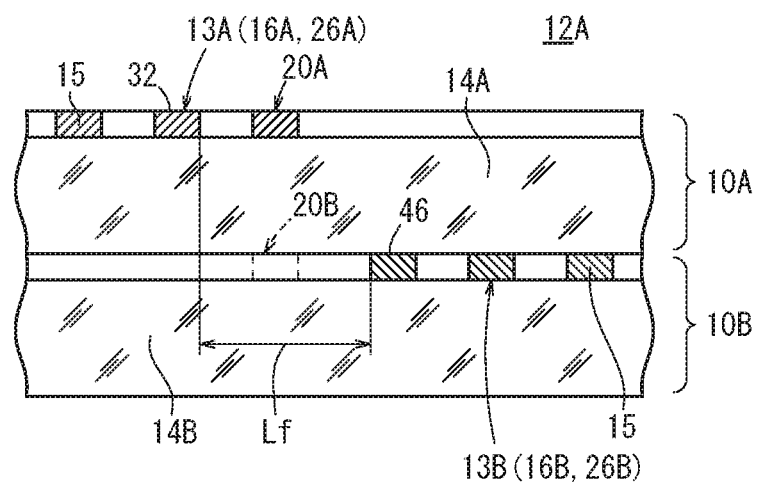
FIG. 5A is a cross-sectional view partially showing an example of the laminated conductive sheet.

The touch panel 100 has a sensor body 102 and a control circuit such as an input circuit (not shown). As shown in FIGS. 3, 4, and 5A, the sensor body 102 contains a touch panel conductive sheet according to the first embodiment (hereinafter referred to as the first laminated conductive sheet 12A) and thereon a protective layer 106 (not shown in FIG. 5A). The first laminated conductive sheet 12A is obtained by stacking the above first conductive sheet 10A and a second conductive sheet 10B to be hereinafter described. The first laminated conductive sheet 12A and the protective layer 106 are disposed on the display panel 110 of a display device 108 such as a liquid crystal display. As viewed from above, the sensor body 102 has a sensing region 112 corresponding to a display screen 110a of the display panel 110 and a terminal wiring region 114 (a so-called frame) corresponding to the periphery of the display panel 110.

In the first conductive sheet 10A of the touch panel 100, in one end of each first conductive pattern 26A, the first connection 22A is not formed on the open end of the first large lattice 16A. In the other end of the first conductive pattern 26A, the end of the first large lattice 16A is electrically connected to a first terminal wiring pattern 42a composed of a thin metal wire 15 by a first wire connection 40a (see FIG. 4). As shown in FIG. 4, a plurality of the first conductive patterns 26A are arranged in the sensing region 112, and a plurality of the first terminal wiring patterns 42a extend from the first wire connections 40a in the terminal wiring region 114.

Figure 3:
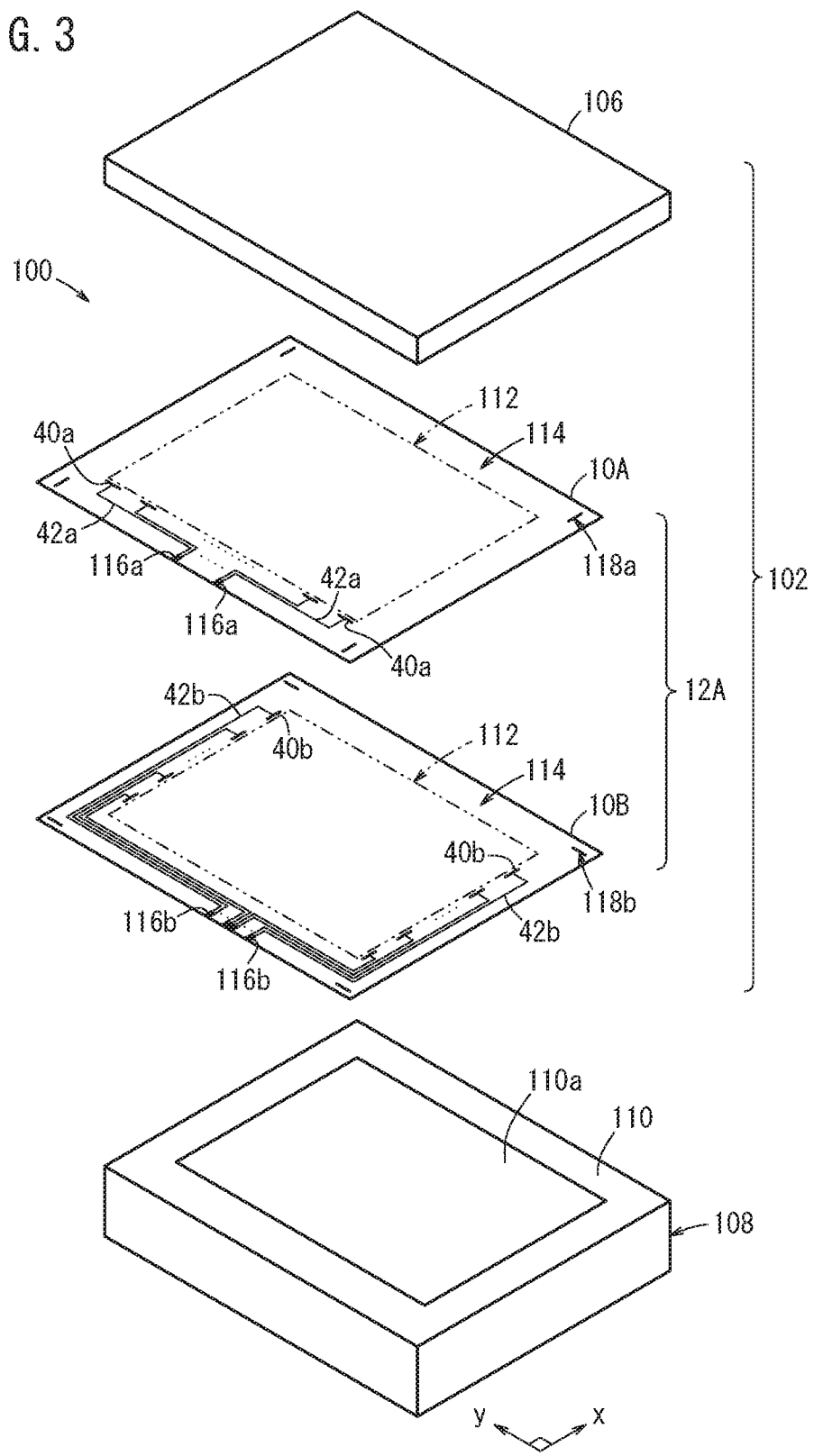
FIG. 3 is an exploded perspective view showing a structure of a touch panel.

In the example of FIG. 3, the first conductive sheet 10A and the sensing region 112 each have a rectangular shape as viewed from above. In the terminal wiring region 114, a plurality of first terminals 116a are arranged in the length direction in the longitudinal center of the periphery on one long side of the first conductive sheet 10A. The first wire connections 40a are arranged in a straight line in the y direction along one long side of the sensing region 112 (a long side closest to the one long side of the first conductive sheet 10A). The first terminal wiring pattern 42a extends from each first wire connection 40a to the center of the one long side of the first conductive sheet 10A, and is electrically connected to the corresponding first terminal 116a. Thus, the first terminal wiring patterns 42a, connected to each pair of corresponding first wire connections 40a formed on the right and left of the one long side of the sensing region 112, have approximately the same lengths. Of course, the first terminals 116a may be formed in a corner of the first conductive sheet 10A or the vicinity thereof. However, in this case, the length difference between the longest and shortest first terminal wiring patterns 42a is increased, whereby the longest first terminal wiring pattern 42a and the first terminal wiring patterns 42a in the vicinity thereof are disadvantageously poor in the rate of transferring a signal to the corresponding first conductive pattern 26A. Thus, in this embodiment, the first terminals 116a are formed in the longitudinal center of the one long side of the first conductive sheet 10A, whereby the local signal transfer rate deterioration is prevented to increase the response speed.

As shown in FIGS. 3, 4, and 5A, the second conductive sheet 10B has a second conductive part 13B formed on one main surface of a second transparent substrate 14B (see FIG. 5A). The second conductive part 13B contains two or more conductive second large lattices 16B composed of thin metal wires 15, and each of the second large lattices 16B contains a combination of two or more small lattices 18. A second dummy pattern 20B (a second unconnected pattern) separated from the second large lattices 16B is formed around each side of the second large lattices 16B. A second connection 22B composed of thin metal wires 15 is formed between each adjacent two of the second large lattices 16B to electrically connect the second large lattices 16B. The second connection 22B contains one or more medium lattices 24 (24e to 24h), and the pitch of the medium lattices 24 is n times larger than that of the small lattices 18 (in which n is a real number larger than 1). The side length of the second large lattice 16B is preferably 3 to 10 mm, more preferably 4 to 6 mm, as well as the first large lattice 16A.

Two or more of the second large lattices 16B are arranged in the y direction (the second direction) with the second connections 22B disposed therebetween to form one second conductive pattern 26B, and two or more of the second conductive patterns 26B are arranged in the x direction (the first direction). Electrically isolated second insulations 28B are disposed between the adjacent second conductive patterns 26B.

As shown in FIG. 4, for example, in one end of each alternate (odd-numbered, for example) second conductive pattern 26B and in the other end of each even-numbered second conductive pattern 26B, the second connection 22B is not formed on the open end of the second large lattice 16B. In the other end of each odd-numbered second conductive pattern 26B and in one end of each even-numbered second conductive pattern 26B, the end of the second large lattice 16B is electrically connected to a second terminal wiring pattern 42b composed of a thin metal wire 15 by a second wire connection 40b.

A large number of the second conductive patterns 26B are arranged in the sensing region 112, and a plurality of the second terminal wiring patterns 42b extending from the second wire connections 40b are arranged in the terminal wiring region 114.

As shown in FIG. 3, in the terminal wiring region 114, a plurality of second terminals 116b are arranged in the length direction in the longitudinal center of the periphery on one long side of the second conductive sheet 10B. For example, a plurality of (the odd-numbered) second wire connections 40b are arranged in a straight line in the x direction along one short side of the sensing region 112 (a short side closest to one short side of the second conductive sheet 10B), and a plurality of (the even-numbered) second wire connections 40b are arranged in a straight line in the x direction along the other short side of the sensing region 112 (a short side closest to the other short side of the second conductive sheet 10B).

For example, among a plurality of the second conductive patterns 26B, each odd-numbered second conductive pattern 26B is connected to the corresponding odd-numbered second wire connection 40b, and each even-numbered second conductive pattern 26B is connected to the corresponding even-numbered second wire connection 40b. The second terminal wiring patterns 42b extend from the odd-numbered and even-numbered second wire connections 40b to the approximate center of one long side of the second conductive sheet 10B, and are each electrically connected to the corresponding second terminal 116b. Thus, for example, the 1st and 2nd second terminal wiring patterns 42b have approximately the same lengths, and similarly the (2n−1)-th and (2n)-th second terminal wiring patterns 42b have approximately the same lengths (n=1, 2, 3, . . . ).

Of course, the second terminals 116b may be formed in a corner of the second conductive sheet 10B or the vicinity thereof. However, in this case, as described above, the longest second terminal wiring pattern 42b and the second terminal wiring patterns 42b in the vicinity thereof are disadvantageously poor in the rate of transferring a signal to the corresponding second conductive pattern 26B. Thus, in this embodiment, the second terminals 116b are formed in the longitudinal center of the one long side of the second conductive sheet 10B, whereby the local signal transfer rate deterioration is prevented so that the response speed is increased.

The first terminal wiring patterns 42a may be arranged in the same manner as in the above second terminal wiring patterns 42b, and the second terminal wiring patterns 42b may be arranged in the same manner as in the above first terminal wiring patterns 42a.

In a case where the first laminated conductive sheet 12A is used in a touch panel, the protective layer 106 is formed on the first conductive sheet 10A, and the first terminal wiring patterns 42a extending from a large number of the first conductive patterns 26A in the first conductive sheet 10A and the second terminal wiring patterns 42b extending from a large number of the second conductive patterns 26B in the second conductive sheet 10B are connected to a scan control circuit or the like.

A self or mutual capacitance technology can be preferably used for detecting a touch position. In the self capacitance technology, a voltage signal for the touch position detection is sequentially supplied to the first conductive patterns 26A, and further a voltage signal for the touch position detection is sequentially supplied to the second conductive patterns 26B. When a finger is brought into contact with or close to the upper surface of the protective layer 106, the capacitance between the first conductive pattern 26A and the second conductive pattern 26B corresponding to the touch position (the position in the upper surface of the protective layer 106 which the finger is brought into contact with or close to), and the GND (ground) is increased, whereby signals from this first conductive pattern 26A and this second conductive pattern 26B have a waveform different from those of signals from the other conductive patterns. Thus, the touch position is calculated by the control circuit based on the signals transmitted from the first conductive pattern 26A and the second conductive pattern 26B. On the other hand, in the mutual capacitance technology, for example, a voltage signal for the touch position detection is sequentially supplied to the first conductive patterns 26A, and the second conductive patterns 26B are sequentially subjected to a sensing process (transmitted signal detection). When a finger is brought into contact with or close to the upper surface of the protective layer 106, the parallel stray capacitance of the finger is added to the parasitic capacitance between the first conductive pattern 26A and the second conductive pattern 26B corresponding to the touch position, whereby a signal from this second conductive pattern 26B has a waveform different from those of signals from the other second conductive patterns 26B. Thus, the touch position is calculated by the control circuit based on the order of the first conductive patterns 26A supplied with the voltage signal and the signal transmitted from the second conductive pattern 26B. Even when two fingers are brought into contact with or close to the upper surface of the protective layer 106 simultaneously, the touch positions can be detected by using the self or mutual capacitance technology. Conventional related detection circuits used in projected capacitive technologies are described in U.S. Pat. Nos. 4,582,955, 4,686,332, 4,733,222, 5,374,787, 5,543,588, and 7,030,860, US Patent Publication No. 2004/0155871, etc.

Figure 6:
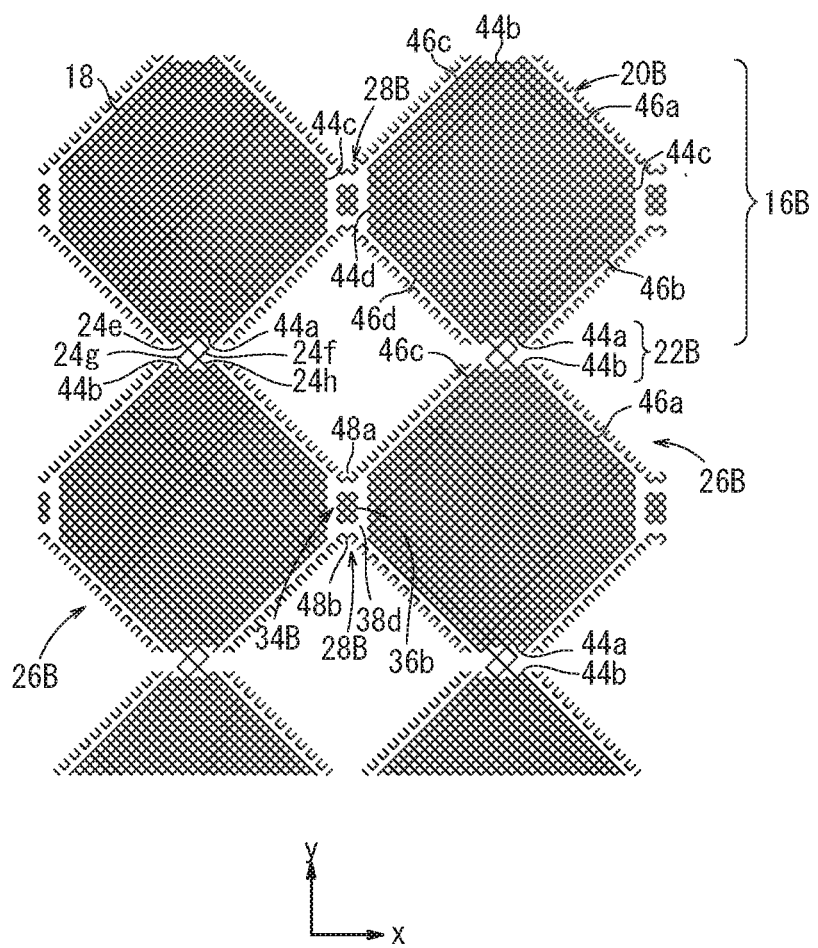
FIG. 6 is a plan view showing a pattern example of a second conductive pattern formed on a second conductive sheet in the first laminated conductive sheet.

As shown in FIG. 6, the second large lattice 16B has an approximately octagonal shape unlike the first large lattice 16A. The second large lattice 16B has four short sides 44 (a first short side 44a to a fourth short side 44d) and four long sides 46 (a first long side 46a to a fourth long side 46d). With respect to the second large lattices 16B arranged adjacent in the y direction, the second connection 22B is formed between the first short side 44a of one second large lattice 16B and the second short side 44b of another second large lattice 16B. With respect to the second large lattices 16B arranged adjacent in the x direction, the second insulation 28B is formed between the third short side 44c of one second large lattice 16B and the fourth short side 44d of another second large lattice 16B.

The four long sides of the second large lattice 16B each have a straight line shape, i.e., the first long side 46a and the second long side 46b adjacent to the third short side 44c facing one second insulation 28B, and the third long side 46c and the fourth long side 46d are adjacent to the fourth short side 44d facing another second insulation 28B.

In the second connection 22B, the four medium lattices 24 (the fifth medium lattice 24e to the eighth medium lattice 24h) are arranged in a zigzag manner, and each of the medium lattices 24 has a size equal to the total of four small lattices 18. The fifth medium lattice 24e is disposed on the first short side 44a, and forms an L-shaped space in combination with one small lattice 18. The sixth medium lattice 24f is disposed on one side of the fifth medium lattice 24e, and forms such a square space that four small lattices 18 are arranged in a matrix and the central cross is removed. The seventh medium lattice 24g is adjacent to one vertex of the fifth medium lattice 24e and one side of the sixth medium lattice 24f, and has the same shape as the sixth medium lattice 24f. The eighth medium lattice 24h is disposed on the second short side 44b, is adjacent to one vertex of the sixth medium lattice 24f and one side of the seventh medium lattice 24g, and forms an L-shaped space in combination with one small lattice 18 as in the fifth medium lattice 24e. When the small lattices 18 have an arrangement pitch of P, the medium lattices 24 have an arrangement pitch of 2P.

The above-described second dummy pattern 20B is formed around each of the four long sides 46 (the first long side 46a to the fourth long side 46d) of the second large lattice 16B. The second dummy pattern 20B is provided such that a part of the small lattice 18 is removed to provide a remaining part, and two or more remaining parts are arranged along the corresponding side (straight line shape). In the example of FIG. 6, the remaining part is provided by removing one side from the small lattice 18 and thus has an approximately U shape, and ten remaining parts are arranged such that the openings are opened in the direction away from the corresponding long side of the second large lattice 16B. The arrangement pitch of the remaining parts is twice as large as the arrangement pitch P of the small lattices 18 in the second large lattices 16B. For example, the shortest distance between the straight line shape of the first long side 46a and the approximately U shape of the second dummy pattern 20B is approximately equal to the inside side length of the small lattice 18. This is true also for the second long side 46b to the fourth long side 46d.

In the second insulation 28B, a second insulation pattern 34B unconnected to the second large lattices 16B is formed. The second insulation pattern 34B has a second assembly pattern portion 36b containing two or more small lattices 18 arranged, a first bend pattern portion 48a and a second bend pattern portion 48b each containing two approximately U shapes, and one space (a fourth space 38d) containing no small lattices 18.

Specifically, the second assembly pattern portion 36b is formed by arranging a plurality of (for example six) small lattices 18 in a matrix to connect the vertices of the small lattices 18. The number of the small lattices 18 is determined such that the small lattices 18 can be placed in the first space 38a of the first insulation pattern 34A in the first conductive pattern 26A shown in FIG. 1.

The first bend pattern portion 48a has the two approximately U shapes formed on one end of the second insulation pattern 34B (between the intersection of the fourth short side 44d and the third long side 46c in one second large lattice 16B and the intersection of the third short side 44c and the first long side 46a in another second large lattice 16B). The ends of the two approximately U shapes are connected, and an angle formed by the sides at the ends is approximately 90°.

Similarly, the second bend pattern portion 48b has the two approximately U shapes formed on the other end of the second insulation pattern 34B (between the intersection of the fourth short side 44d and the fourth long side 46d in the one second large lattice 16B and the intersection of the third short side 44c and the second long side 46b in the other second large lattice 16B). The ends of the two approximately U shapes are connected, and an angle formed by the sides at the ends is approximately 90°.

The fourth space 38d (containing no small lattices 18) has a shape in which the four straight lines of the first assembly pattern portion 36a in the first insulation pattern 34A shown in FIG. 1 can be placed.

When the small lattices 18 have an arrangement pitch P, the second insulation 28B has a width of n×P (in which n is an integer of 1 or more). The width of the second insulation 28B is defined as the shortest distance between the adjacent second conductive patterns 26B (i.e. the distance between the fourth short side 44d of the one second large lattice 16B and the third short side 44c of the other second large lattice 16B). Thus, the second insulation pattern 34B has a maximum length of n×P or less, preferably less than n×P, in the width direction of the second insulation 28B. The maximum length is the distance between a part facing the fourth short side 44d of the one second large lattice 16B and a part facing the third short side 44c of the other second large lattice 16B in the second assembly pattern portion 36b.

Figure 7:
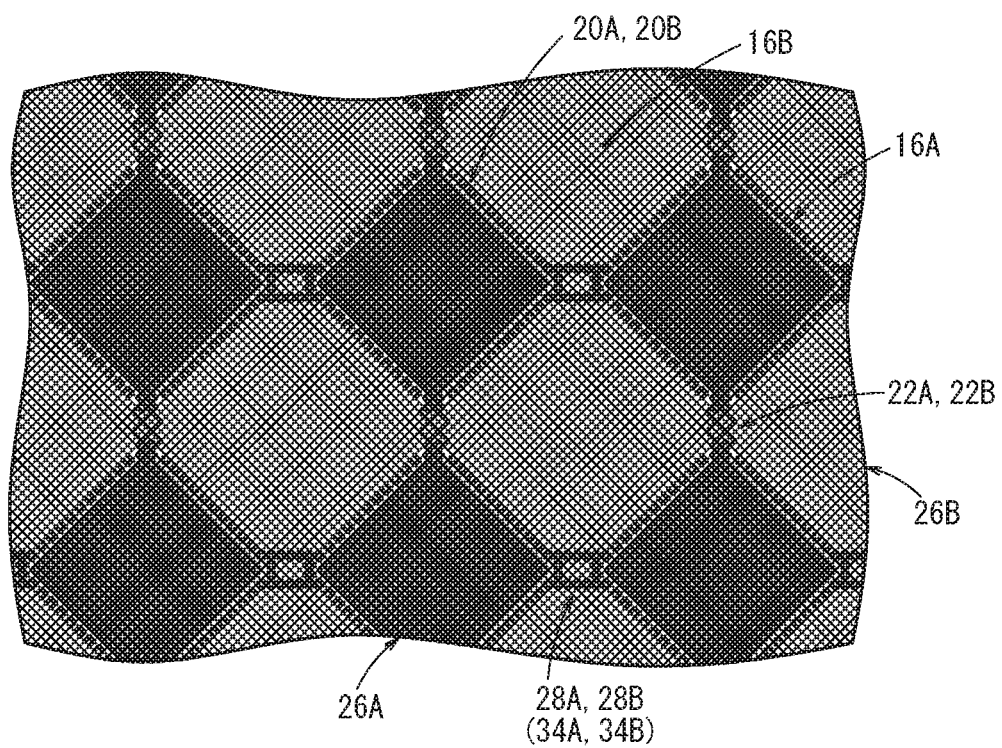
FIG. 7 is a plan view partially showing an example of the first laminated conductive sheet obtained by combining the first and second conductive sheets.

For example, as shown in FIG. 7, in a case where the first conductive sheet 10A is stacked on the second conductive sheet 10B to form the first laminated conductive sheet 12A, the first connections 22A of the first conductive patterns 26A and the second connections 22B of the second conductive patterns 26B are arranged facing each other with the first transparent substrate 14A (see FIG. 5A) interposed therebetween, and the first insulations 28A of the first conductive patterns 26A and the second insulations 28B of the second conductive patterns 26B are arranged facing each other with the first transparent substrate 14A interposed therebetween. Though the first conductive patterns 26A and the second conductive patterns 26B have the same line width, they are exaggeratingly shown by thick lines and thin lines respectively to clearly represent the positions thereof in FIG. 7.

When the stack of the first conductive sheet 10A and the second conductive sheet 10B is viewed from above, spaces between the first large lattices 16A in the first conductive sheet 10A are filled with the second large lattices 16B in the second conductive sheet 10B. Thus, the sensing region 112 is covered with the large lattices. In this case, the first dummy patterns 20A and the second dummy patterns 20B overlap with each other to form combined patterns between the first large lattices 16A and the second large lattices 16B. The combined pattern has a width equal to or larger than the side length of the small lattice 18. The width of the combined pattern is defined as the shortest distance projected on one main surface of the first transparent substrate 14A for example between the first side 32a of the first large lattice 16A and the second long side 46b (facing the first side 32a) of the second large lattice 16B. In the example of FIG. 7, the width of the combined pattern is twice as large as the side length of the small lattice 18. This is true also for the relations between the second side 32b to the fourth side 32d of the first large lattice 16A and the second long side 46b to the fourth long side 46d of the second large lattice 16B.

Thus, as viewed from above, the openings of the approximately U shapes in the first dummy patterns 20A along the first large lattices 16A are closed by the straight long sides of the second large lattices 16B, and the bottoms of the approximately U shapes in the first dummy patterns 20A are connected by the bottoms of the approximately U shapes in the second dummy patterns 20B along the second large lattices 16B. Similarly, the openings of the approximately U shapes in the second dummy patterns 20B along the second large lattices 16B are closed by the straight long sides of the first large lattices 16A, and the bottoms of the approximately U shapes in the second dummy patterns 20B are connected by the bottoms of the approximately U shapes in the first dummy patterns 20A along the first large lattices 16A. As a result, a plurality of the small lattices 18 are arranged as viewed from above, and the boundaries between the first large lattices 16A and the second large lattices 16B can hardly be found.

For example, in the case of not forming the first dummy patterns 20A and the second dummy patterns 20B, blank areas corresponding to the combined pattern width are formed, whereby the edges of the first large lattices 16A and the second large lattices 16B are highly visible, and the visibility is deteriorated. This problem may be solved by overlapping each side of the first large lattices 16A with the corresponding long side of the second large lattices 16B to prevent the formation of the blank area. However, when the stack position accuracy is slightly deteriorated, the overlaps of the straight lines have increased widths (the overlaps are thickened), whereby the boundaries between the first large lattices 16A and the second large lattices 16B are highly visible, and thus the visibility is again deteriorated.

In contrast, in this embodiment, the first dummy patterns 20A and the second dummy patterns 20B are stacked in the above manner, whereby the boundaries between the first large lattices 16A and the second large lattices 16B are made less visible to improve the visibility.

In the case of overlapping each side of the first large lattices 16A with the corresponding long side of the second large lattices 16B to prevent the formation of the blank area as described above, the first to fourth long sides 46a to 46d of the second large lattices 16B are positioned right under the first to fourth sides 32a to 32d of the first large lattice 16A. In this case, all the first to fourth sides 32a to 32d and the first to fourth long sides 46a to 46d function as conductive portions, so that a parasitic capacitance is formed between the side of the first large lattice 16A and the long side of the second large lattice 16B, and the parasitic capacitance acts as a noise on charge information, causing significant deterioration in the S/N ratio. Furthermore, since the parasitic capacitance is formed between each pair of the first large lattice 16A and the second large lattice 16B, a large number of the parasitic capacitances are connected in parallel in the first conductive patterns 26A and the second conductive patterns 26B, resulting in increase of the CR time constant. When the CR time constant is increased, there is a possibility that the waveform rise of the voltage signal supplied to the first conductive pattern 26A (and the second conductive pattern 26B) is retarded, and an electric field for the position detection is hardly generated under a predetermined scan time. In addition, there is also a possibility that the waveform rise or fall of the signal transmitted from each of the first conductive patterns 26A and the second conductive patterns 26B is retarded, and the waveform change of the transmitted signal cannot be detected under a predetermined scan time. This leads to detection accuracy deterioration and response speed deterioration. Thus, in this case, the detection accuracy and response speed can be improved only by reducing the number of the first large lattices 16A and the second large lattices 16B (lowering the resolution) or by reducing the size of the display screen, and the laminated conductive sheet cannot be used in a large screen such as a B5 sized, A4 sized, or larger screen.

In contrast, in this embodiment, as shown in FIG. 5A, the projected distance Lf between the side 32 of the first large lattice 16A and the long side 46 of the second large lattice 16B is approximately twice as large as the side length of the small lattice 18. Therefore, only a small parasitic capacitance is formed between the first large lattice 16A and the second large lattice 16B. As a result, the CR time constant can be reduced to improve the detection accuracy and the response speed. In the combined pattern of the first dummy pattern 20A and the second dummy pattern 20B, each corner of the first dummy pattern 20A overlaps with the corresponding corner of the second dummy pattern 20B. However, this overlap does not result in increase of the parasitic capacitance between the first large lattice 16A and the second large lattice 16B because the first dummy pattern 20A is unconnected with and electrically isolated from the first large lattice 16A and the second dummy pattern 20B is unconnected with and electrically isolated from the second large lattice 16B.

It is preferred that the optimum value of the projected distance Lf is appropriately determined depending not on the sizes of the first large lattices 16A and the second large lattices 16B but on the sizes (the line widths and the side lengths) of the small lattices 18 in the first large lattices 16A and the second large lattices 16B. When the small lattices 18 have an excessively large size as compared with the sizes of the first large lattices 16A and the second large lattices 16B, the resultant conductive sheet may have a high light transmittance, but the dynamic range of the transmitted signal may be reduced, lowering the detection sensitivity. On the other hand, when the small lattices 18 have an excessively small size, the resultant conductive sheet may have high detection sensitivity, but the light transmittance may be deteriorated under the restriction of line width reduction.

When the small lattices 18 have a line width of 1 to 9 μm, the optimum value of the projected distance Lf (the optimum distance) is preferably 100 to 400 μm, more preferably 200 to 300 μm. In a case where the small lattices 18 have a smaller line width, the optimum distance can be further reduced. However, in this case, the electrical resistance is increased, so that the CR time constant may be increased even under a small parasitic capacitance, disadvantageously deteriorating the detection sensitivity and the response speed. Thus, the line width of the small lattice 18 is preferably within the above range.

For example, the sizes of the first large lattice 16A, the second large lattice 16B, and the small lattice 18 are determined based on the size of the display panel 110 or the size and touch position detection resolution (drive pulse period or the like) of the sensing region 112, and the optimum distance between the first large lattice 16A and the second large lattice 16B is obtained based on the line width of the small lattice 18.

When the overlap of the first connection 22A and the second connection 22B is viewed from above, the connection point of the fifth medium lattice 24e and the seventh medium lattice 24g in the second connection 22B is positioned approximately at the center of the second medium lattice 24b around the first large lattice 16A, the connection point of the sixth medium lattice 24f and the eighth medium lattice 24h in the second connection 22B is positioned approximately at the center of the third medium lattice 24c around the first large lattice 16A, and the first medium lattice 24a to the eighth medium lattice 24h form a plurality of the small lattices 18 in combination. Therefore, the small lattices 18 are formed by the combination of the first connections 22A and the second connections 22B in the overlaps thereof. Thus formed small lattices 18 cannot be distinguished from the surrounding small lattices 18 in the first large lattices 16A and the second large lattices 16B, so that the visibility is improved.

When the overlap of the first insulation pattern 34A of the first insulation 28A and the second insulation pattern 34B of the second insulation 28B is viewed from above, the first assembly pattern portion 36a of the first insulation pattern 34A is arranged facing the fourth space 38d of the second insulation pattern 34B, and the first space 38a of the first insulation pattern 34A is arranged facing the second assembly pattern portion 36b of the second insulation pattern 34B. Furthermore, the second space 38b of the first insulation pattern 34A is arranged facing the first bend pattern portion 48a of the second insulation pattern 34B, and the third space 38c of the first insulation pattern 34A is arranged facing the second bend pattern portion 48b of the second insulation pattern 34B. In this case, as viewed from above, the opening of the first bend pattern portion 48a is closed by the straight line shapes of the third side 32c and the fourth side 32d around the other corner 30b of the first large lattice 16A, and the opening of the second bend pattern portion 48b is closed by the straight line shapes of the first side 32a and the second side 32b around the one corner 30a of the first large lattice 16A. Therefore, the first insulation patterns 34A and the second insulation patterns 34B form a plurality of the small lattices 18 in combination. Thus formed small lattices 18 cannot be distinguished from the surrounding small lattices 18 in the first large lattices 16A and the second large lattices 16B, so that the visibility is improved.

In this embodiment, in the terminal wiring region 114, a plurality of the first terminals 116a are formed in the longitudinal center of the periphery on the one long side of the first conductive sheet 10A, and a plurality of the second terminals 116b are formed in the longitudinal center of the periphery on the one long side of the second conductive sheet 10B. Particularly, in the example of FIG. 3, the first terminals 116a and the second terminals 116b do not overlap with each other but are close to each other, and the first terminal wiring patterns 42a and the second terminal wiring patterns 42b do not overlap with each other. For example, the first terminal 116a may partially overlap with the odd-numbered second terminal wiring pattern 42b.

Thus, the first terminals 116a and the second terminals 116b can be electrically connected to the control circuit by using a cable and two connectors (a connector for the first terminals 116a and a connector for the second terminals 116b) or one connector (a complex connector to be connected to the first terminals 116a and the second terminals 116b).

Since the first terminal wiring patterns 42a and the second terminal wiring patterns 42b do not vertically overlap with each other, a parasitic capacitance generation is reduced therebetween so that the response speed deterioration is prevented.

Since the first wire connections 40a are arranged along the one long side of the sensing region 112 and the second wire connections 40b are arranged along both the short sides of the sensing region 112, the area of the terminal wiring region 114 can be reduced. Therefore, the size of the display panel 110 containing the touch panel 100 can be easily reduced, and the display screen 110a can be made to seem larger. Also the operability of the touch panel 100 can be improved.

The area of the terminal wiring region 114 may be further reduced by reducing the distance between the adjacent first terminal wiring patterns 42a or the adjacent second terminal wiring patterns 42b. The distance is preferably 10 to 50 μm in view of preventing migration.

Alternatively, the area of the terminal wiring region 114 may be reduced by arranging the second terminal wiring pattern 42b between the adjacent first terminal wiring patterns 42a as viewed from above. However, when the pattern is misaligned, the first terminal wiring pattern 42a may vertically overlap with the second terminal wiring pattern 42b, so that the parasitic capacitance therebetween becomes disadvantageously increased. This leads to the response speed deterioration. Thus, in the case of using such an arrangement, the distance between the adjacent first terminal wiring patterns 42a is preferably 50 to 100 μm.

Consequently, when the first laminated conductive sheet 12A is used in the projected capacitive touch panel 100 or the like, the response speed and the size of the touch panel 100 can be easily increased.

The combination of the first dummy patterns 20A formed around the first large lattices 16A in the first conductive sheet 10A and the second dummy patterns 20B formed around the second large lattices 16B in the second conductive sheet 10B, the combination of the first connections 22A and the second connections 22B, and the combination of the first insulation patterns 34A and the second insulation patterns 34B form a plurality of the small lattices 18. Therefore, the boundaries between the first large lattices 16A of the first conductive sheet 10A and the second large lattices 16B of the second conductive sheet 10B can be made less visible, defects such as the local line thickening can be prevented, and the overall visibility can be improved.

Furthermore, the CR time constant of a large number of the first conductive patterns 26A and the second conductive patterns 26B can be significantly reduced, whereby the response speed can be increased, and the position detection can be readily carried out in an operation time (a scan time). Thus, the screen sizes (not the thickness but the length and width) of the touch panel 100 can be easily increased.

Though the first large lattice 16A has a rectangular outer shape as shown in FIG. 1 and the second large lattice 16B has an octagonal outer shape as shown in FIG. 6 in the above example, the outer shapes of the first large lattice 16A and the second large lattice 16B are not limited thereto. Also the sizes of the first large lattice 16A and the second large lattice 16B are not particularly limited as long as the sizes are sufficient for detecting the touch position.

Though the small lattice 18 has a square shape in the above example, it may have another polygonal shape. Each side of the small lattice 18 may have a straight line shape, a curved shape, or an arc shape. When the small lattice 18 has an arc-shaped side, for example, two opposite sides may have an outwardly protruding arc shape and the other two opposite sides may have an inwardly protruding arc shape. Alternatively, each side may have a wavy shape containing outwardly protruding arcs and inwardly protruding arcs continuously. Of course, each side may have a sine curve shape.

Though the arrangement pitch of the medium lattices 24 in the first connections 22A and the second connections 22B is twice larger than the arrangement pitch P of the small lattices 18 in the above first conductive sheet 10A and second conductive sheet 10B, it may be appropriately selected depending on the number of the medium lattices 24. For example, the arrangement pitch of the medium lattices 24 may be 1.5 or 3 times larger than the arrangement pitch P of the small lattices 18. When the arrangement pitch of the medium lattices 24 is excessively small or large, it may be difficult to arrange the first large lattices 16A and the second large lattices 16B, resulting in poor appearance. Thus, the arrangement pitch of the medium lattices 24 is preferably 1 to 10 times, more preferably 1 to 5 times, larger than the arrangement pitch P of the small lattices 18.

Also the sizes of the small lattices 18 (including the side length and the diagonal line length), the number of the small lattices 18 in the first large lattice 16A, and the number of the small lattices 18 in the second large lattice 16B may be appropriately selected depending on the size and the resolution (the number of wires) of the touch panel.

Figure 5B:
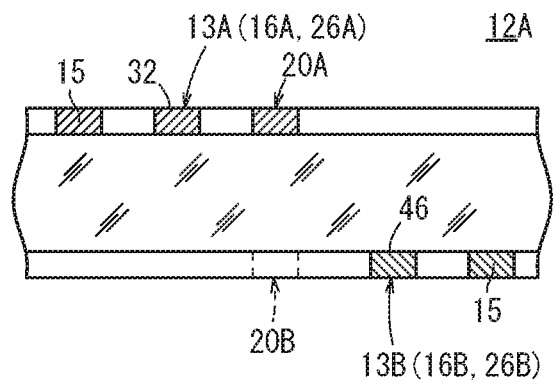
FIG. 5B is a cross-sectional view partially showing another example of the laminated conductive sheet.

As shown in FIGS. 3, 4, and 5A, in the above first laminated conductive sheet 12A, the first conductive patterns 26A are formed on one main surface of the first transparent substrate 14A, and the second conductive patterns 26B are formed on one main surface of the second transparent substrate 14B. Alternatively, as shown in FIG. 5B, the first conductive part 13A may be formed on one main surface of the first transparent substrate 14A, and the second conductive part 13B may be formed on the other main surface of the first transparent substrate 14A. In this case, the second transparent substrate 14B is not used, the first transparent substrate 14A is stacked on the second conductive part 13B, and the first conductive part 13A is stacked on the first transparent substrate 14A. In addition, another layer may be disposed between the first conductive sheet 10A and the second conductive sheet 10B. The first conductive patterns 26A and the second conductive patterns 26B may be arranged facing each other as long as they are insulated.

Three structures shown schematically in FIGS. 8A to 8C can be preferably used in this embodiment.

In a first structure example shown in FIG. 8A, the first laminated conductive sheet 12A shown in FIG. 5B (containing the first conductive part 13A, the first transparent substrate 14A, and the second conductive part 13B) is stacked on the display device 108 with a transparent adhesive 120 interposed therebetween, a hard coat layer 122 is stacked on the first laminated conductive sheet 12A, and further an antireflection layer 124 is stacked on the hard coat layer 122. The transparent adhesive 120, the second conductive part 13B, the first transparent substrate 14A, and the first conductive part 13A form the touch panel 100 on the display device 108, and the hard coat layer 122 and the antireflection layer 124 form an antireflection film 126 on the touch panel 100.

In a second structure example shown in FIG. 8B, the first laminated conductive sheet 12A shown in FIG. 5B and a protective resin layer 128 are stacked on the display device 108 with the transparent adhesive 120 interposed therebetween, the hard coat layer 122 is stacked on the protective resin layer 128, and further the antireflection layer 124 is stacked on the hard coat layer 122. The transparent adhesive 120, the second conductive part 13B, the first transparent substrate 14A, the first conductive part 13A, and the protective resin layer 128 form the touch panel 100 on the display device 108, and the hard coat layer 122 and the antireflection layer 124 form the antireflection film 126 on the touch panel 100.

In a third structure example shown in FIG. 8C, the first laminated conductive sheet 12A shown in FIG. 5B and a second transparent adhesive 120B are stacked on the display device 108 with a first transparent adhesive 120A interposed therebetween, a transparent film 130 is stacked on the second transparent adhesive 120B, the hard coat layer 122 is stacked on the transparent film 130, and further the antireflection layer 124 is stacked on the hard coat layer 122. The first transparent adhesive 120A, the second conductive part 13B, the first transparent substrate 14A, the first conductive part 13A, and the second transparent adhesive 120B form the touch panel 100 on the display device 108, and the transparent film 130, the hard coat layer 122, and the antireflection layer 124 form the antireflection film 126 on the touch panel 100.

As shown in FIG. 3, first alignment marks 118a and second alignment marks 118b are preferably formed, for example on the corners of the first conductive sheet 10A and the second conductive sheet 10B. The first alignment marks 118a and the second alignment marks 118b are used for positioning the first conductive sheet 10A and the second conductive sheet 10B in a bonding process. In a case where the first conductive sheet 10A and the second conductive sheet 10B are bonded to obtain the first laminated conductive sheet 12A, composite alignment marks are formed by the first alignment marks 118a and the second alignment marks 118b. The composite alignment marks can be used for positioning the first laminated conductive sheet 12A in the process of attaching to the display panel 110.

A touch panel conductive sheet according to a second embodiment (hereinafter referred to as the second laminated conductive sheet 12B) will be described below with reference to FIGS. 9 to 12.

Figure 9:
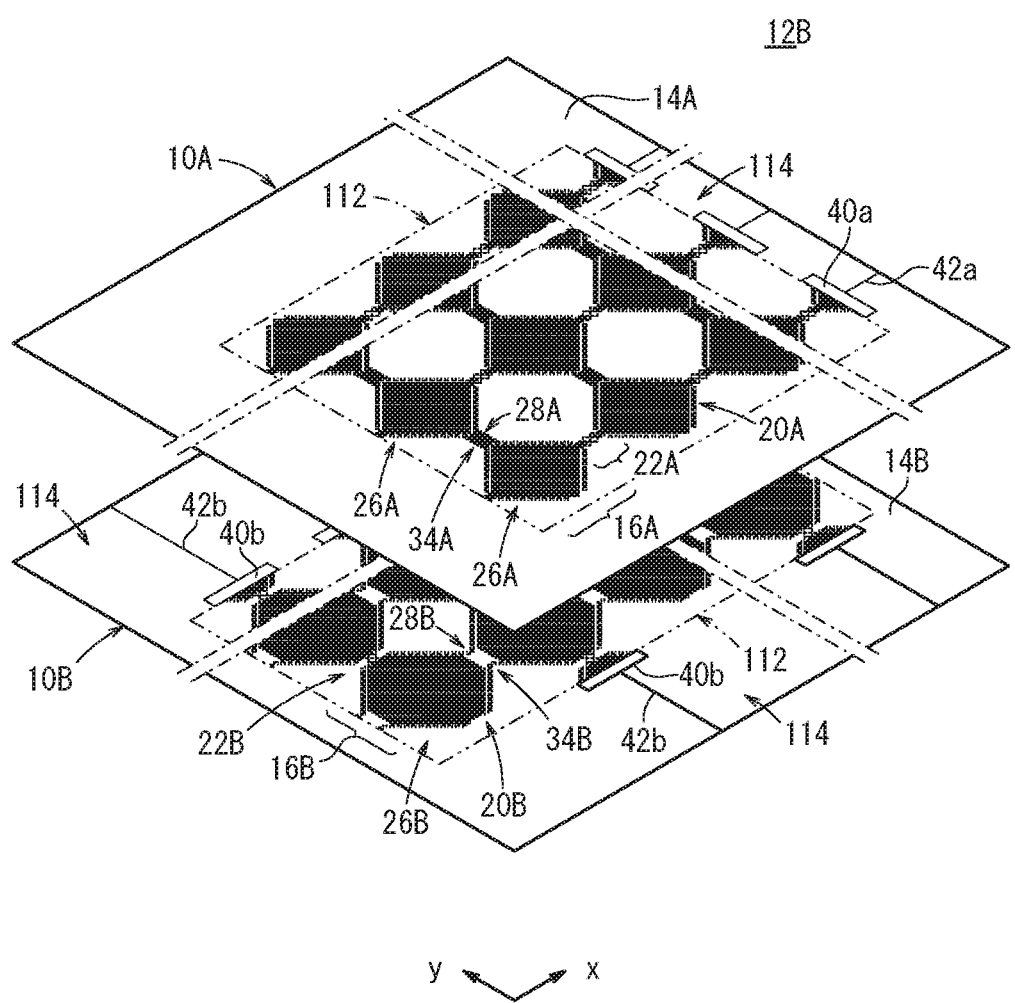
FIG. 9 is an exploded perspective view partially showing a second laminated conductive sheet.

As shown in FIG. 9, the second laminated conductive sheet 12B has approximately the same structure as the above first laminated conductive sheet 12A, but is different in the shapes of the first insulation pattern 34A in the first insulation 28A and the second insulation pattern 34B in the second insulation 28B.

Figure 10:
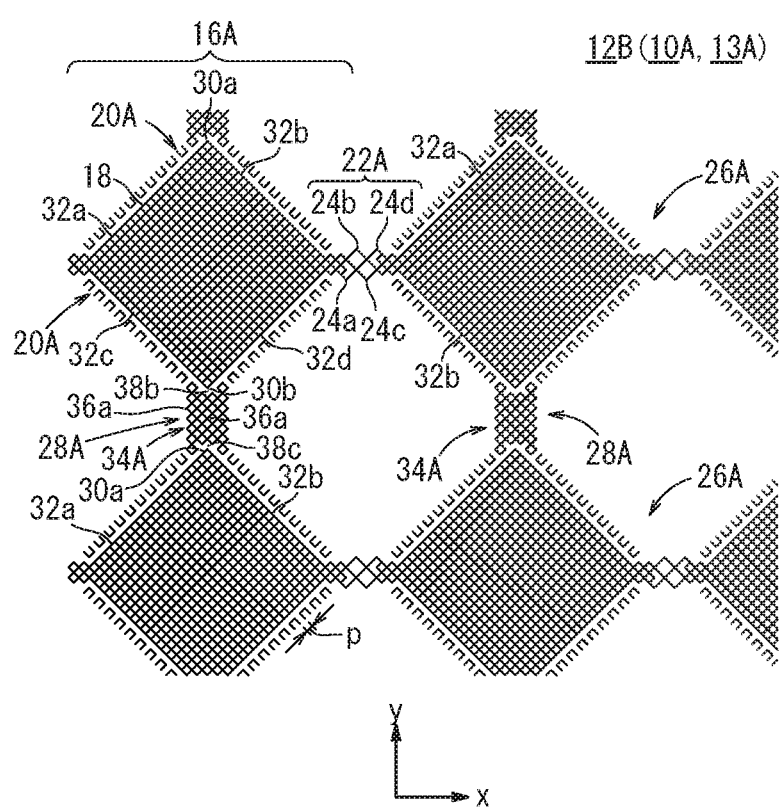
FIG. 10 is a plan view showing a pattern example of a first conductive pattern formed on a first conductive sheet in the second laminated conductive sheet.
Figure 11:
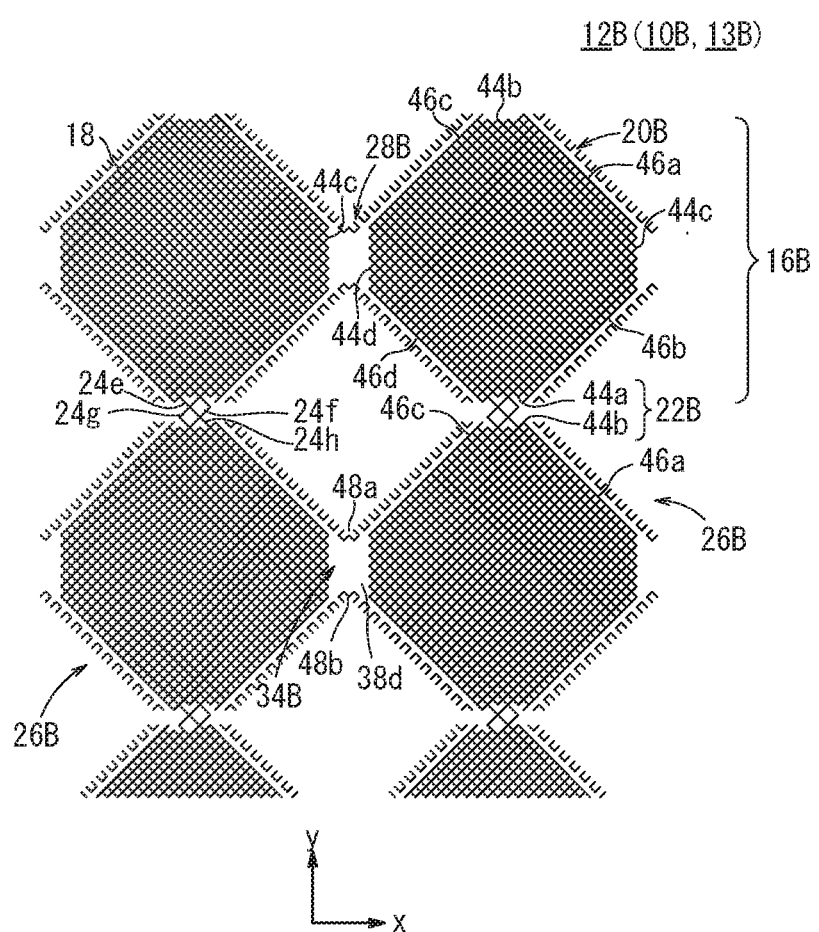
FIG. 11 is a plan view showing a pattern example of a second conductive pattern formed on a second conductive sheet in the second laminated conductive sheet.

As shown in FIG. 10, the shape of the first assembly pattern portion 36a in the first insulation pattern 34A is such that the first space 38a (see FIG. 1) is filled with the second assembly pattern portion 36b (see FIG. 6). Thus, the first assembly pattern portion 36a is filled with the small lattices 18 between the opposite short straight lines, and the first insulation pattern 34A does not have the first space 38a. As shown in FIG. 11, the shape of the fourth space 38d in the second insulation pattern 34B is such that the second assembly pattern portion 36b (see FIG. 6) is removed. Thus, the second insulation 28B has no small lattices 18.

Figure 12:
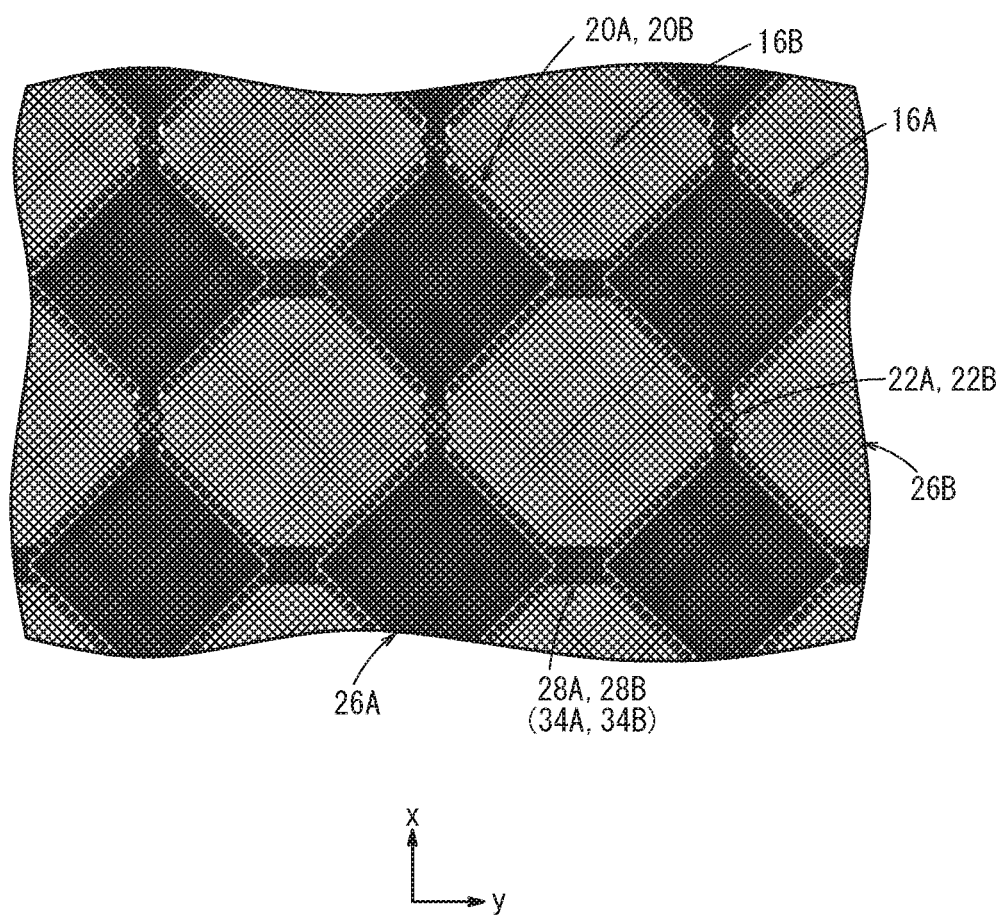
FIG. 12 is a plan view partially showing an example of the second laminated conductive sheet obtained by combining the first and second conductive sheets.

For example, as shown in FIG. 12, in a case where the first conductive sheet 10A is stacked on the second conductive sheet 10B to form the second laminated conductive sheet 12B, as in the first laminated conductive sheet 12A (see FIG. 7), the first connections 22A of the first conductive patterns 26A and the second connections 22B of the second conductive patterns 26B are arranged facing each other with the first transparent substrate 14A (see FIG. 5A) interposed therebetween, and the first insulations 28A of the first conductive patterns 26A and the second insulations 28B of the second conductive patterns 26B are arranged facing each other with the first transparent substrate 14A interposed therebetween. Though the first conductive patterns 26A and the second conductive patterns 26B have the same line width, they are exaggeratingly shown by thick lines and thin lines respectively to clearly represent the positions thereof in FIG. 12 as well as FIG. 7.

Particularly, when the overlap of the first insulation pattern 34A of the first insulation 28A and the second insulation pattern 34B of the second insulation 28B is viewed from above, the first assembly pattern portion 36a of the first insulation pattern 34A is arranged facing the fourth space 38d of the second insulation pattern 34B, the second space 38b of the first insulation pattern 34A is arranged facing the first bend pattern portion 48a of the second insulation pattern 34B, and the third space 38c of the first insulation pattern 34A is arranged facing the second bend pattern portion 48b of the second insulation pattern 34B. Consequently, as in the first laminated conductive sheet 12A, the first insulation patterns 34A and the second insulation patterns 34B form a plurality of the small lattices 18 in combination. Thus formed small lattices 18 cannot be distinguished from the surrounding small lattices 18 in the first large lattices 16A and the second large lattices 16B, so that the visibility is improved.

Though not shown in the drawings, the arrangement of the first wire connections 40a and the second wire connections 40b, the arrangement of the first terminal wiring patterns 42a and the second terminal wiring patterns 42b in the terminal wiring region 114, and the arrangement of the first terminals 116a and the second terminals 116b in the second laminated conductive sheet 12B are equal to those in the above first laminated conductive sheet 12A.

Consequently, when the second laminated conductive sheet 12B using the second conductive sheet 10B is used in the projected capacitive touch panel 100 or the like, the response speed and the size of the touch panel 100 can be easily increased. Furthermore, the boundaries between the first large lattices 16A of the first conductive sheet 10A and the second large lattices 16B of the second conductive sheet 10B can be made less visible, defects such as the local line thickening can be prevented, and the overall visibility can be improved.

A touch panel conductive sheet according to a third embodiment (hereinafter referred to as the third laminated conductive sheet 12C) will be described below with reference to FIGS. 13 to 16.

Figure 13:
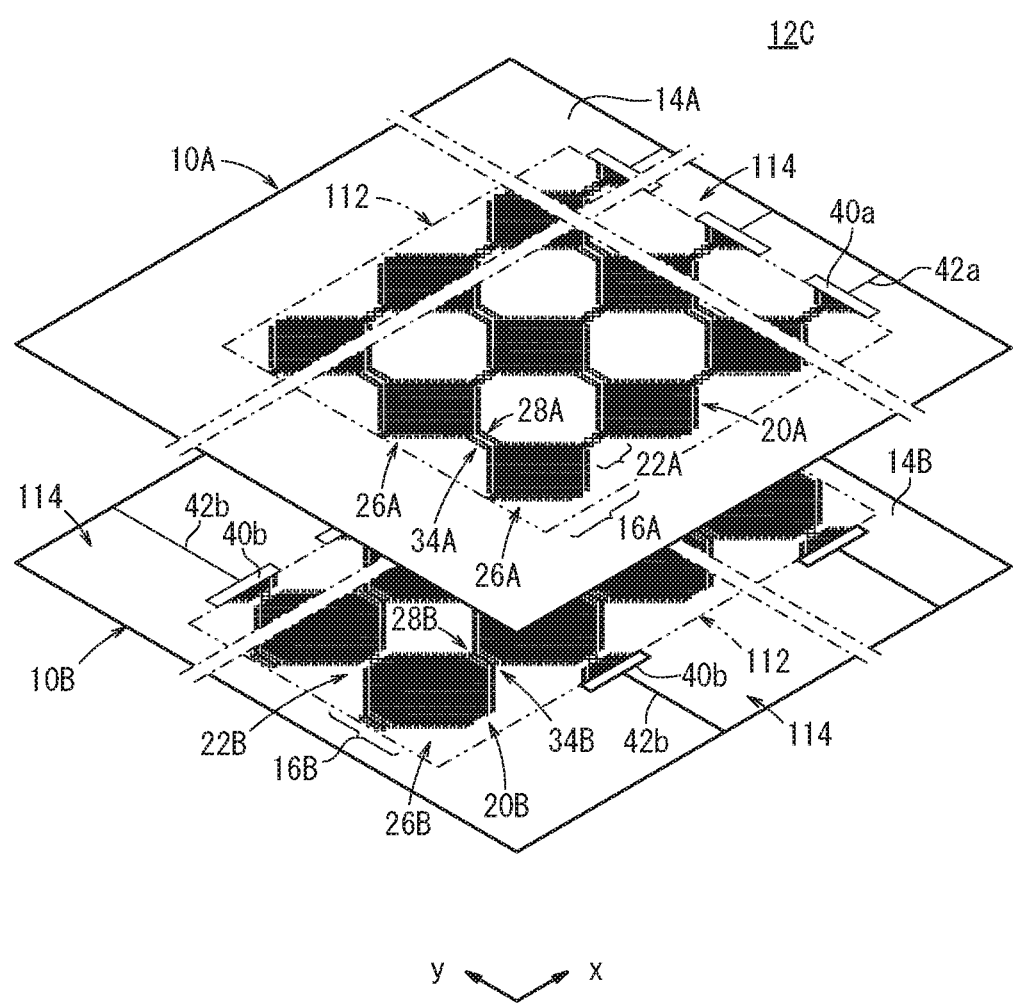
FIG. 13 is an exploded perspective view partially showing a third laminated conductive sheet.

As shown in FIG. 13, the third laminated conductive sheet 12C has approximately the same structure as the above first laminated conductive sheet 12A, but is different in the shapes of the first insulation pattern 34A in the first insulation 28A and the second insulation pattern 34B in the second insulation 28B.

Figure 14:
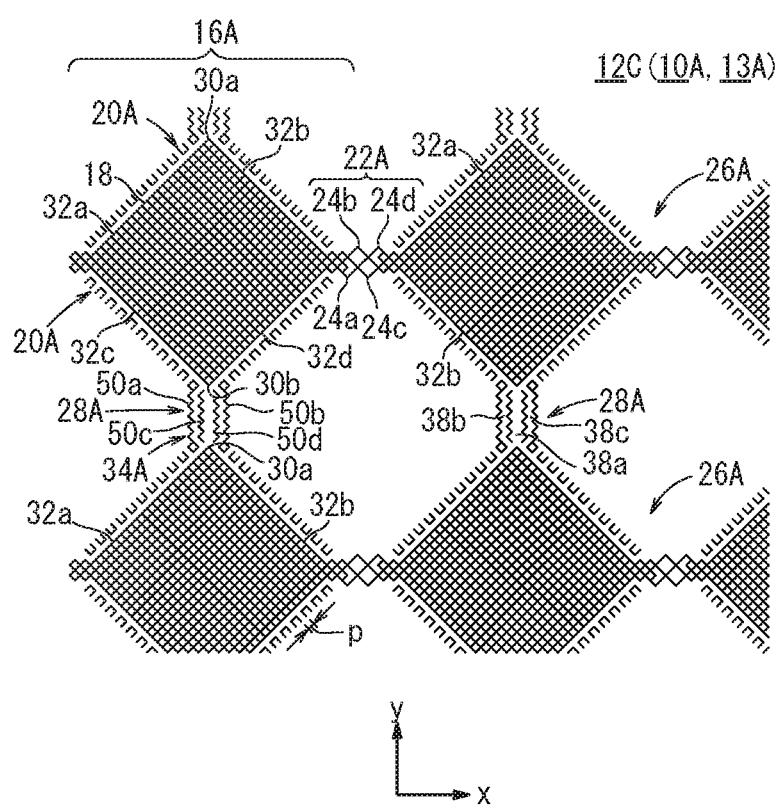
FIG. 14 is a plan view showing a pattern example of a first conductive pattern formed on a first conductive sheet in the third laminated conductive sheet.

As shown in FIG. 14, in the first insulation pattern 34A, four wavy lines 50 (a first wavy line 50a to a fourth wavy line 50d) extending in the y direction are arranged in parallel. Each of the four wavy lines 50 has such a structure that two sides of the small lattice 18 are continuously arranged. Among the four wavy lines 50, the ends of the outer first wavy line 50*a* and the outer second wavy line 50*b* are connected to the small lattices 18, and the ends of the inner third wavy line 50*c* and the inner fourth wavy line 50*d* are not connected to the small lattices 18. The positions of the small lattices 18 at the ends of the first wavy line 50*a* and the second wavy line 50*b* are equal to those at the ends of the long straight lines of the first insulation pattern 34A in the first laminated conductive sheet 12A (see FIG. 1).

The adjacent first and third wavy lines 50*a* and 50*c* have the same wave shape (pattern), and the adjacent second and fourth wavy lines 50*b* and 50*d* have the same wave shape (pattern). The outer first wavy line 50*a* has a wave shape (pattern) opposite to that of the outer second wavy line 50*b*, and the inner third wavy line 50*c* has a wave shape (pattern) opposite to that of the inner fourth wavy line 50*d*.

In the first insulation pattern 34A, a first space 38*a* is formed between the adjacent third and fourth wavy lines 50*c* and 50*d*, a second space 38*b* is formed between the adjacent first and third wavy lines 50*a* and 50*c*, and a third space 38*c* is formed between the adjacent second and fourth wavy lines 50*b* and 50*d*.

Figure 15:
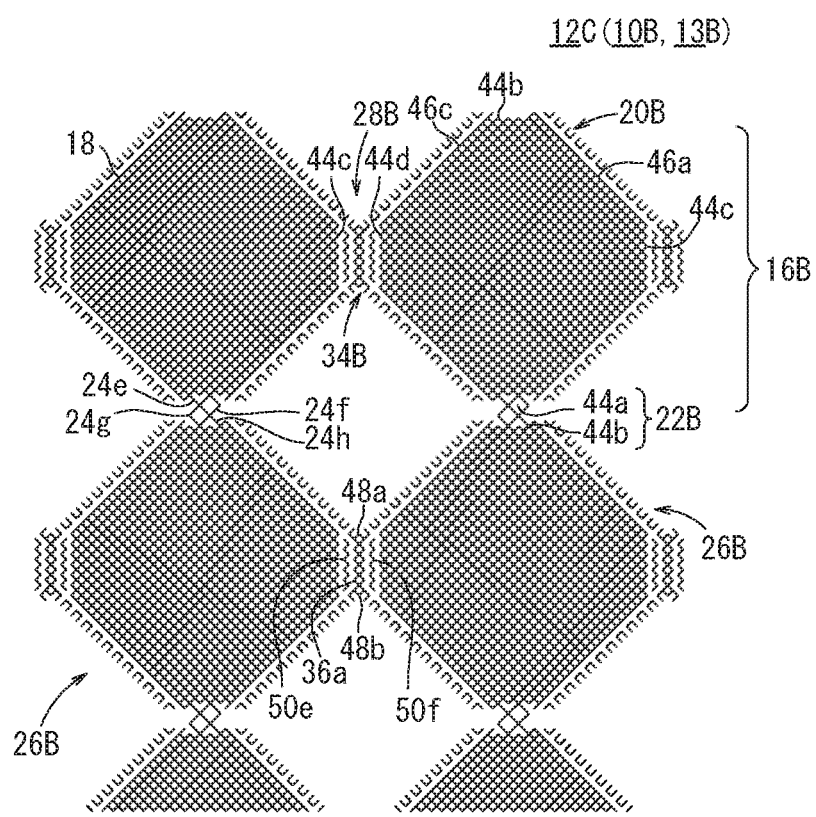
FIG. 15 is a plan view showing a pattern example of a second conductive pattern formed on a second conductive sheet in the third laminated conductive sheet.

On the other hand, as shown in FIG. 15, the second insulation pattern 34B has a first assembly pattern portion 36*a* to be placed in the first space 38*a* of the first insulation pattern 34A, a fifth wavy line 50*e* to be placed in the second space 38*b* of the first insulation pattern 34A, and a sixth wavy line 50*f* to be placed in the third space 38*c* of the first insulation pattern 34A. The first assembly pattern portion 36*a* is connected to the first bend pattern portion 48*a* and the second bend pattern portion 48*b*, and is formed by arranging two or more small lattices 18 (for example six small lattices 18) to connect the vertices thereof.

The fifth wavy line 50*e* in the second insulation pattern 34B has a wave shape (pattern) opposite to those of the first and third wavy lines 50*a* and 50*c* in the first insulation pattern 34A. Similarly, the sixth wavy line 50*f* in the second insulation pattern 34B has a wave shape (pattern) opposite to those of the second and fourth wavy lines 50*b* and 50*d* in the first insulation pattern 34A.

Figure 16:
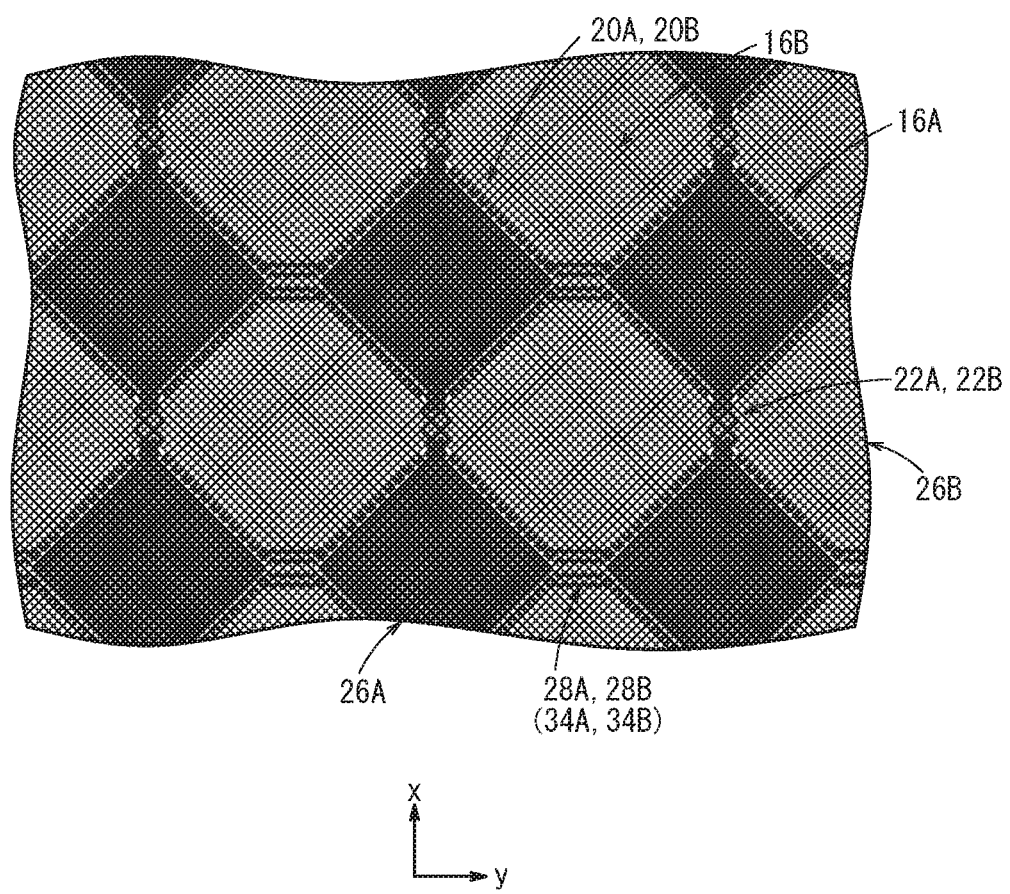
FIG. 16 is a plan view partially showing an example of the third laminated conductive sheet obtained by combining the first and second conductive sheets.

For example, as shown in FIG. 16, in a case where the first conductive sheet 10A is stacked on the second conductive sheet 10B to form the third laminated conductive sheet 12C, as in the first laminated conductive sheet 12A (see FIG. 7), the first connections 22A of the first conductive patterns 26A and the second connections 22B of the second conductive patterns 26B are arranged facing each other with the first transparent substrate 14A (see FIG. 5A) interposed therebetween, and the first insulations 28A of the first conductive patterns 26A and the second insulations 28B of the second conductive patterns 26B are arranged facing each other with the first transparent substrate 14A interposed therebetween. Though the first conductive patterns 26A and the second conductive patterns 26B have the same line width, they are exaggeratingly shown by thick lines and thin lines respectively to clearly represent the positions thereof in FIG. 16 as well as FIG. 7.

Particularly, when the overlap of the first insulation pattern 34A of the first insulation 28A and the second insulation pattern 34B of the second insulation 28B is viewed from above, the first space 38*a* of the first insulation pattern 34A is arranged facing the first assembly pattern portion 36*a* of the second insulation pattern 34B, the second space 38*b* of the first insulation pattern 34A is arranged facing the fifth wavy line 50*e* of the second insulation pattern 34B, and the third space 38*c* of the first insulation pattern 34A is arranged facing the sixth wavy line 50*f* of the second insulation pattern 34B. Consequently, as in the first laminated conductive sheet 12A, the first insulation patterns 34A and the second insulation patterns 34B form a plurality of the small lattices 18 in combination. Thus formed small lattices 18 cannot be distinguished from the surrounding small lattices 18 in the first large lattices 16A and the second large lattices 16B, so that the visibility is improved.

Though not shown in the drawings, the arrangement of the first wire connections 40*a* and the second wire connections 40*b*, the arrangement of the first terminal wiring patterns 42*a* and the second terminal wiring patterns 42*b* in the terminal wiring region 114, and the arrangement of the first terminals 116*a* and the second terminals 116*b* in the third laminated conductive sheet 12C are equal to those in the above first laminated conductive sheet 12A.

Consequently, when the third laminated conductive sheet 12C is used in the projected capacitive touch panel 100 or the like, the response speed and the size of the touch panel 100 can be easily increased. Furthermore, the boundaries between the first large lattices 16A of the first conductive sheet 10A and the second large lattices 16B of the second conductive sheet 10B can be made less visible, defects such as the local line thickening can be prevented, and the overall visibility can be improved.

A touch panel conductive sheet according to a fourth embodiment (hereinafter referred to as the fourth laminated conductive sheet 12D) will be described below with reference to FIGS. 17 to 22.

Figure 17:
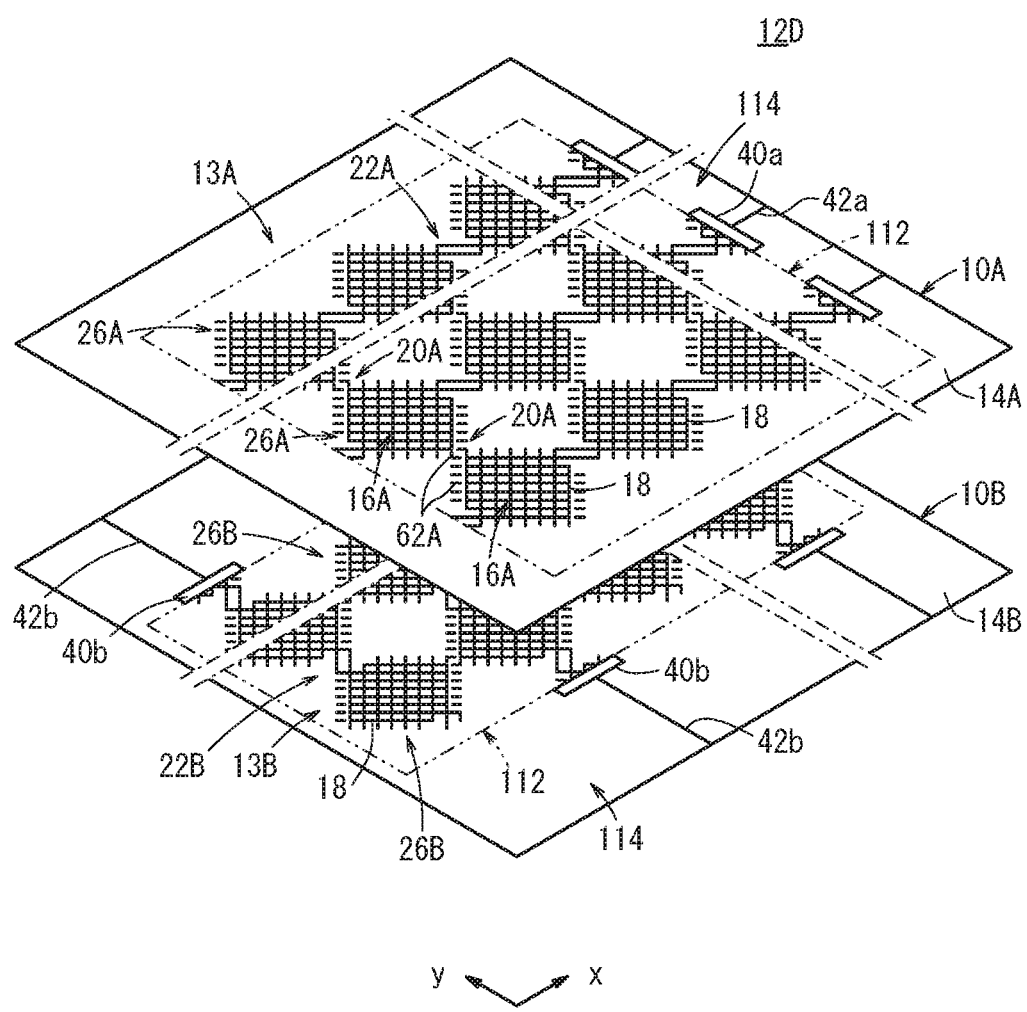
FIG. 17 is an exploded perspective view partially showing a fourth laminated conductive sheet.
Figure 18A:
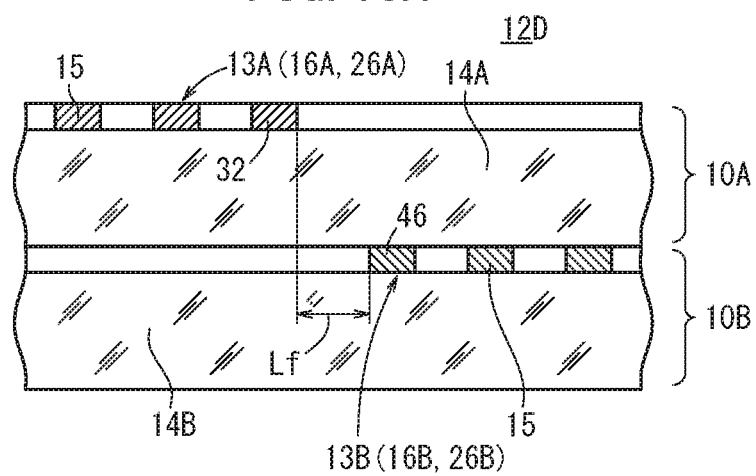
FIG. 18A is a cross-sectional view partially showing an example of the fourth laminated conductive sheet.

As shown in FIGS. 17 and 18A, the first conductive sheet 10A is stacked on the second conductive sheet 10B in the fourth laminated conductive sheet 12D as in the first laminated conductive sheet 12A and the like. The first conductive sheet 10A has the first conductive part 13A formed on one main surface of the first transparent substrate 14A, and the second conductive sheet 10B has the second conductive part 13B formed on one main surface of the second transparent substrate 14B.

Figure 19:
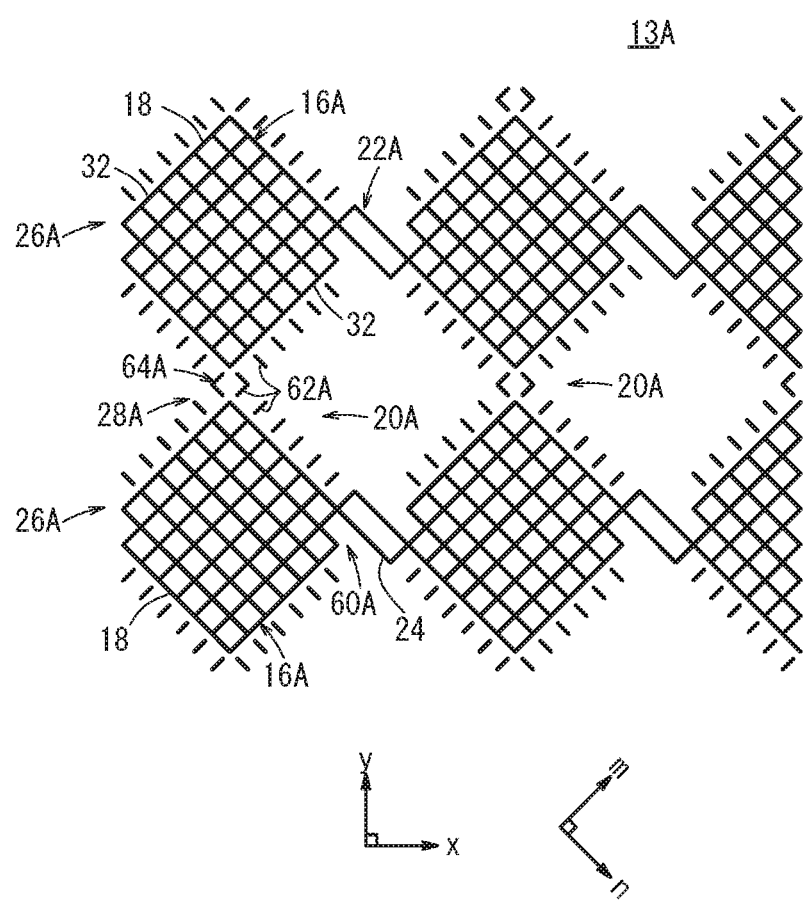
FIG. 19 is a plan view showing a pattern example of a first conductive part formed on a first conductive sheet in the fourth laminated conductive sheet.

As shown in FIGS. 17 and 19, the first conductive part 13A contains two or more first conductive patterns 26A and first dummy patterns 20A. The first conductive patterns 26A extend in the first direction (the x direction), are arranged in the second direction (the y direction) perpendicular to the first direction, and each contain a large number of lattices. The first dummy patterns 20A are arranged around the first conductive patterns 26A.

The first conductive pattern 26A contains two or more first large lattices 16A connected in series in the first direction. The first large lattices 16A each contain a combination of two or more small lattices 18. The above first dummy pattern 20A is formed around each side 32 of the first large lattice 16A and is not connected to the first large lattice 16A.

A first connection 22A is formed between each adjacent two of the first large lattices 16A to electrically connect the first large lattices 16A. When a third direction (an m direction) is defined as a direction bisecting the angle between the first and second directions and a fourth direction (an n direction) is defined as a direction perpendicular to the third direction, the first connection 22A contains a medium lattice 24 having a shape corresponding to k small lattices 18 (in which k is a real number larger than 1) arranged in the fourth direction. A first absent portion 60A (a portion provided by removing one side from the small lattice 18) is formed on the side 32 of the first large lattice 16A perpendicular to the fourth direction adjacent to the medium lattice 24. In the example of FIG. 19, the medium lattice 24 has a shape corresponding to three small lattices 18 arranged in the fourth direction.

Electrically isolated first insulations 28A are disposed between the adjacent first conductive patterns 26A.

The first dummy pattern 20A contains a plurality of first auxiliary wires 62A (having an axis direction parallel to the third direction) arranged along the side 32 of the first large lattice 16A perpendicular to the third direction, and a plurality of first auxiliary wires 62A (having an axis direction parallel to the fourth direction) arranged along the side 32 of the first large lattice 16A perpendicular to the fourth direction. In the first insulation 28A, two first L-shaped patterns 64A are arranged facing each other, each of the first L-shaped patterns 64A being formed by combining two first auxiliary wires 62A into an L shape.

The axis-direction length of each first auxiliary wire 62A is ⅘ or less, preferably ½ or less, of the inside side length of the small lattice 18. The first auxiliary wire 62A is positioned at a predetermined distance from the first large lattice 16A. The predetermined distance is a difference obtained by subtracting the axis-direction length of the first auxiliary wire 62A from the inside side length of the small lattice 18. For example, when the axis-direction length of the first auxiliary wire 62A is ⅘ or ½ of the inside side length of the small lattice 18, the predetermined distance is ⅕ or ½ of the inside side length.

As shown in FIG. 17, in the first conductive sheet 10A having the above-described structure, in one end of each first conductive pattern 26A, the first connection 22A is not formed on the open end of the first large lattice 16A. In the other end of the first conductive pattern 26A, the end of the first large lattice 16A is electrically connected to the first terminal wiring pattern 42a composed of the thin metal wire 15 by the first wire connection 40a.

Thus, as shown in FIG. 17, in the first conductive sheet 10A used in the touch panel 100, a large number of the first conductive patterns 26A are arranged in the sensing region 112, and a plurality of the first terminal wiring patterns 42a extending from the first wire connections 40a are arranged in the terminal wiring region 114.

Figure 20:
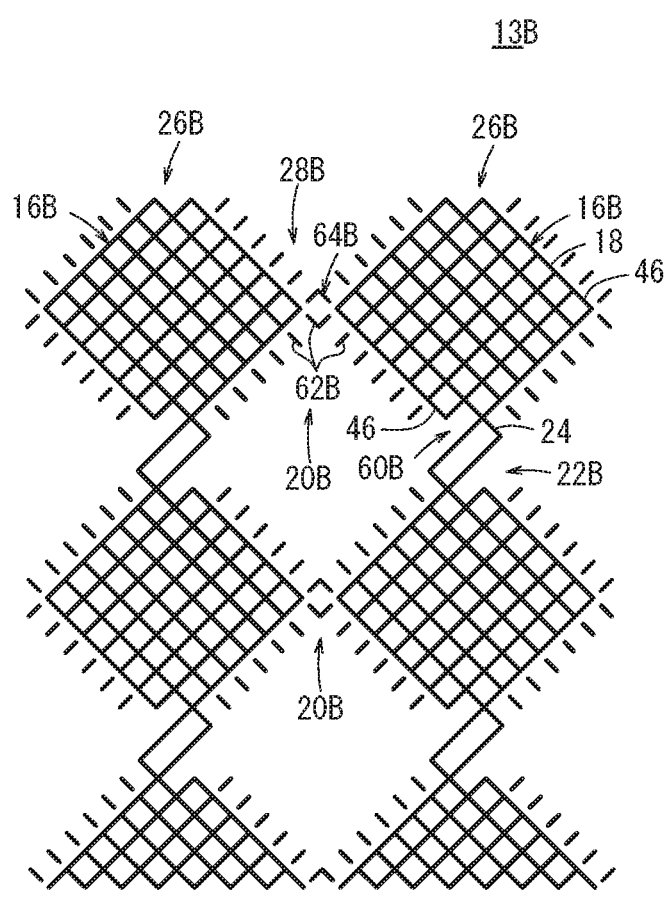
FIG. 20 is a plan view showing a pattern example of a second conductive part formed on a second conductive sheet in the fourth laminated conductive sheet.

On the other hand, as shown in FIGS. 17 and 20, the second conductive part 13B of the second conductive sheet 10B contains two or more second conductive patterns 26B and second dummy patterns 20B. The second conductive patterns 26B each extend in the second direction (the y direction), are arranged in the first direction (the x direction), and each contain a large number of lattices. The second dummy patterns 20B are arranged around the second conductive patterns 26B.

The second conductive pattern 26B contains two or more second large lattices 16B connected in series in the second direction. The second large lattices 16B each contain a combination of two or more small lattices 18. The above second dummy pattern 20B is formed around each side 46 of the second large lattice 16B and is not connected to the second large lattice 16B.

A second connection 22B is formed between each adjacent two of the second large lattices 16B to electrically connect the second large lattices 16B. The second connection 22B contains a medium lattice 24 having a shape corresponding to k small lattices 18 (in which k is a real number larger than 1) arranged in the third direction. A second absent portion 60B (a portion provided by removing one side from the small lattice 18) is formed on the side 46 of the second large lattice 16B perpendicular to the third direction adjacent to the medium lattice 24.

Electrically isolated second insulations 28B are disposed between the adjacent second conductive patterns 26B.

The second dummy pattern 20B contains a plurality of second auxiliary wires 62B (having an axis direction parallel to the fourth direction) arranged along the side 46 of the second large lattice 16B perpendicular to the fourth direction, and a plurality of second auxiliary wires 62B (having an axis direction parallel to the third direction) arranged along the side 46 of the second large lattice 16B perpendicular to the third direction. In the second insulation 28B, two second L-shaped patterns 64B are arranged facing each other, each of the second L-shaped patterns 64B being formed by combining two second auxiliary wires 62B into an L shape.

The axis-direction length of each second auxiliary wire 62B is ⅘ or less, preferably ½ or less, of the inside side length of the small lattice 18 like the first auxiliary wire 62A. The second auxiliary wire 62B is positioned at a predetermined distance from the second large lattice 16B. The predetermined distance is a difference obtained by subtracting the axis-direction length of the second auxiliary wire 62B from the inside side length of the small lattice 18 as in the first auxiliary wire 62A. For example, when the axis-direction length of the second auxiliary wire 62B is ⅘ or ½ of the inside side length of the small lattice 18, the predetermined distance is ⅕ or ½ of the inside side length.

As shown in FIG. 17, in the second conductive sheet 10B having the above-described structure, in an end of each second conductive pattern 26B, the second connection 22B is not formed on the open end of the second large lattice 16B. In the other end of each odd-numbered second conductive pattern 26B and in the one end of each even-numbered second conductive pattern 26B, the end of the second large lattice 16B is electrically connected to the second terminal wiring pattern 42b composed of the thin metal wire 15 by the second wire connection 40b.

Thus, in the second conductive sheet 10B used in the touch panel 100, a large number of the second conductive patterns 26B are arranged in the sensing region 112, and a plurality of the second terminal wiring patterns 42b extending from the second wire connections 40b are arranged in the terminal wiring region 114.

Figure 21:
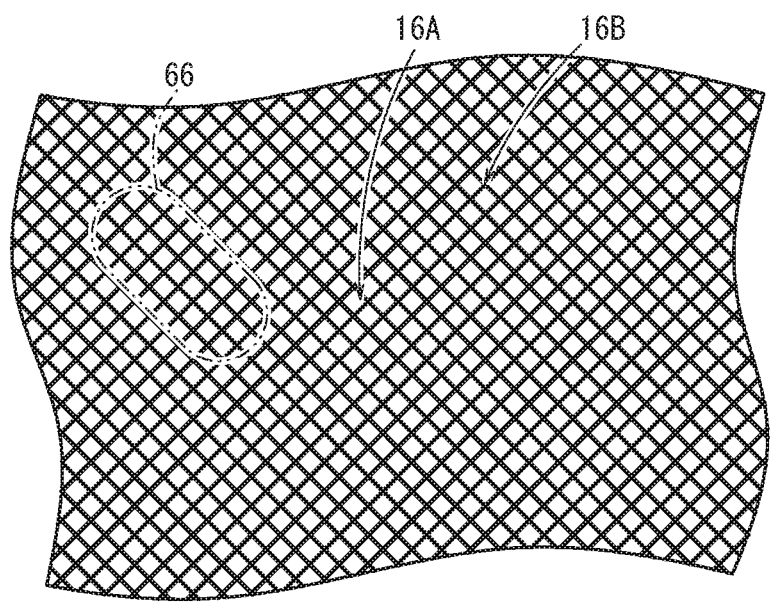
FIG. 21 is a plan view partially showing an example of the fourth laminated conductive sheet obtained by combining the first and second conductive sheets.

For example, as shown in FIG. 21, in a case where the first conductive sheet 10A is stacked on the second conductive sheet 10B to form the fourth laminated conductive sheet 12D, the first conductive patterns 26A and the second conductive patterns 26B are crossed. Specifically, the first connections 22A of the first conductive patterns 26A and the second connections 22B of the second conductive patterns 26B are arranged facing each other with the first transparent substrate 14A (see FIG. 18A) interposed therebetween, and also the first insulations 28A of the first conductive part 13A and the second insulations 28B of the second conductive part 13B are arranged facing each other with the first transparent substrate 14A interposed therebetween.

Figure 22:
FIG. 22 is an explanatory view showing a line formed by first and second auxiliary wires.

When the fourth laminated conductive sheet 12D is viewed from above, as shown in FIG. 21, spaces between the first large lattices 16A on the first conductive sheet 10A are filled with the second large lattices 16B on the second conductive sheet 10B. In this case, the first dummy patterns 20A and the second dummy patterns 20B overlap with each other to form combined patterns 66 between the first large lattices 16A and the second large lattices 16B. As shown in FIG. 22, in the combined pattern 66, a first axis line 68A of the first auxiliary wire 62A corresponds to the second axis line 68B of the second auxiliary wire 62B, the first auxiliary wire 62A does not overlap with the second auxiliary wire 62B, and an end of the first auxiliary wire 62A corresponds to an end of the second auxiliary wire 62B, to form one side of the small lattice 18. Thus, the combined pattern 66 contains a combination of two or more small lattices 18 similarly to the inner patterns of the first large lattice 16A and the second large lattice 16B. As a result, when the fourth laminated conductive sheet 12D is viewed from above, as shown in FIG. 21, the sensing region 112 is covered with a large number of the small lattices 18. As shown in FIG. 18A, the projected distance Lf between the side 32 of the first large lattice 16A and the long side 46 of the second large lattice 16B is approximately equal to the side length of the small lattice 18 to advantageously lower the parasitic capacitance.

Though not shown in the drawings, the arrangement of the first wire connections 40a and the second wire connections 40b, the arrangement of the first terminal wiring patterns 42a and the second terminal wiring patterns 42b in the terminal wiring region 114, and the arrangement of the first terminals 116a and the second terminals 116b in the fourth laminated conductive sheet 12D are equal to those in the above first laminated conductive sheet 12A.

Consequently, when the fourth laminated conductive sheet 12D is used in the projected capacitive touch panel 100 or the like, the response speed and the size of the touch panel 100 can be easily increased. Furthermore, the boundaries between the first large lattices 16A of the first conductive sheet 10A and the second large lattices 16B of the second conductive sheet 10B can be made less visible, defects such as the local line thickening can be prevented, and the overall visibility can be improved.

As shown in FIG. 23, the fourth laminated conductive sheet 12D may be disposed such that the first and second conductive patterns are crossed and displaced in a direction different from the first direction (the x direction) and the second direction (the y direction). In this case, as at least shown in FIGS. 24A to 25, in the combined pattern 66 formed by arranging the first dummy pattern 20A and the second dummy pattern 20B facing each other, the first auxiliary wires 62A and the second auxiliary wires 62B are not perpendicularly crossed.

Figure 24A:
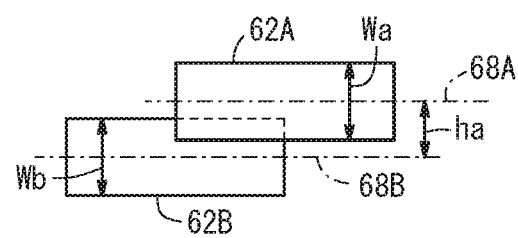
FIGS. 24A to 24C are each an explanatory view showing an example of a combination of a first auxiliary wire arranged along a side of a first large lattice and a second auxiliary wire arranged along a side of a second large lattice in a combined pattern.
Figure 24B:
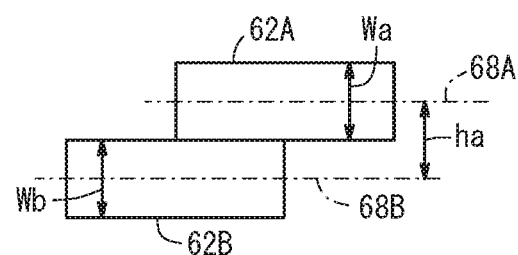
Figure 24C:
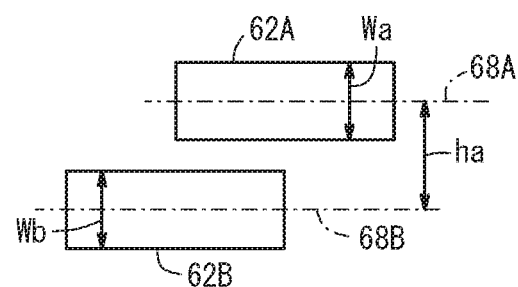

Thus, as shown in FIGS. 24A to 24C, in the combined pattern 66, the combination of the first auxiliary wires 62A arranged along a side of the first large lattice 16A and the second auxiliary wires 62B arranged along a side of the second large lattice 16B is provided such that the first axis line 68A of the first auxiliary wire 62A and the second axis line 68B of the second auxiliary wire 62B are arranged approximately in parallel, and the distance ha between the first axis line 68A and the second axis line 68B in the view from above is at least ½ of the smaller line width among the line width Wa of the first auxiliary wire 62A and the line width Wb of the second auxiliary wire 62B and at most 100 μm (or at most ½ of the arrangement pitch of the small lattices 18).

In FIG. 24A, the distance ha between the first axis line 68A and the second axis line 68B is smaller than the total of ½ of the line width Wa of the first auxiliary wire 62A and ½ of the line width Wb of the second auxiliary wire 62B. In this case, the first auxiliary wire 62A and the second auxiliary wire 62B partially overlap with each other. In FIG. 24B, the distance ha between the first axis line 68A and the second axis line 68B is equal to the total of ½ of the line width Wa of the first auxiliary wire 62A and ½ of the line width Wb of the second auxiliary wire 62B. In FIG. 24C, the distance ha between the first axis line 68A and the second axis line 68B is larger than the total of ½ of the line width Wa of the first auxiliary wire 62A and ½ of the line width Wb of the second auxiliary wire 62B.

In the combined pattern 66, the first auxiliary wires 62A of the two first L-shaped patterns 64A in the first insulation 28A and the second auxiliary wires 62B of the two second L-shaped patterns 64B in the second insulation 28B do not form the small lattices 18 but form four L-shaped patterns (64A, 64A, 64B, 64B).

Figure 25:
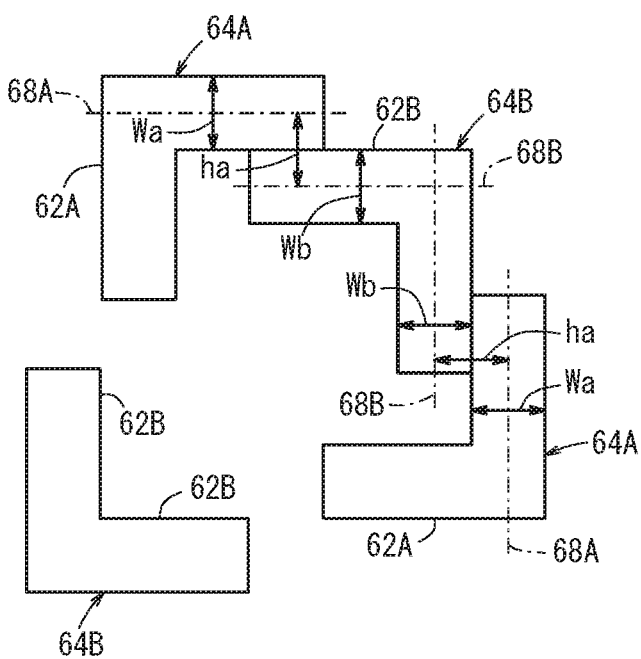
FIG. 25 is an explanatory view showing an example of a combination of first auxiliary wires in two first L-shaped patterns of a first insulation and second auxiliary wires in two second L-shaped patterns of a second insulation in the combined pattern.

Thus, as shown in FIG. 25, one second L-shaped pattern 64B is positioned closer to the two first L-shaped patterns 64A, and the other second L-shaped pattern 64B is positioned away from the one second L-shaped pattern 64B and the two first L-shaped patterns 64A. The second axis line 68B of one of the two second auxiliary wires 62B in the one second L-shaped pattern 64B is approximately parallel to the first axis line 68A of one of the two first auxiliary wires 62A in one of the two first L-shaped patterns 64A, and the distance ha between the first axis line 68A and the second axis line 68B is at least ½ of the smaller line width among the line width Wa of the first auxiliary wire 62A and the line width Wb of the second auxiliary wire 62B and at most 100 μm (or at most ½ of the arrangement pitch of the small lattices 18).

Similarly, the second axis line 68B of the other second auxiliary wire 62B in the one second L-shaped pattern 64B is approximately parallel to the first axis line 68A of one of the two first auxiliary wires 62A in the other first L-shaped pattern 64A, and the distance ha between the first axis line 68A and the second axis line 68B is at least ½ of the smaller line width among the line width Wa of the first auxiliary wire 62A and the line width Wb of the second auxiliary wire 62B and at most 100 μm (or at most ½ of the arrangement pitch of the small lattices 18). The positional relations of the second auxiliary wires 62B and the first auxiliary wires 62A in the one second L-shaped pattern 64B and the two first L-shaped patterns 64A are such as those shown in FIGS. 24A to 24C.

Thus, the first conductive part 13A or the second conductive part 13B is displaced by a shift length from the standard position at least in the third direction, the shift length being at least ½ of the smaller line width among the line width Wa of the first auxiliary wire 62A and the line width Wb of the second auxiliary wire 62B and at most 100 μm (or at most ½ of the arrangement pitch of the small lattices 18). Particularly in this embodiment, it is displaced by the shift length in each of the third and fourth directions, the shift length being at least ½ of the smaller line width among the line width Wa of the first auxiliary wire 62A and the line width Wb of the second auxiliary wire 62B and at most 100 μm (or at most ½ of the arrangement pitch of the small lattices 18).

The standard position is such a position that, as shown in FIG. 22 described above, the first axis line 68A of the first auxiliary wire 62A corresponds to the second axis line 68B of the second auxiliary wire 62B, the first auxiliary wire 62A does not overlap with the second auxiliary wire 62B, and the end of the first auxiliary wire 62A corresponds to the end of the second auxiliary wire 62B.

Thus, in the fourth laminated conductive sheet 12D, as shown in FIG. 23, the combined patterns 66 of the first dummy patterns 20A and the second dummy patterns 20B are arranged between the first large lattices 16A and the second large lattices 16B, so that blank areas (having a width corresponding to the side length of the small lattice 18 and a length corresponding to the side length of the first large lattice 16A or the second large lattice 16B) are not formed between the first large lattices 16A and the second large lattices 16B, and the boundaries between the first large lattices 16A and the second large lattices 16B are less visible.

In the combined pattern 66, the first auxiliary wires 62A and the second auxiliary wires 62B having a length of ½ of the inside side length of the small lattices 18 are partially overlapped, and the lengths of the overlaps are significantly smaller than the side length of the first large lattices 16A and the second large lattices 16B (1/20 or less of the side length). Therefore, the overlaps of the first auxiliary wires 62A and the second auxiliary wires 62B are not highly visible, thereby not deteriorating the visibility. Also the first L-shaped patterns 64A and the second L-shaped patterns 64B are arranged in the same manner. As shown in FIG. 25, in the one second L-shaped pattern 64B and the two first L-shaped patterns 64A, the first auxiliary wires 62A and the second auxiliary wires 62B having the length of ½ of the inside side length of the small lattices 18 are partially overlapped, and the lengths of the overlaps are significantly smaller than the side length of the first large lattices 16A and the second large lattices 16B (1/20 or less of the side length). Therefore, the overlaps of the first auxiliary wires 62A and the second auxiliary wires 62B are not highly visible, thereby not deteriorating the visibility.

The first auxiliary wires 62A and the second auxiliary wires 62B may perpendicularly cross the sides of the second large lattices 16B and the first large lattices 16A respectively. Since the axis-direction lengths of the first auxiliary wires 62A and the second auxiliary wires 62B are ½ of the inside side length of the small lattices 18, they are not highly visible.

The medium lattices 24 of the first connection 22A and the second connection 22B are perpendicularly crossed and overlap with each other. In this example, since the first conductive part 13A or the second conductive part 13B is displaced in the third and fourth directions, the small lattices 18 are not uniformly shaped in the overlaps. However, the number of the misshapen small lattices 18 is significantly smaller than (approximately 5% of) the number of the small lattices 18 in the first large lattices 16A and the second large lattices 16B around the overlaps of the perpendicularly crossed medium lattices 24 of the first connections 22A and the second connections 22B, whereby the nonuniformity of the small lattices 18 are not highly visible. Furthermore, since the first absent portions 60A and the second absent portions 60B are formed adjacent to the medium lattices 24 in the first large lattices 16A and the second large lattices 16B, the straight lines of the medium lattices 24 do not overlap with the straight lines of the first large lattices 16A and the second large lattices 16B, and the visibility is hardly deteriorated.

Therefore, even in a case where the first conductive part 13A or the second conductive part 13B is displaced, as described above, the boundaries between the first large lattices 16A of the first conductive sheet 10A and the second large lattices 16B of the second conductive sheet 10B can be made less visible, defects such as the local line thickening can be prevented, and the overall visibility can be improved. In addition, the first large lattices 16A and the second large lattices 16B are arranged adjacent to each other to form a regular arrangement of the small lattices 18, and the first auxiliary wires 62A or the second auxiliary wires 62B are displaced to form another arrangement between the first large lattices 16A and the second large lattices 16B, so that the different arrangements are combined in the fourth laminated conductive sheet 12D. Thus, many spatial frequencies are combined, whereby the interference with a pixel array of the liquid crystal display device or the like can be prevented, and the moire generation can be effectively prevented.

Though the size of the medium lattices 24 in the first connections 22A and the second connections 22B corresponds to the total of three small lattices 18 in the above-described first conductive sheet 10A and second conductive sheet 10B, the size may correspond to 1.5, 2, or 2.5 times the size of the small lattices 18, etc. When the medium lattices 24 have an excessively large size, it is difficult to arrange the first large lattices 16A and the second large lattices 16B, and the electrostatic capacitance change is increased in the overlaps, which should not be detected. Therefore, the size of the medium lattices 24 is preferably at most the total size of five small lattices 18.

Figure 18B:
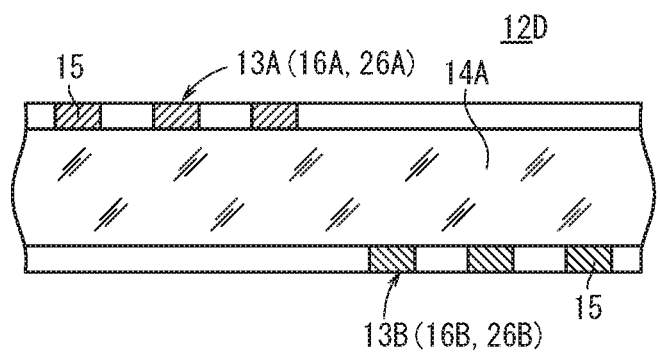
FIG. 18B is a cross-sectional view partially showing another example of the fourth laminated conductive sheet.

Also in the fourth laminated conductive sheet 12D, as shown in FIG. 18B, the first conductive part 13A may be formed on one main surface of the first transparent substrate 14A, and the second conductive part 13B may be formed on the other main surface of the first transparent substrate 14A.

Though the first conductive sheet 10A and the second conductive sheet 10B are used in the projected capacitive touch panel 100 in the above embodiments, they can be used in a surface capacitive touch panel or a resistive touch panel.

The first conductive part 13A and the second conductive part 13B may be formed in the following manner. For example, a photosensitive material having the first transparent substrate 14A or the second transparent substrate 14B and thereon a photosensitive silver halide-containing emulsion layer is exposed and developed, whereby metallic silver portions and light-transmitting portions are formed in the exposed areas and the unexposed areas respectively to obtain the first conductive part 13A or the second conductive part 13B. The metallic silver portions may be subjected to a physical development treatment and/or a plating treatment to deposit a conductive metal thereon.

As shown in FIGS. 5B and 18B, the first conductive part 13A may be formed on one main surface of the first transparent substrate 14A, and the second conductive part 13B may be formed on the other main surface thereof. In this case, if the one main surface is exposed and then the other main surface is exposed in the usual method, the first conductive part 13A and the second conductive part 13B often cannot be obtained with desired patterns. In particular, it is difficult to uniformly form the first dummy pattern 20A around the side 32 of the first large lattice 16A and the first insulation pattern 34A in the first insulation 28A (shown in FIG. 1, etc.), the second dummy pattern 20B around the long side 46 of the second large lattice 16B and the second insulation pattern 34B in the second insulation 28B (shown in FIG. 6, etc.), the pattern of a large number of the first auxiliary wires 62A arranged along the side 32 of the first large lattice 16A and the first L-shaped pattern 64A in the first insulation 28A (shown in FIG. 19), and the pattern of a large number of the second auxiliary wires 62B arranged along the side 46 of the second large lattice 16B and the second L-shaped pattern 64B in the second insulation 28B (shown in FIG. 20), and the like.

Therefore, the following production method can be preferably used.

Thus, the first conductive part 13A on the one main surface and the second conductive part 13B on the other main surface are formed by subjecting photosensitive silver halide emulsion layers formed on either side of the first transparent substrate 14A to one-shot exposure.

A specific example of the production method will be described below with reference to FIGS. 26 to 28.

Figure 26:
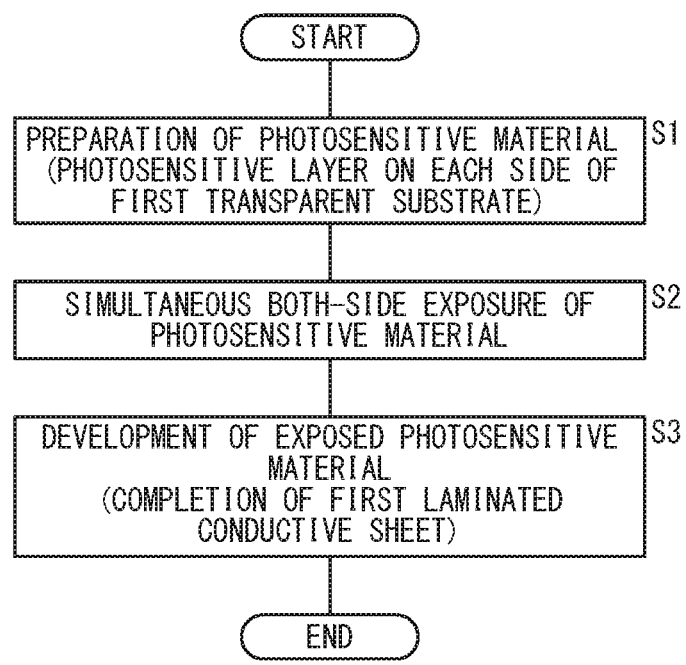
FIG. 26 is a flow chart of a method for producing a laminated conductive sheet according to an embodiment of the present invention.
Figure 27A:
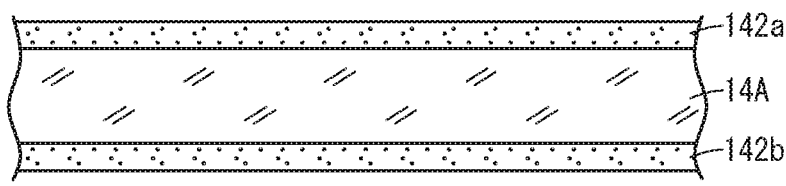
FIG. 27A is a cross-sectional view partially showing a prepared photosensitive material.

First, in the step S1 of FIG. 26, a long photosensitive material 140 is prepared. As shown in FIG. 27A, the photosensitive material 140 has the first transparent substrate 14A, a photosensitive silver halide emulsion layer formed on one main surface of the first transparent substrate 14A (hereinafter referred to as the first photosensitive layer 142a), and a photosensitive silver halide emulsion layer formed on the other main surface of the first transparent substrate 14A (hereinafter referred to as the second photosensitive layer 142b).

Figure 27B:
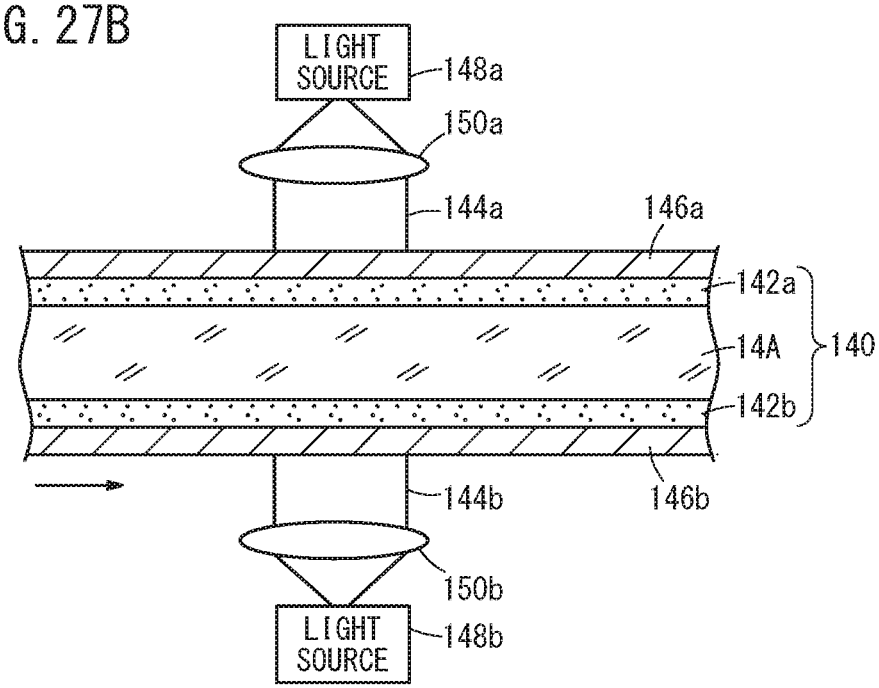
FIG. 27B is an explanatory view showing a simultaneous both-side exposure of the photosensitive material.

In the step S2 of FIG. 26, the photosensitive material 140 is exposed. In this step, a simultaneous both-side exposure is carried out, the exposure including a first exposure treatment for irradiating the first photosensitive layer 142a on the first transparent substrate 14A with a light in a first exposure pattern and a second exposure treatment for irradiating the second photosensitive layer 142b on the first transparent substrate 14A with a light in a second exposure pattern. In the example of FIG. 27B, the first photosensitive layer 142a is irradiated through a first photomask 146a with a first light 144a (a parallel light) and the second photosensitive layer 142b is irradiated through a second photomask 146b with a second light 144b (a parallel light) while conveying the long photosensitive material 140 in one direction. The first light 144a is obtained such that a light from a first light source 148a is converted to the parallel light by an intermediate first collimator lens 150a, and the second light 144b is obtained such that a light from a second light source 148b is converted to the parallel light by an intermediate second collimator lens 150b. Though the two light sources (the first light source 148a and the second light source 148b) are used in the example of FIG. 27B, only one light source may be used. In this case, a light from the one light source may be divided by an optical system into the first light 144a and the second light 144b for exposing the first photosensitive layer 142a and the second photosensitive layer 142b.

In the step S3 of FIG. 26, the exposed photosensitive material 140 is developed to produce the first laminated conductive sheet 12A shown in FIG. 5B, etc. The first laminated conductive sheet 12A has the first transparent substrate 14A, the first conductive part 13A (including the first conductive patterns 26A) formed in the first exposure pattern on the one main surface of the first transparent substrate 14A, and the second conductive part 13B (including the second conductive patterns 26B) formed in the second exposure pattern on the other main surface of the first transparent substrate 14A. Preferred exposure time and development time for the first photosensitive layer 142a and the second photosensitive layer 142b vary depending on the types of the first light source 148a, the second light source 148b, and a developer, etc., and cannot be categorically determined. The exposure time and development time may be selected in view of achieving a development ratio of 100%.

Figure 28:
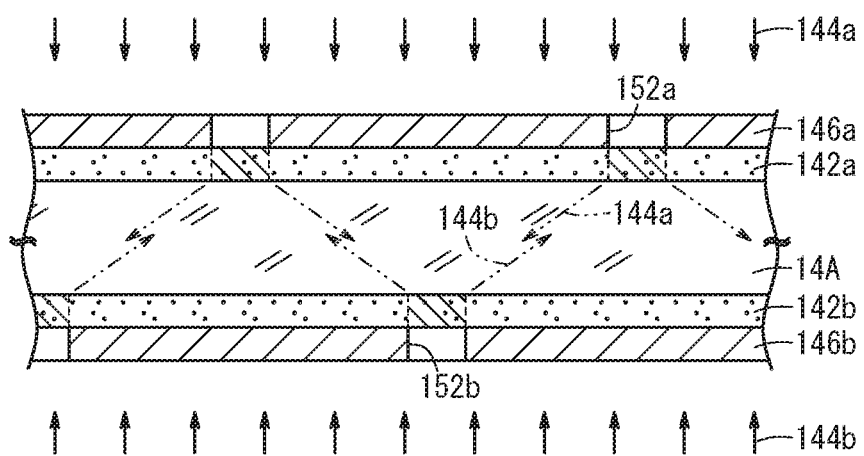
FIG. 28 is an explanatory view showing first and second exposure treatments performed such that a light incident on a first photosensitive layer does not reach a second photosensitive layer and a light incident on the second photosensitive layer does not reach the first photosensitive layer.

As shown in FIG. 28, in the first exposure treatment in the production method of this embodiment, for example, the first photomask 146a is placed in close contact with the first photosensitive layer 142a, the first light source 148a is arranged facing the first photomask 146a, and the first light 144a is emitted from the first light source 148a toward the first photomask 146a, so that the first photosensitive layer 142a is exposed. The first photomask 146a has a glass substrate composed of a transparent soda glass and a mask pattern (a first exposure pattern 152a) formed thereon. Therefore, in the first exposure treatment, areas in the first photosensitive layer 142a, corresponding to the first exposure pattern 152a in the first photomask 146a, are exposed.

A space of approximately 2 to 10 μm may be formed between the first photosensitive layer 142a and the first photomask 146a.

Similarly, in the second exposure treatment, for example, the second photomask 146b is placed in close contact with the second photosensitive layer 142b, the second light source 148b is arranged facing the second photomask 146b, and the second light 144b is emitted from the second light source 148b toward the second photomask 146b, so that the second photosensitive layer 142b is exposed. The second photomask 146b, as well as the first photomask 146a, has a glass substrate composed of a transparent soda glass and a mask pattern (a second exposure pattern 152b) formed thereon. Therefore, in the second exposure treatment, areas in the second photosensitive layer 142b, corresponding to the second exposure pattern 152b in the second photomask 146b, are exposed. In this case, a space of approximately 2 to 10 μm may be formed between the second photosensitive layer 142b and the second photomask 146b.

In the first and second exposure treatments, the emission of the first light 144a from the first light source 148a and the emission of the second light 144b from the second light source 148b may be carried out simultaneously or independently. In a case where the emissions are simultaneously carried out, the first photosensitive layer 142a and the second photosensitive layer 142b can be simultaneously exposed in one exposure process, resulting in reduction of the treatment time.

In a case where both of the first photosensitive layer 142a and the second photosensitive layer 142b are not spectrally sensitized, a light incident on one side may affect the image formation on the other side (the back side) in the both-side exposure of the photosensitive material 140.

Thus, the first light 144a from the first light source 148a reaches the first photosensitive layer 142a and is scattered by silver halide particles in the first photosensitive layer 142a, and a part of the scattered light is transmitted through the first transparent substrate 14A and reaches the second photosensitive layer 142b. Then, a large area of the boundary between the second photosensitive layer 142b and the first transparent substrate 14A is exposed to form a latent image. As a result, the second photosensitive layer 142b is exposed to the second light 144b from the second light source 148b and the first light 144a from the first light source 148a. In a case where the second photosensitive layer 142b is developed to prepare the first laminated conductive sheet 12A, the conductive pattern corresponding to the second exposure pattern 152b (the second conductive part 13B) is formed, and additionally a thin conductive layer is formed due to the first light 144a from the first light source 148a between the conductive patterns, so that the desired pattern (corresponding to the second exposure pattern 152b) cannot be obtained. This is true also for the first photosensitive layer 142a.

As a result of intense research in view of solving this problem, it has been found that if the thicknesses and the applied silver amounts of the first photosensitive layer 142a and the second photosensitive layer 142b are selected within particular ranges, the incident light can be absorbed by the silver halide to suppress the light transmission to the back side. In this embodiment, the thicknesses of the first photosensitive layer 142a and the second photosensitive layer 142b may be 1 to 4 μm. The upper limit is preferably 2.5 μm. The applied silver amounts of the first photosensitive layer 142a and the second photosensitive layer 142b may be 5 to 20 g/m$^2$.

In the above-described both-side contact exposure technology, the exposure may be inhibited by dust or the like attached to the film surface so that an image defect is generated. It is known that the dust attachment can be prevented by applying a conductive substance such as a metal oxide or a conductive polymer to the film. However, the metal oxide or the like remaining in the processed product deteriorates the transparency of the final product, and the conductive polymer is disadvantageous in storage stability, etc. As a result of intense research, it has been found that a silver halide layer with reduced binder content exhibits a satisfactory conductivity for static charge prevention. Thus, the volume ratio of silver/binder is limited in the first photosensitive layer 142a and the second photosensitive layer 142b. The silver/binder volume ratios of the first photosensitive layer 142a and the second photosensitive layer 142b are 1/1 or more, preferably 2/1 or more.

In a case where the thicknesses, the applied silver amounts, and the silver/binder volume ratios of the first photosensitive layer 142a and the second photosensitive layer 142b are selected as described above, the first light 144a emitted from the first light source 148a to the first photosensitive layer 142a does not reach the second photosensitive layer 142b as shown in FIG. 28. Similarly, the second light 144b emitted from the second light source 148b to the second photosensitive layer 142b does not reach the first photosensitive layer 142a. As a result, in the following development for producing the first laminated conductive sheet 12A, as shown in FIG. 5B, only the conductive pattern corresponding to the first exposure pattern 152a (the pattern of the first conductive part 13A) is formed on the one main surface of the first transparent substrate 14A, and only the conductive pattern corresponding to the second exposure pattern 152b (the pattern of the second conductive part 13B) is formed on the other main surface of the first transparent substrate 14A, so that the desired patterns can be obtained.

In the production method using the above one-shot both-side exposure, the first photosensitive layer 142a and the second photosensitive layer 142b can have both of the satisfactory conductivity and both-side exposure suitability, and the same or different patterns can be formed on either side of the first transparent substrate 14A by the exposure, whereby the electrodes of the touch panel 100 can be easily formed, and the touch panel 100 can be made thinner (smaller).

In the above production method, the first conductive patterns 26A and the second conductive patterns 26B are formed using the photosensitive silver halide emulsion layer. The other examples of the production methods include the following methods.

A photoresist film disposed on a copper foil on the first transparent substrate 14A or the second transparent substrate 14B may be exposed and developed to form a resist pattern, and the copper foil exposed from the resist pattern may be etched to obtain the first conductive patterns 26A and the second conductive patterns 26B.

Alternatively, a paste containing fine metal particles may be printed on the first transparent substrate 14A or the second transparent substrate 14B, and the printed paste may be plated with a metal to obtain the first conductive patterns 26A and the second conductive patterns 26B.

The first conductive patterns 26A and the second conductive patterns 26B may be printed on the first transparent substrate 14A and the second transparent substrate 14B by using a screen or gravure printing plate.

The first conductive patterns 26A and the second conductive patterns 26B may be formed on the first transparent substrate 14A and the second transparent substrate 14B by using an inkjet method.

A particularly preferred method, which contains using a photographic photosensitive silver halide material for producing the first conductive sheet 10A and the second conductive sheet 10B according to this embodiment, will be mainly described below.

The method for producing the first conductive sheet 10A and the second conductive sheet 10B of this embodiment includes the following three processes different in the photosensitive materials and development treatments.

(1) A process comprising subjecting a photosensitive black-and-white silver halide material free of physical development nuclei to a chemical or thermal development to form the metallic silver portions on the material.

(2) A process comprising subjecting a photosensitive black-and-white silver halide material having a silver halide emulsion layer containing physical development nuclei to a solution physical development to form the metallic silver portions on the material.

(3) A process comprising subjecting a stack of a photosensitive black-and-white silver halide material free of physical development nuclei and an image-receiving sheet having a non-photosensitive layer containing physical development nuclei to a diffusion transfer development to form the metallic silver portions on the non-photosensitive image-receiving sheet.

In the process of (1), an integral black-and-white development procedure is employed to form a transmittable conductive film such as a light-transmitting conductive film on the photosensitive material. The resulting silver is a chemically or thermally developed silver containing a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is employed. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the sheet. In this process, a so-called separate-type procedure is employed, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment may be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the first conductive sheet 10A and the second conductive sheet 10B of this embodiment will be described in detail below.

[First Transparent Substrate 14A and Second Transparent Substrate 14B]

The first transparent substrate 14A and the second transparent substrate 14B may be a plastic film, a plastic plate, a glass plate, etc.

Examples of materials for the plastic film and the plastic plate include polyesters such as polyethylene terephthalates (PET) and polyethylene naphthalates (PEN); polyolefins such as polyethylenes (PE), polypropylenes (PP), polystyrenes, and EVA; vinyl resins; polycarbonates (PC); polyamides; polyimides; acrylic resins; and triacetyl celluloses (TAC).

The first transparent substrate 14A and the second transparent substrate 14B are preferably a film or plate of a plastic having a melting point of about 290° C. or lower, such as PET (melting point 258° C.), PEN (melting point 269° C.), PE (melting point 135° C.), PP (melting point 163° C.), polystyrene (melting point 230° C.), polyvinyl chloride (melting point 180° C.), polyvinylidene chloride (melting point 212° C.), or TAC (melting point 290° C.). The PET is particularly preferred from the viewpoints of light transmittance, workability, etc. The conductive film such as the first conductive sheet 10A or the second conductive sheet 10B used in the first to third laminated conductive sheets 12A to 12C is required to be transparent, and therefore the first transparent substrate 14A and the second transparent substrate 14B preferably have a high transparency.

[Silver Salt Emulsion Layer]

The silver salt emulsion layer to be converted to a conductive layer in the first conductive sheet 10A and the second conductive sheet 10B (a conductive portion such as the first large lattice 16A, the first connection 22A, the first insulation pattern 34A in the first insulation 28A, the second large lattice 16B, the second connection 22B, the second insulation pattern 34B in the second insulation 28B, or the small lattice 18) contains a silver salt and a binder and may further contain a solvent and an additive such as a dye.

The silver salt used in this embodiment may be an inorganic silver salt such as a silver halide or an organic silver salt such as silver acetate. In this embodiment, the silver halide is preferred because of its excellent light sensing property.

The applied silver amount (the amount of the applied silver salt in the silver density) of the silver salt emulsion layer is preferably 1 to 30 g/m$^2$, more preferably 1 to 25 g/m$^2$, further preferably 5 to 20 g/m$^2$. When the applied silver amount is within this range, the resultant first to third laminated conductive sheets 12A to 12C can exhibit a desired surface resistance.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of the functional group.

In this embodiment, the amount of the binder in the silver salt emulsion layer is not particularly limited, and may be appropriately selected to obtain sufficient dispersion and adhesion properties. The volume ratio of silver/binder in the silver salt emulsion layer is preferably 1/4 or more, more preferably 1/2 or more. The silver/binder volume ratio is preferably 100/1 or less, more preferably 50/1 or less. Particularly, the silver/binder volume ratio is further preferably 1/1 to 4/1, most preferably 1/1 to 3/1. When the silver/binder volume ratio of the silver salt emulsion layer is within the range, the resistance variation can be reduced even under various applied silver amount, whereby the first to third laminated conductive sheets 12A to 12C can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Solvent>

The solvent used for forming the silver salt emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, the ratio of the solvent to the total of the silver salt, the binder, and the like in the silver salt emulsion layer is 30% to 90% by mass, preferably 50% to 80% by mass.

<Other Additives>

The additive used in this embodiment is not particularly limited, and may be preferably selected from known additives.

[Other Layers]

A protective layer (not shown) may be formed on the silver salt emulsion layer. The protective layer used in this embodiment contains a binder such as a gelatin or a high-molecular polymer, and is disposed on the photosensitive silver salt emulsion layer to improve the scratch prevention or mechanical property. The thickness of the protective layer is preferably 0.5 µm or less. The method of applying or forming the protective layer is not particularly limited, and may be appropriately selected from known applying or forming methods. In addition, an undercoat layer or the like may be formed below the silver salt emulsion layer.

The steps for producing the first conductive sheet 10A and the second conductive sheet 10B will be described below.

[Exposure]

In this embodiment, the first conductive patterns 26A and the second conductive patterns 26B may be formed in a printing process, and may be formed by exposure and development treatments, etc. in another process. Thus, a photosensitive material having the first transparent substrate 14A or the second transparent substrate 14B and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt films, photographic papers, print engraving films, emulsion masks for photomasking, and the like may be used in the present invention. The developer used in the development treatment is not particularly limited, and may be a PQ developer, an MQ developer, an MAA developer, etc. Examples of commercially available developers usable in the present invention include CN-16, CR-56, CP45X, FD-3, and PAPITOL available from FUJIFILM Corporation, C-41, E-6, RA-4, D-19, and D-72 available from Eastman Kodak Company, and developers contained in kits thereof. The developer may be a lith developer.

In the present invention, the development process may include a fixation treatment for removing the silver salt in the unexposed areas to stabilize the material. Fixation treatment technologies for photographic silver salt films, photographic papers, print engraving films, emulsion masks for photomasking, and the like may be used in the present invention.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer used is preferably 600 ml/m$^2$ or less, more preferably 500 ml/m$^2$ or less, particularly preferably 300 ml/m$^2$ or less, per 1 m$^2$ of the photosensitive material treated.

The developed and fixed photosensitive material is preferably subjected to a water washing treatment or a stabilization treatment. The amount of water used in the water washing or stabilization treatment is generally 20 L or less, and may be 3 L or less, per 1 m$^2$ of the photosensitive material. The water amount may be 0, and thus the photosensitive material may be washed with storage water.

The ratio of the metallic silver contained in the exposed areas after the development to the silver contained in the areas before the exposure is preferably 50% or more, more preferably 80% or more by mass. When the ratio is 50% or more by mass, a high conductivity can be achieved.

In this embodiment, the tone (gradation) obtained by the development is preferably more than 4.0, though not particularly restrictive. When the tone is more than 4.0 after the development, the conductivity of the conductive metal portion can be increased while maintaining the high transmittance of the light-transmitting portion. For example, the tone of 4.0 or more can be obtained by doping with rhodium or iridium ion.

The conductive sheet is obtained by the above steps. The surface resistance of the resultant conductive sheet is preferably within the range of 0.1 to 100 ohm/sq. The lower limit is preferably 1 ohm/sq or more, 3 ohm/sq or more, 5 ohm/sq or more, or 10 ohm/sq. The upper limit is preferably 70 ohm/sq or less or 50 ohm/sq or less. When the surface resistance is controlled within this range, the position detection can be performed even in a large touch panel having an area of 10 cm×10 cm or more. The conductive sheet may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited thereon by a physical development treatment and/or a plating treatment. In the present invention, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention.

The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, as described above, the lower limit of the line width of the conductive metal portion is preferably 1 µm or more, 3 µm or more, 4 µm or more, or 5 µm or more, and the upper limit thereof is preferably 15 µm or less, 10 µm or less, 9 µm or less, or 8 µm or less. In a case where the line width is less than the lower limit, the conductive metal portion has an insufficient conductivity, whereby a touch panel using the conductive part has an insufficient detection sensitivity. On the other hand, in a case where the line width is more than the upper limit, moire is significantly generated due to the conductive metal portion, and a touch panel using the conductive part has a poor visibility. In a case where the line width is within the above range, the moire of the conductive metal portion is improved, and the visibility is remarkably improved. The line distance (the distance between the sides facing each other in the small lattice 18) is preferably 30 to 500 µm, more preferably 50 to 400 µm, most preferably 100 to 350 µm. The conductive metal portion may have a part with a line width of more than 200 µm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the conductive portions such as the first large lattices 16A, the first connections 22A, the first insulation patterns 34A in the first insulations 28A, the second large lattices 16B, the second connections 22B, the second insulation patterns 34B in the second insulations 28B, the small lattices 18, and the like to the entire surface. For example, a square lattice having a line width of 15 µm and a pitch of 300 µm has an opening ratio of 90%.

[Light-Transmitting Portion]

In this embodiment, the light-transmitting portion is a portion having light transmittance, other than the conductive metal portions in the first conductive sheet 10A and the second conductive sheet 10B. The transmittance of the light-transmitting portion, which is herein a minimum transmittance value in a wavelength region of 380 to 780 nm obtained neglecting the light absorption and reflection of the first transparent substrate 14A and the second transparent substrate 14B, is 90% or more, preferably 95% or more, more preferably 97% or more, further preferably 98% or more, most preferably 99% or more.

The exposure is preferably carried out using a glass mask method or a laser lithography pattern exposure method.

[First Conductive Sheet 10A and Second Conductive Sheet 10B]

In the first conductive sheet 10A and the second conductive sheet 10B of this embodiment, the thicknesses of the first transparent substrate 14A and the second transparent substrate 14B are preferably 5 to 350 μm, more preferably 30 to 150 μm. In a case where the thicknesses are 5 to 350 μm, a desired visible light transmittance can be obtained, and the substrates can be easily handled.

The thickness of the metallic silver portion formed on the first transparent substrate 14A or the second transparent substrate 14B may be appropriately selected by controlling the thickness of the coating liquid for the silver salt-containing layer applied to the substrate. The thickness of the metallic silver portion may be selected within a range of 0.001 to 0.2 mm, and is preferably 30 μm or less, more preferably 20 μm or less, further preferably 0.01 to 9 μm, most preferably 0.05 to 5 μm. The metallic silver portion is preferably formed in a patterned shape. The metallic silver portion may have a monolayer structure or a multilayer structure containing two or more layers. In a case where the metallic silver portion has a patterned multilayer structure containing two or more layers, the layers may have different wavelength color sensitivities. In this case, different patterns can be formed in the layers by using exposure lights with different wavelengths.

In a touch panel, the conductive metal portion preferably has a smaller thickness. As the thickness is reduced, the viewing angle and visibility of the display panel are improved. Thus, the thickness of the layer of the conductive metal deposited on the conductive metal portion is preferably less than 9 μm, more preferably 0.1 μm or more but less than 5 μm, further preferably 0.1 μm or more but less than 3 μm.

In this embodiment, the thickness of the metallic silver portion can be controlled by changing the coating thickness of the silver salt-containing layer, and the thickness of the conductive metal particle layer can be controlled in the physical development treatment and/or the plating treatment, whereby the first conductive sheet 10A and the second conductive sheet 10B can be easily produced with a thickness of less than 5 μm (preferably less than 3 μm).

The plating or the like is not necessarily carried out in the method for producing the first conductive sheet 10A and the second conductive sheet 10B of this embodiment. This is because the desired surface resistance can be obtained by controlling the applied silver amount and the silver/binder volume ratio of the silver salt emulsion layer in the method. The calender treatment or the like may be carried out if necessary.

(Film Hardening Treatment After Development Treatment)

It is preferred that after the silver salt emulsion layer is developed, the resultant is immersed in a hardener and thus subjected to a film hardening treatment. Examples of the hardeners include boric acid and dialdehydes such as 2,3-dihydroxy-1,4-dioxane, glutaraldehyde and adipaldehyde, described in Japanese Laid-Open Patent Publication No. 02-141279.

[Laminated Conductive Sheet]

The antireflection film 126 may be attached to the laminated conductive sheet. In this case, a structure according to the above first to third structure examples of FIGS. 8A to 8C can be preferably used.

For example, the antireflection film 126 is prepared by forming the hard coat layer 122 and the antireflection layer 124 on the first laminated conductive sheet 12A (see the first and second structure examples) or by forming the transparent film 130, the hard coat layer 122, and the antireflection layer 124 on the first laminated conductive sheet 12A (see the third structure example).

A preferred embodiment of the antireflection film 126 will be described below mainly with respect to the third structure example.

<Transparent Film 130>

The transparent film 130 is used on the viewer side of the display device 108, and therefore has to be a colorless film having a high light transmittance and an excellent transparency. The transparent film 130 is preferably a plastic film. Examples of polymers for the plastic film include cellulose acylates (e.g., cellulose triacetates such as TAC-TD80U and TD80UF available from FUJIFILM Corporation, cellulose diacetates, cellulose acetate propionates, cellulose acetate butylates), polyamides, polycarbonates, polyesters (e.g., polyethylene terephthalates, polyethylene naphthalates), polystyrenes, polyolefins, norbornene resins (e.g., ARTON (trade name) available from JSR Corporation), amorphous polyolefins (e.g., ZEONEX (trade name) available from Zeon Corporation), and (meth)acrylic resins (e.g., ACRYPET VRL20A (trade name) available from Mitsubishi Rayon Co., Ltd., ring structure-containing acrylic resins described in Japanese Laid-Open Patent Publication Nos. 2004-070296 and 2006-171464). Among the polymers, the cellulose triacetates, cellulose acetate propionates, cellulose acetate butylates, polyethylene terephthalates, and polyethylene naphthalates are preferred, and the cellulose triacetates are particularly preferred.

<Hard Coat Layer 122>

The hard coat layer 122 is preferably formed in the antireflection film 126 to improve the physical strength. The hard coat layer 122 may contain two or more layers stacked.

The refractive index of the hard coat layer 122 is preferably 1.48 to 1.90, more preferably 1.50 to 1.80, further preferably 1.52 to 1.65, in view of optical design for achieving the antireflection property. In this embodiment, at least one low refractive index layer is disposed on the hard coat layer 122. Therefore, in a case where the refractive index of the hard coat layer 122 is lower than the above range, the antireflection property tends to be deteriorated. On the other hand, in a case where the refractive index is higher than the above range, the color of the reflected light tends to be heightened.

The thickness of the hard coat layer 122 is generally about 0.5 to 50 μm, preferably 1 to 20 μm, more preferably 2 to 15 μm, most preferably 3 to 10 μm, in view of sufficiently improving the durability and impact resistance of the antireflection film 126. The strength of the hard coat layer 122 is preferably 2H or more, more preferably 3H or more, most preferably 4H or more, in a pencil hardness test. Furthermore, a sample of the hard coat layer 122 preferably exhibits a smaller wear amount in a Taber test in accordance with JIS K 5400.

The hard coat layer 122 is preferably formed by a crosslinking or polymerization reaction of an ionizing radiation-curable compound. For example, the hard coat layer 122 may be formed by applying a composition containing an ionizing radiation-curable multifunctional monomer or oligomer to the transparent film 130 and by crosslinking or polymerizing the multifunctional monomer or oligomer. A functional group of the ionizing radiation-curable multifunctional monomer or oligomer is preferably a photo-, electron beam-, or radiation-polymerizable group, particularly a photo-polymerizable group. The photo-polymerizable group may be an unsaturated group such as a (meth)acryloyl group, a vinyl group, a styryl group, or an allyl group, etc., and the (meth)acryloyl group is most preferable. Specifically, the compound may be a monomer described in Paragraphs [0087] and [0088] of Japanese Laid-Open Patent Publication No. 2006-030740, which may be hardened by a method described in Paragraph [0089] of this document. A photo-polymerization initiator described in Paragraphs [0090] to [0093] of this document may be used in the photopolymerization.

The hard coat layer 122 may contain matting particles such as inorganic compound particles or resin particles having an average particle diameter of 1.0 to 10.0 μm (preferably 1.5 to 7.0 μm) to obtain an internal scattering property. The matting particles may be selected from those described in Paragraph [0114] of Japanese Laid-Open Patent Publication No. 2006-030740.

A binder of the hard coat layer 122 may contain a high refractive index monomer, fine inorganic particles (having a primary particle diameter of 10 to 200 nm not to cause light scattering), or both thereof to control the refractive index of the hard coat layer 122. The fine inorganic particles have an effect of reducing the cure shrinkage due to the crosslinking reaction in addition to the effect of controlling the refractive index. The fine inorganic particles may be composed of a compound described as an inorganic filler in Paragraph [0120] of Japanese Laid-Open Patent Publication No. 2006-030740.

<Antireflection Layer 124>

The antireflection film 126 contains the above hard coat layer 122 and the antireflection layer 124 formed thereon, and may contain the transparent film 130 as an underlayer. The antireflection layer 124 preferably has a refractive index and an optical thickness in the following manner to utilize an optical interference. The antireflection film 126 may contain only one antireflection layer 124, and may contain a stack of a plurality of the antireflection layers 124 to obtain a lower reflectance. In the case of using the stack of a plurality of the antireflection layers 124, optical interference layers having different refractive indices may be alternately stacked, and two or more optical interference layers having different refractive indices may be stacked. Specifically, the antireflection film 126 preferably has such a structure that only a low refractive index layer is formed on the hard coat layer 122, that a high refractive index layer and a low refractive index layer are formed in this order on the hard coat layer 122, or that a middle refractive index layer, a high refractive index layer, and a low refractive index layer are formed in this order on the hard coat layer 122. It should be noted that the terms "low", "middle", and "high" of the refractive index layers represent relative magnitude relations of the refractive indices. The refractive index of the low refractive index layer is preferably lower than that of the hard coat layer 122. In a case where the refractive index difference between the low refractive index layer and the hard coat layer 122 is excessively small, the antireflection property tends to be deteriorated. In a case where the refractive index difference is excessively large, the color of the reflected light tends to be heightened. The refractive index difference between the low refractive index layer and the hard coat layer 122 is preferably 0.01 to 0.40, more preferably 0.05 to 0.30.

The refractive index and the thickness of each layer preferably satisfy the following conditions.

The refractive index of the low refractive index layer is preferably 1.20 to 1.46, more preferably 1.25 to 1.42, particularly preferably 1.30 to 1.38. The thickness of the low refractive index layer is preferably 50 to 150 nm, more preferably 70 to 120 nm.

In a structure where the low refractive index layer is stacked on the high refractive index layer to prepare the antireflection film 126, the refractive index of the high refractive index layer is preferably 1.55 to 2.40, more preferably 1.60 to 2.20, further preferably 1.65 to 2.10, most preferably 1.80 to 2.00.

In a structure where the middle refractive index layer, the high refractive index layer, and the low refractive index layer are stacked in this order on the transparent film 130 (or the touch panel 100) to prepare the antireflection film 126, the refractive index of the high refractive index layer is preferably 1.65 to 2.40, further preferably 1.70 to 2.20. The refractive index of the middle refractive index layer is controlled to an intermediate value between the refractive indices of the low and high refractive index layers. The refractive index of the middle refractive index layer is preferably 1.55 to 1.80. The high and middle refractive index layers may have optical thicknesses selected depending on the refractive indices.

[Low Refractive Index Layer]

The low refractive index layer is preferably hardened after the layer formation. The haze of the low refractive index layer is preferably 3% or less, more preferably 2% or less, most preferably 1% or less.

The low refractive index layer according to the embodiment of the present invention is preferably formed from a composition containing at least (1) a fluorine-containing polymer having a crosslinkable or polymerizable functional group, (2) a hydrolytic condensation product of a fluorine-containing organosilane material as a main component, or (3) a monomer having two or more ethylenic unsaturated groups and a fine inorganic particle having a hollow structure.

(1) Fluorine-Containing Compound Having Crosslinkable or Polymerizable Functional Group The fluorine-containing compound having the crosslinkable or polymerizable functional group may be a copolymer of a fluorine-containing monomer and a monomer having the crosslinkable or polymerizable functional group.

Specifically, the fluorine-containing compound may be a copolymer having a main chain of only carbon atoms and containing a polymerization unit of a fluorine-containing vinyl monomer and a polymerization unit having a (meth)acryloyl group in a side chain, and examples of such copolymers include P-1 to P-40 described in Paragraphs [0043] to [0047] of Japanese Laid-Open Patent Publication No. 2004-045462. The fluorine-containing compound may be a fluorine-containing polymer having a silicone component for improving the abrasion resistance and lubricity, such as a graft polymer containing a fluorine atom in a main chain and containing a polymerization unit having a polysiloxane moiety in a side chain, and examples of such graft polymers include compounds described in Tables 1 and 2 in Paragraphs [0074] to [0076] of Japanese Laid-Open Patent Publication No. 2003-222702. Furthermore, the fluorine-containing compound may be an ethylenic unsaturated group-containing fluoropolymer containing a structural unit derived from a polysiloxane compound in a main chain, and examples of such fluoropolymers include compounds described in Japanese Laid-Open Patent Publication No. 2003-183322.

A hardener having a polymerizable unsaturated group may be appropriately used in combination with the above polymer as described in Japanese Laid-Open Patent Publication No. 2000-017028. Also a multifunctional fluorine-containing compound having a polymerizable unsaturated group may be preferably used in combination with the above polymer as described in Japanese Laid-Open Patent Publication No. 2002-145952. Examples of such multifunctional compounds having the polymerizable unsaturated group include the above-described monomers having two or more ethylenic unsaturated groups. Furthermore, also a hydrolytic condensation product of an organosilane (particularly an organosilane having a (meth)acryloyl group) described in Japanese Laid-Open Patent Publication No. 2004-170901 may be preferably used. In a case where the above polymer has the polymerizable unsaturated group, the compounds are particularly preferably used in combination with the polymer to exhibit a large effect of improving the abrasion resistance.

When the polymer per se does not have a satisfactory hardening property alone, a crosslinkable compound may be added thereto to obtain the satisfactory hardening property. For example, in a case where the polymer has a hydroxyl group, an amino compound may be preferably used as a hardener. The amino compound used as the crosslinkable compound may be a compound having one or both of a hydroxyalkylamino group and an alkoxyalkylamino group, the number of the groups in the compound being two or more in total. Specific examples of such compounds include melamine compounds, urea compounds, benzoguanamine compounds, and glycoluril compounds. The compound is preferably hardened with an organic acid or a salt thereof.

(2) Hydrolytic Condensation Product of Fluorine-Containing Organosilane Material Also the composition containing the hydrolytic condensation product of the fluorine-containing organosilane compound as a main component is preferred because of its low refractive index and high coating surface hardness. The hydrolytic condensation product is preferably a condensation product of a tetraalkoxysilane and a compound having a hydrolyzable silanol group in one or both ends of a fluorinated alkyl group. Specific examples of such compositions are described in Japanese Laid-Open Patent Publication Nos. 2002-265866 and 2002-317152.

(3) Composition Containing Monomer Having Two or More Ethylenic Unsaturated Groups and Fine Inorganic Particle Having a Hollow Structure In another preferred example, the low refractive index layer contains a low refractive index particle and a binder. The low refractive index particle may be an organic or inorganic particle, and is preferably a particle having an internal cavity. Specific examples of such hollow particles include silica-based particles described in Japanese Laid-Open Patent Publication No. 2002-079616 (see, e.g., Paragraphs [0041] to [0049]). The refractive index of the particle is preferably 1.15 to 1.40, further preferably 1.20 to 1.30. The binder may be the monomer having two or more ethylenic unsaturated groups described above with respect to the hard coat layer 122.

The polymerization initiator described above with respect to the hard coat layer 122 is preferably added to the low refractive index layer (see, e.g., Paragraphs [0090] to [0093] of Japanese Laid-Open Patent Publication No. 2006-030740). In the case of using a radical-polymerizable compound, 1 to 10 parts by mass (preferably 1 to 5 parts by mass) of the polymerization initiator may be used per 100 parts by mass of the compound.

An inorganic particle may jointly be used in the low refractive index layer. The particle diameter of the fine particle may be 15% to 150% of the thickness of the low refractive index layer to improve the abrasion resistance. The particle diameter is preferably 30% to 100% and further preferably 45% to 60% of the thickness.

A known polysiloxane- or fluorine-based antifouling agent, lubricant, or the like may be appropriately added to the low refractive index layer to improve the antifouling property, water resistance, chemical resistance, lubricity, etc.

[High Refractive Index Layer/Middle Refractive Index Layer]

As described above, in the antireflection film 126, the high refractive index layer may be disposed between the low refractive index layer and the hard coat layer 122 to improve the antireflection property.

The high and middle refractive index layers are preferably formed from a hardenable composition containing a fine inorganic high refractive index particle and a binder. The above-described fine inorganic high refractive index particle for increasing the refractive index of the hard coat layer 122 may be used in the hardenable composition. Preferred examples of the fine inorganic high refractive index particles include inorganic compound particles (such as silica particles and $TiO_2$ particles) and resin particles (such as acrylic particles, crosslinked acrylic particles, polystyrene particles, crosslinked styrene particles, melamine resin particles, and benzoguanamine resin particles).

The high and middle refractive index layers may be preferably formed in the following manner. The inorganic particle is dispersed in a dispersion medium to prepare a dispersion liquid, and a binder precursor (such as an ionizing radiation-curable multifunctional monomer or oligomer to be hereinafter described), a photopolymerization initiator, and the like for forming a matrix are added thereto if necessary, to prepare a coating composition for the high and middle refractive index layers. Then, the coating composition for the high and middle refractive index layers is applied to the transparent film or the like, and the applied composition is hardened by crosslinking or polymerizing the ionizing radiation-curable compound (such as the multifunctional monomer or oligomer).

It is preferred that the binder of the high and middle refractive index layers is further crosslinked or polymerized with a dispersing agent in or after the process of applying the layer.

For example, the above preferred dispersing agent and the ionizing radiation-curable multifunctional or oligomer are crosslinked or polymerized, whereby an anionic group of the dispersing agent is introduced to the binder in the high and middle refractive index layers. The anionic group acts to maintain the dispersion state of the inorganic particle in the binder in the high and middle refractive index layers, and the binder exhibits a film forming ability due to the crosslinked or polymerized structure, whereby the high and middle refractive index layers containing the inorganic particle are improved in the physical strength, chemical resistance, and weather resistance.

The ratio of the binder in the high refractive index layer to the solid content of the coating composition for the layer is 5% to 80% by mass.

The ratio of the inorganic particle in the high refractive index layer to the layer is preferably 10% to 90% by mass, more preferably 15% to 80% by mass, particularly preferably 15% to 75% by mass. Two or more types of the inorganic particles may be used in combination in the high refractive index layer.

In the case of disposing the low refractive index layer on the high refractive index layer, the refractive index of the high refractive index layer is preferably higher than that of the transparent film 130.

In the case of using the high refractive index layer as an optical interference layer, the thickness thereof is preferably 30 to 200 nm, more preferably 50 to 170 nm, particularly preferably 60 to 150 nm.

The high and middle refractive index layers preferably have a lower haze. The haze is preferably 5% or less, further preferably 3% or less, particularly preferably 1% or less.

The integrated reflectance of the antireflection film 126 having the low refractive index layer is preferably 3.0% or less, further preferably 2.0% or less, most preferably 0.3% to 1.5%.

The surface free energy of the low refractive index layer is preferably reduced to improve the antifouling property. Specifically, it is preferred that a fluorine- or polysiloxane structure-containing compound is used in the low refractive index layer. Alternatively, a separate antifouling layer containing the compound may be formed on the low refractive index layer.

Preferred examples of the polysiloxane structure-containing additives include reactive group-containing polysiloxanes such as KF-100T, X-22-169AS, KF-102, X-22-3701IE, X-22-164B, X-22-5002, X-22-173B, X-22-174D, X-22-167B, and X-22-161AS (trade names) available from Shin-Etsu Chemical Co., Ltd.; AK-5, AK-30, and AK-32 (trade names) available from Toagosei Co., Ltd.; and SILAPLANE FM0725 and SILAPLANE FM0721 (trade names) available from Chisso Corporation. Furthermore, silicone compounds described in Tables 2 and 3 of Japanese Laid-Open Patent Publication No. 2003-112383 may be preferably used as the additive. The ratio of the polysiloxane additive to the total solid content of the low refractive index layer is preferably 0.1% to 10% by mass, particularly preferably 1% to 5% by mass.

[Formation of Antireflection Film 126]

The antireflection film 126 may be formed by the following coating method though the formation is not limited thereto.

(Preparation for Coating)

First, a coating liquid containing the component for forming each layer such as the hard coat layer 122 and the antireflection layer 124 is prepared. In general, the coating liquid contains an organic solvent, whereby it is necessary that the water content of the liquid is controlled to 2% or less, and that the liquid is sealed to reduce the volatilization of the solvent. The organic solvent is selected depending on the material for each layer. A stirrer or a disperser is appropriately used for improving the homogeneity of the coating liquid.

The prepared coating liquid is preferably filtrated before the application to prevent application failure. A filter used in the filtration preferably has a smaller pore diameter as long as the component in the coating liquid is not removed. The filtration pressure is appropriately selected within a range of 1.5 MPa or less. The filtrated coating liquid is preferably subjected to an ultrasonic dispersion treatment immediately before the application to defoam the dispersion liquid and to maintain the dispersion state.

Before the application, the transparent film 130 may be subjected to a heat treatment for correcting a base deformation or a surface treatment for improving an application property or adhesion to the coating layer. Specific examples of the surface treatments include corona discharge treatments, glow discharge treatments, flame treatments, acid treatments, alkali treatments, and ultraviolet irradiation treatments. An undercoat layer may be preferably formed as described in Japanese Laid-Open Patent Publication No. 07-333433.

A dust removal process is preferably carried out before the application. The process may be performed using a dust removal method described in Paragraph [0119] of Japanese Laid-Open Patent Publication No. 2010-032795. It is particularly preferred that the static electricity on the transparent film 130 is removed before the dust removal process in view of increasing the dust removal efficiency and preventing attachment of wastes. The electricity removal may be performed using a method described in Paragraph [0120] of Japanese Laid-Open Patent Publication No. 2010-032795. Furthermore, a method described in Paragraphs [0121] and [0123] of this document may be utilized to improve the flatness and adhesion of the transparent film 130.

(Application Process)

Each layer in the antireflection film 126 may be formed by the following application method though the formation is not limited thereto. A known application method may be used in the formation, and examples thereof include dip coating methods, air knife coating methods, curtain coating methods, roller coating methods, wire bar coating methods, gravure coating methods, extrusion coating methods (die coating methods) (see U.S. Pat. No. 2,681,294 and International Patent Publication No. WO 05/123274), and microgravure coating methods. Among the methods, the microgravure coating methods and the die coating methods are preferred. The microgravure coating method is described in Paragraphs [0125] and [0126] of Japanese Laid-Open Patent Publication No. 2010-032795, the die coating method is described in Paragraphs [0127] and [0128] of this document, and the methods can be used in this embodiment. It is preferred that the die coating method is carried out at a coating rate of 20 m/minute or more from the viewpoint of productivity.

(Drying Process)

After the coating liquid is applied onto the transparent film 130 for the antireflection film 126 directly or with another layer interposed, the resultant web is preferably conveyed to a heat zone to remove the solvent.

The solvent may be removed by utilizing various drying techniques, and specific examples thereof include those described in Japanese Laid-Open Patent Publication Nos. 2001-286817, 2001-314798, 2003-126768, 2003-315505, and 2004-034002, etc.

The drying process may be carried out in the drying zone under a temperature condition described in Paragraph of Japanese Laid-Open Patent Publication No. 2010-032795 and a drying air condition described in Paragraph [0131] of this document.

(Hardening Process)

After or at a later stage of the drying process for removing the solvent, each coating layer for the antireflection film 126 may be conveyed in the web state in a zone for hardening the coating layer under an ionizing radiation and/or heat. The ionizing radiation is not particularly limited and may be appropriately selected from ultraviolet, electron beam, near-ultraviolet, visible, near-infrared, infrared, and X-ray radiations, etc. depending on the type of the hardenable composition forming the coating layer. The ionizing radiation is preferably the ultraviolet or electron beam radiation, and is particularly preferably the ultraviolet radiation that can be easily handled and can readily emit a high energy.

An ultraviolet source for photopolymerizing an ultraviolet-hardening compound described in Paragraph [0133] of Japanese Laid-Open Patent Publication No. 2010-032795 and an electron beam described in Paragraph [0134] of this document may be used in this embodiment. Furthermore, an irradiation condition, an irradiation light intensity, and an irradiation time described in Paragraphs [0135] and [0138] of this document may be used in this embodiment. In addition, film surface temperatures before and after the irradiation, an oxygen concentration, and a method for controlling the oxygen concentration described in Paragraphs [0136], [0137], and [0139] to [0144] of this document may be used in this embodiment.

(Handling for Continuous Production)

The antireflection film 126 may be continuously produced by the steps of continuously feeding the transparent film 130 from the roll, applying and drying the coating liquid, hardening the applied coating, and rewinding the transparent film 130 having the hardened layer.

The steps may be carried out in each layer formation. Alternatively, a plurality of application zones, drying chambers, and hardening zones may be formed in a so-called tandem structure, whereby a plurality of the layers may be successively formed.

In the production of the antireflection film 126, it is preferred that the fine filtration of the coating liquid, the application process in the application zone, and the drying process in the drying chamber are carried out in a highly clean air atmosphere, and wastes and dusts on the transparent film 130 are sufficiently removed before the application. The air cleanliness in the application and drying processes is preferably Class 10 (the number of particles having a size of 0.5 μm or more being 353 or less per $m^3$) or higher, further preferably Class 1 (the number being 35.5 or less per $m^3$) or higher, in accordance with US Federal Standard 209E. It is preferred that also the processes other than the application and drying processes (such as the feeding and rewinding processes) are carried out under the high air cleanliness.

In view of improving the image sharpness, it is preferred that the surface flatness and smoothness of the antireflection film 126 are maximally increased, and in addition the sharpness of a transmitted image is controlled. The transmitted image sharpness of the antireflection film 126 is preferably 60% or more. In general, the transmitted image sharpness is a reference index indicating a blur level of an image transmitted through a film. As the film has a larger value of the transmitted image sharpness, the image transmitted through the film is sharper and better. The transmitted image sharpness is preferably 70% or more, further preferably 80% or more.

The antireflection film 126 may be used as a viewer-side surface film on the display device 108. The display devices 108 include various liquid crystal displays, plasma displays, organic EL displays, and touch panels. Depending on the characteristics of the outermost surface of the display device 108 on which the antireflection film 126 is disposed, before the antireflection film 126 is attached to the touch panel 100, an adhesive layer may be formed on the back surface of the transparent film 130 (on which the coating layers are not formed), and the back surface of the transparent film 130 may be saponified.

A technique described in Paragraphs [0149] to [0160] of Japanese Laid-Open Patent Publication No. 2010-032795 may be used for saponifying the back surface of the transparent film 130.

The present invention may be appropriately combined with technologies described in the following patent publications and international patent pamphlets shown in Tables 1 and 2. The terms "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the invention. The following specific examples are therefore to be considered in all respects as illustrative and not restrictive.

First Example

The surface resistance and the transmittance of each conductive sheet according to Examples 1 to 8 and Reference Examples 1 and 2 were measured, and the moire and the visibility were evaluated.

Examples 1 to 8 and Reference Examples 1 and 2

(Photosensitive Silver Halide Material)

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardener were applied to the first transparent substrate 14A and the second transparent substrate 14B composed of a polyethylene terephthalate (PET). The applied silver amount was 10 g/$m^2$, and the Ag/gelatin volume ratio was 2/1.

The PET support had a width of 30 cm, and the emulsion was applied thereto into a width of 25 cm and a length of 20 m. Both the edge portions having a width of 3 cm were cut off to obtain a roll of a photosensitive silver halide material having a width of 24 cm.

(Exposure)

To obtain Sample 1, an A4 (210 mm×297 mm) sized region of the first transparent substrate 14A was exposed in the pattern of the first conductive sheet 10A in the first laminated conductive sheet 12A shown in FIGS. 1 and 4, and an A4 sized region of the second transparent substrate 14B was exposed in the pattern of the second conductive sheet 10B in the first laminated conductive sheet 12A shown in FIGS. 4 and 6. To obtain Sample 2, an A4 (210 mm×297 mm) sized region of the first transparent substrate 14A was exposed in the pattern of the first conductive sheet 10A in the second laminated conductive sheet 12B shown in FIGS. 9 and 10, and an A4 sized region of the second transparent substrate 14B was exposed in the pattern of the second conductive sheet 10B in the second laminated conductive sheet 12B shown in FIGS. 9 and 11. To obtain Sample 3, an A4 (210 mm×297 mm) sized region of the first transparent substrate 14A was exposed in the pattern of the first conductive sheet 10A in the third laminated conductive sheet 12C shown in FIGS. 13 and 14, and an A4 sized region of the second transparent substrate 14B was exposed in the pattern of the second conductive sheet 10B in the third laminated conductive sheet 12C shown in FIGS. 13 and 15. The small lattices 18 had an arrangement pitch P of 200 μm, and the medium lattices 24 had an arrangement pitch of 2×P. In addition, the small lattices 18 had a conductive portion thickness of 2 μm and a width of 10 μm. The exposure was carried out using a parallel light from a light source of a high-pressure mercury lamp and photomasks having the above patterns.

(Development)

Formulation of 1 L of Developer

| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

Formulation of 1 L of Fixer

| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents under the following treatment conditions using an automatic processor FG-710PTS manufactured by FUJIFILM Corporation. In this process, a development treatment was carried out at 35° C. for 30 seconds, a fixation treatment was carried out at 34° C. for 23 seconds, and then a water washing treatment was carried out for 20 seconds at a water flow rate of 5 L/min.

Example 1

In thus-obtained Samples 1 to 3, the conductive portions on the first conductive sheets 10A and the second conductive sheets 10B (the first conductive patterns 26A and the second conductive patterns 26B) had a line width of 1 μm, the small lattices 18 had a side length of 50 μm, and the large lattices (the first large lattices 16A and the second large lattices 16B) had a side length of 3 mm.

Example 2

First and second conductive sheets of Example 2 were produced in the same manner as in Example 1 except that the conductive portions had a line width of 3 μm and the small lattices 18 had a side length of 50 μm in Samples 1 to 3.

Example 3

First and second conductive sheets of Example 3 were produced in the same manner as in Example 1 except that the conductive portions had a line width of 4 μm and the small lattices 18 had a side length of 50 μm in Samples 1 to 3.

Example 4

First and second conductive sheets of Example 4 were produced in the same manner as in Example 1 except that the conductive portions had a line width of 5 μm and the small lattices 18 had a side length of 50 μm in Samples 1 to 3.

Example 5

First and second conductive sheets of Example 5 were produced in the same manner as in Example 1 except that the conductive portions had a line width of 8 μm, the small lattices 18 had a side length of 150 μm, and the large lattices had a side length of 5 mm in Samples 1 to 3.

Example 6

First and second conductive sheets of Example 6 were produced in the same manner as in Example 1 except that the conductive portions had a line width of 9 μm, the small lattices 18 had a side length of 150 μm, and the large lattices had a side length of 5 mm in Samples 1 to 3.

Example 7

First and second conductive sheets of Example 7 were produced in the same manner as in Example 1 except that the conductive portions had a line width of 10 μm, the small lattices 18 had a side length of 300 μm, and the large lattices had a side length of 6 mm in Samples 1 to 3.

Example 8

First and second conductive sheets of Example 8 were produced in the same manner as in Example 1 except that the conductive portions had a line width of 15 μm, the small lattices 18 had a side length of 400 μm, and the large lattices had a side length of 10 mm in Samples 1 to 3.

Reference Example 1

First and second conductive sheets of Reference Example 1 were produced in the same manner as in Example 1 except that the conductive portions had a line width of 0.5 μm and the small lattices 18 had a side length of 40 μm in Samples 1 to 3.

Reference Example 2

First and second conductive sheets of Reference Example 2 were produced in the same manner as in Example 1 except that the conductive portions had a line width of 20 μm, the small lattices 18 had a side length of 500 μm, and the large lattices had a side length of 10 mm in Samples 1 to 3.

[Evaluation]

In each of Examples 1 to 8 and Reference Examples 1 and 2, the surface resistance, moire, and visibility were evaluated. The evaluation results are shown in Table 3.

(Surface Resistance Measurement)

In each of the first conductive sheets 10A and the second conductive sheets 10B, the surface resistivity values of optionally selected 10 areas were measured by LORESTA GP (Model No. MCP-T610) manufactured by Dia Instruments Co., Ltd. utilizing an in-line four-probe method (ASP), and the average of the measured values was obtained to evaluate the surface resistivity uniformity.

(Transmittance Measurement)

The transmittance of each of the first conductive sheets 10A and the second conductive sheets 10B was measured by a spectrophotometer to evaluate the transparency.

(Moire Evaluation)

In each of Examples 1 to 8 and Reference Examples 1 and 2, the first conductive sheet 10A was stacked on the second conductive sheet 10B to obtain a laminated conductive sheet. The laminated conductive sheet was attached to a display screen 110a of a display device 108 to obtain a touch panel 100. The touch panel 100 was fixed to a turntable, and the display device 108 was operated to display a white color. The moire of the laminated conductive sheet was visually observed and evaluated while turning the turntable within a bias angle range of −20° to +20°.

The moire was observed at a distance of 1.5 m from the display screen of the liquid crystal display device. The laminated conductive sheet was evaluated as "Excellent" when the moire was not visible, as "Fair" when the moire was slightly visible to an acceptable extent, or as "Poor" when the moire was highly visible.

(Visibility Evaluation)

In a condition where the touch panel 100 was fixed to the turntable and the display device 108 was operated to display the white color, before the moire evaluation, whether a thickened line or a black point was formed or not on the touch panel 100 and whether boundaries between the first large lattices 16A and the second large lattices 16B in the touch panel 100 were visible or not were observed by the naked eye.

(Evaluation Result)

It was found that the conductive sheets of Examples 1 to 8 had a surface resistance of 5 ohm/sq, and thereby could be satisfactorily used in the A4-sized projected capacitive touch panel. In addition, the conductive sheets of Examples 1 to 8 were excellent in the transmittance, moire, and visibility.

Second Example

In Second Example, the moire and the visibility of each touch panel of Reference Examples 11 to 13 and Examples 11 to 30 were evaluated. The components and evaluation results of Reference Examples 11 to 13 and Examples 11 to 30 are shown in Table 4.

Example 11

(Photosensitive Silver Halide Material)

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardener were applied to the first transparent substrate 14A and the second transparent substrate 14B composed of a polyethylene terephthalate (PET). The applied silver amount was 10 g/m², and the Ag/gelatin volume ratio was 2/1.

The PET support had a width of 30 cm, and the emulsion was applied thereto into a width of 25 cm and a length of 20 m. Both the edge portions having a width of 3 cm were cut off to obtain a roll of a photosensitive silver halide material having a width of 24 cm.

(Exposure)

An A4 (210 mm×297 mm) sized region of the first transparent substrate 14A was exposed in the pattern of the first conductive sheet 10A in the fourth laminated conductive sheet 12D shown in FIGS. 17 and 19, and an A4 sized region of the second transparent substrate 14B was exposed in the pattern of the second conductive sheet 10B in the fourth laminated conductive sheet 12D shown in FIGS. 17 and 20. The exposure was carried out using a parallel light

TABLE 3

| | Line width of conductive portion (μm) | Side length of small lattice (μm) | Side length of large lattice (mm) | Surface resistance (Ω/sq) | Transmittance (%) | Moire evaluation | Visibility evaluation |
|---|---|---|---|---|---|---|---|
| Reference Example 1 | 0.5 | 40 | 3 | 10 | 90 | Fair | Fair |
| Example 1 | 1 | 50 | 3 | 5 | 90 | Excellent | Excellent |
| Example 2 | 3 | 50 | 3 | 5 | 75 | Excellent | Excellent |
| Example 3 | 4 | 50 | 3 | 5 | 86 | Excellent | Excellent |
| Example 4 | 5 | 50 | 3 | 5 | 87 | Excellent | Excellent |
| Example 5 | 8 | 150 | 5 | 5 | 86 | Excellent | Excellent |
| Example 6 | 9 | 150 | 5 | 5 | 86 | Excellent | Excellent |
| Example 7 | 10 | 300 | 6 | 5 | 86 | Excellent | Excellent |
| Example 8 | 15 | 400 | 10 | 5 | 85 | Excellent | Excellent |
| Reference Example 2 | 20 | 500 | 10 | 4 | 83 | Fair | Fair | from a light source of a high-pressure mercury lamp and photomasks having the above patterns.

(Development)
Formulation of 1 L of Developer

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

Formulation of 1 L of Fixer

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents under the following treatment conditions using an automatic processor FG-710PTS manufactured by FUJIFILM Corporation. In this process, a development treatment was carried out at 35° C. for 30 seconds, a fixation treatment was carried out at 34° C. for 23 seconds, and then a water washing treatment was carried out for 20 seconds at a water flow rate of 5 L/min.

(Touch Panel)

The first conductive sheet 10A was stacked on the second conductive sheet 10B to obtain a laminated conductive sheet, and the laminated conductive sheet was attached to a display screen of a liquid crystal display device to produce a touch panel of Example 11. In Example 11, as shown in Table 4, the conductive portions (the first conductive patterns 26A, the first dummy patterns 20A, the second conductive patterns 26B, and the second dummy patterns 20B) had a line width of 5 μm, the small lattices 18 had a side length of 50 μm, and the large lattices (the first large lattices 16A and the second large lattices 16B) had a side length of 3 mm. In Example 11, the displacement in the third and fourth direction (hereinafter referred to as the shift length) was 2.5 μm.

Examples 12 to 14

Touch panels of Examples 12, 13, and 14 were produced in the same manner as in Example 11 except that the shift lengths were 5 μm, 10 μm, and 25 μm, respectively.

Example 15

A touch panel of Example 15 was produced in the same manner as in Example 11 except that the conductive portions had a line width of 7 μm, the small lattices 18 had a side length of 250 μm, the large lattices had a side length of 5 mm, and the shift length was 50 μm.

Example 16

A touch panel of Example 16 was produced in the same manner as in Example 11 except that the conductive portions had a line width of 8 μm, the small lattices 18 had a side length of 250 μm, and the large lattices had a side length of 5 mm.

Examples 17 to 22

Touch panels of Examples 17, 18, 19, 20, 21, and 22 were produced in the same manner as in Example 16 except that the shift lengths were 4 μm, 10 μm, 30 μm, 50 μm, 100 μm, and 125 μm, respectively.

Example 23

A touch panel of Example 23 was produced in the same manner as in Example 16 except that the conductive portions had a line width of 9 μm, and the shift length was 50 μm.

Example 24

A touch panel of Example 24 was produced in the same manner as in Example 11 except that the conductive portions had a line width of 10 μm, the small lattices 18 had a side length of 300 μm, and the large lattices had a side length of 6 mm.

Examples 25 to 30

Touch panels of Examples 25, 26, 27, 28, 29, and 30 were produced in the same manner as in Example 24 except that the shift lengths were 4 μm, 10 μm, 30 μm, 50 μm, 100 μm, and 150 μm, respectively.

Reference Examples 11 to 13

A touch panel of Reference Example 11 was produced in the same manner as in Example 11 except that the shift length was 0 μm.

A touch panel of Reference Example 12 was produced in the same manner as in Example 16 except that the shift length was 0 μm.

A touch panel of Reference Example 13 was produced in the same manner as in Example 24 except that the shift length was 0 μm.

TABLE 4

| | Line width of conductive portion (μm) | Side length of small lattice (μm) | Side length of large lattice (mm) | Shift length (μm) | Moire evaluation | Visibility evaluation |
|---|---|---|---|---|---|---|
| Reference Example 11 | 5 | 50 | 3 | 0 | Poor | Excellent |
| Example 11 | 5 | 50 | 3 | 2.5 | Fair | Excellent |
| Example 12 | 5 | 50 | 3 | 5 | Fair or Excellent | Excellent |
| Example 13 | 5 | 50 | 3 | 10 | Excellent | Excellent |
| Example 14 | 5 | 50 | 3 | 25 | Excellent | Excellent |
| Example 15 | 7 | 250 | 5 | 50 | Excellent | Excellent |
| Reference Example 12 | 8 | 250 | 5 | 0 | Poor | Excellent |
| Example 16 | 8 | 250 | 5 | 2.5 | Fair | Excellent |
| Example 17 | 8 | 250 | 5 | 4 | Fair or Excellent | Excellent |
| Example 18 | 8 | 250 | 5 | 10 | Excellent | Excellent |
| Example 19 | 8 | 250 | 5 | 30 | Excellent | Excellent |
| Example 20 | 8 | 250 | 5 | 50 | Excellent | Excellent |
| Example 21 | 8 | 250 | 5 | 100 | Excellent | Excellent |

TABLE 4-continued

| | Line width of conductive portion (μm) | Side length of small lattice (μm) | Side length of large lattice (mm) | Shift length (μm) | Moire evaluation | Visibility evaluation |
|---|---|---|---|---|---|---|
| Example 22 | 8 | 250 | 5 | 125 | Fair or Excellent | Fair |
| Example 23 | 9 | 250 | 5 | 50 | Excellent | Excellent |
| Reference Example 13 | 10 | 300 | 6 | 0 | Poor | Excellent |
| Example 24 | 10 | 300 | 6 | 2.5 | Fair | Excellent |
| Example 25 | 10 | 300 | 6 | 4 | Fair or Excellent | Excellent |
| Example 26 | 10 | 300 | 6 | 10 | Excellent | Excellent |
| Example 27 | 10 | 300 | 6 | 30 | Excellent | Excellent |
| Example 28 | 10 | 300 | 6 | 50 | Excellent | Excellent |
| Example 29 | 10 | 300 | 6 | 100 | Excellent | Excellent |
| Example 30 | 10 | 300 | 6 | 150 | Fair or Excellent | Fair |

[Evaluation]

(Moire Evaluation)

The touch panel was fixed to a turntable, and the liquid crystal display device was operated to display a white color. The moire of the touch panel was visually observed and evaluated while turning the turntable within a bias angle range of −20° to +20°.

The moire was observed at a distance of 1.5 m from the display screen of the liquid crystal display device. The touch panel was evaluated as "Excellent" when the moire was not visible, as "Fair" when the moire was slightly visible to an acceptable extent, or as "Poor" when the moire was highly visible.

(Visibility Evaluation)

In a condition where the touch panel was fixed to the turntable and the liquid crystal display device was operated to display the white color, before the moire evaluation, whether a thickened line or a black point was formed or not on the touch panel was observed by the naked eye.

(Evaluation Results)

The touch panels were generally excellent in the visibility though a few thickened lines and black points were observed only in Examples 22 and 30.

The moire was highly visible in Reference Examples 11 to 13. In contrast, satisfactory moire evaluation results were obtained in all Examples 11 to 30. The moire was not visible in Examples 13 to 15, 18 to 21, 23, and 26 to 29, the moire was only slightly visible to an acceptable extent in Examples 11, 16, and 24, and the moire was at an intermediate level between Fair and Excellent in Examples 12, 17, 22, 25, and 30.

Incidentally, touch panels, which were produced in the same manner as in Reference Examples 11 to 13 and Examples 11 to 30 except that the first conductive part 13A was formed on one main surface of the first transparent substrate 14A and the second conductive part 13B was formed on the other main surface of the first transparent substrate 14A as shown in FIG. 18B, exhibited the same evaluation results.

Third Example

Projected capacitive touch panels were produced using the laminated conductive sheets of Examples 1 to 8 and 11 to 30 respectively. When each of the touch panels was operated by a finger touch, it exhibited a high response speed and an excellent detection sensitivity. Furthermore, when two or more points were touched, the touch panel exhibited the same excellent properties. Thus, it was confirmed that the touch panel was capable of multi-touch detection.

It is to be understood that the conductive sheet, the conductive sheet using method, and the touch panel of the present invention are not limited to the above embodiments, and various changes and modifications may be made therein without departing from the scope of the invention.

The invention claimed is:

1. A touch panel comprising a touch panel conductive sheet, wherein
the touch panel conductive sheet contains a first conductive part and a second conductive part,
wherein the first conductive part contains two or more first conductive patterns and a first dummy pattern,
the first conductive patterns each extend in a first direction and are arranged in a second direction perpendicular to the first direction,
the first dummy pattern contains a plurality of first auxiliary wires arranged around the first conductive patterns,
the second conductive part contains two or more second conductive patterns and a second dummy pattern,
the second conductive patterns each extend in the second direction and are arranged in the first direction,
the second dummy pattern contains a plurality of second auxiliary wires arranged around the second conductive patterns,
the first conductive patterns and the second conductive patterns are insulated,
the first conductive patterns and the second conductive patterns are crossed as viewed from above, and displaced from each other in a direction different from the first direction and from the second direction,
the first dummy pattern and the second dummy pattern overlap with each other to form a combined pattern between the first conductive patterns and the second conductive patterns, and
the first auxiliary wires and the second auxiliary wires are not perpendicularly crossed in the combined pattern.

2. The touch panel according to claim 1, wherein the first conductive patterns and the second conductive patterns contain a thin wire having a line width of 15 μm or less.

3. A touch panel comprising a touch panel conductive sheet, wherein
the touch panel conductive sheet contains a first conductive part and a second conductive part,
the first conductive part contains two or more first conductive patterns and a first dummy pattern,
the first conductive patterns each extend in a first direction and are arranged in a second direction perpendicular to the first direction,
the first dummy pattern contains a plurality of first auxiliary wires arranged around the first conductive patterns,
the second conductive part contains two or more second conductive patterns and a second dummy pattern,
the second conductive patterns each extend in the second direction and are arranged in the first direction,
the second dummy pattern contains a plurality of second auxiliary wires arranged around the second conductive patterns,
the first conductive patterns and the second conductive patterns are insulated,
the first conductive patterns and the second conductive patterns are crossed as viewed from above, the first dummy pattern and the second dummy pattern overlap with each other to form a combined pattern between the first conductive patterns and the second conductive patterns, and the first auxiliary wires and the second auxiliary wires are not perpendicularly crossed in the combined pattern, wherein the first conductive patterns each contain two or more first large lattices connected in series in the first direction, the second conductive patterns each contain two or more second large lattices connected in series in the second direction, the first large lattices and the second large lattices each contain a combination of two or more small lattices, the first dummy pattern separated from the first large lattices is formed around a side of the first large lattices, the second dummy pattern separated from the second large lattices is formed around a side of the second large lattices, and the first conductive part or the second conductive part is displaced by at most ½ of an arrangement pitch of the small lattices.

4. The touch panel according to claim 3, wherein the first conductive patterns and the second conductive patterns contain a thin wire having a line width of 15 μm or less.

5. A touch panel comprising a touch panel conductive sheet, wherein the touch panel conductive sheet contains a first conductive part and a second conductive part, the first conductive part contains two or more first conductive patterns and a first dummy pattern, the first conductive patterns each extend in a first direction and are arranged in a second direction perpendicular to the first direction, the first dummy pattern contains a plurality of first auxiliary wires arranged around the first conductive patterns, the second conductive part contains two or more second conductive patterns and a second dummy pattern, the second conductive patterns each extend in the second direction and are arranged in the first direction, the second dummy pattern contains a plurality of second auxiliary wires arranged around the second conductive patterns, the first conductive patterns and the second conductive patterns are insulated, the first conductive patterns and the second conductive patterns are crossed as viewed from above, the first dummy pattern and the second dummy pattern overlap with each other to form a combined pattern between the first conductive patterns and the second conductive patterns, and the first auxiliary wires and the second auxiliary wires are not perpendicularly crossed in the combined pattern, wherein the first conductive patterns each contain two or more first large lattices connected in series in the first direction, the second conductive patterns each contain two or more second large lattices connected in series in the second direction, the first large lattices and the second large lattices each contain a combination of two or more small lattices, the first dummy pattern separated from the first large lattices is formed around a side of the first large lattices, the second dummy pattern separated from the second large lattices is formed around a side of the second large lattices, and a first axis line of the first auxiliary wire and a second axis line of the second auxiliary wire are arranged approximately in parallel in the combined pattern, and a distance between the first axis line and the second axis line is at least ½ of a smaller line width among line widths of the first auxiliary wire and the second auxiliary wire and at most ½ of the arrangement pitch of the small lattices.

6. The touch panel according to claim 5, wherein the first conductive patterns and the second conductive patterns contain a thin wire having a line width of 15 μm or less.

7. A touch panel comprising a touch panel conductive sheet, wherein the touch panel conductive sheet contains a first conductive part and a second conductive part, the first conductive part, contains two or more first conductive patterns and a first dummy pattern, the first conductive patterns each extend in a first direction and are arranged in a second direction perpendicular to the first direction, the first dummy pattern contains a plurality of first auxiliary wires arranged around the first conductive patterns, the second conductive part contains two or more second conductive patterns and a second dummy pattern, the second conductive patterns each extend in the second direction and are arranged in the first direction, the second dummy pattern contains a plurality of second auxiliary wires arranged around the second conductive patterns, the first conductive patterns and the second conductive patterns are insulated, the first conductive patterns and the second conductive patterns are crossed as viewed from above, the first dummy pattern and the second dummy pattern overlap with each other to form a combined pattern between the first conductive patterns and the second conductive patterns, and the first auxiliary wires and the second auxiliary wires are not perpendicularly crossed in the combined pattern, wherein when a third direction is defined as a direction bisecting an angle between the first and second directions, and a fourth direction is defined as a direction perpendicular to the third direction, the first conductive part or the second conductive part is displaced by a shift length from a standard position at least in the third direction, the shift length being at least ½ of a smaller line width among line widths of the first auxiliary wire and the second auxiliary wire and at most 100 μm.

8. The touch panel according to claim 7, wherein the first conductive patterns and the second conductive patterns contain a thin wire having a line width of 15 μm or less.

* * * * *